US007071852B1

(12) United States Patent
Wegener

(10) Patent No.: US 7,071,852 B1
(45) Date of Patent: Jul. 4, 2006

(54) ENHANCED TEST AND MEASUREMENT INSTRUMENTS USING COMPRESSION AND DECOMPRESSION

(75) Inventor: Albert William Wegener, Portola Valley, CA (US)

(73) Assignee: Samplify Systems LLC, Incline Village, NV (US)

( * ) Notice: Subject to any disclaimer, the term of this patent is extended or adjusted under 35 U.S.C. 154(b) by 0 days.

(21) Appl. No.: 10/778,614

(22) Filed: Feb. 13, 2004

(51) Int. Cl.
*H03M 7/00* (2006.01)
(52) U.S. Cl. .......................... 341/61; 341/155; 341/144
(58) Field of Classification Search ................. 341/50, 341/59, 58, 65, 67, 155, 144, 61
See application file for complete search history.

(56) References Cited

U.S. PATENT DOCUMENTS

| 4,546,342 | A |   | 10/1985 | Weaver et al. ................. 341/51 |
| 4,558,302 | A |   | 12/1985 | Welch .......................... 341/51 |
| 5,057,932 | A | * | 10/1991 | Lang ........................... 386/101 |
| 5,142,656 | A |   | 8/1992  | Fielder et al. ............... 704/229 |
| 5,274,445 | A | * | 12/1993 | Overton et al. .............. 348/181 |
| 5,329,243 | A |   | 7/1994  | Tay ............................ 330/136 |
| 5,428,357 | A | * | 6/1995  | Haab et al. .................. 341/155 |
| 5,442,351 | A | * | 8/1995  | Horspool et al. ............. 341/51 |
| 5,566,088 | A | * | 10/1996 | Herscher et al. ............ 702/123 |
| 5,839,100 | A |   | 11/1998 | Wegener ...................... 704/220 |
| 6,278,435 | B1 |  | 8/2001  | Etheridge et al. ............ 345/440 |
| 6,449,596 | B1 |  | 9/2002  | Ejima ........................... 704/501 |
| 6,505,247 | B1 |  | 1/2003  | Steger et al. ................. 709/224 |
| 6,603,410 | B1 | * | 8/2003 | Gerharter et al. ............. 341/50 |
| 6,604,158 | B1 | * | 8/2003 | Fallon .......................... 710/65 |
| 6,754,295 | B1 | * | 6/2004 | Hartnett ....................... 375/356 |
| 6,892,150 | B1 | * | 5/2005 | Pickerd et al. ................ 702/67 |

(Continued)

OTHER PUBLICATIONS

Tektronix, Inc. "XYZs of Oscilloscopes" Copyright 2001 consisting of 62 pages.

(Continued)

*Primary Examiner*—Peguy JeanPierre
(74) *Attorney, Agent, or Firm*—Mark A. Haynes; Haynes Beffel & Wolfeld LLP

(57) ABSTRACT

An enhancement that improves the performance of test and measurement equipment such as digital oscilloscopes and arbitrary waveform generators through the use of compression and decompression is described. The present invention is particularly effective for compressing and decompressing high-speed, bandlimited analog signals that are not appropriately or cannot effectively be compressed by prior art speech, audio, image, and video compression algorithms due to various limitations of such prior art compression solutions. The present invention improves digital oscilloscopes by compressing the sampled version of an analog waveform under observation in real time, allowing a significantly longer duration of the waveform to be stored in the oscilloscope's capture memory, when compared with the duration of the same signal's uncompressed waveform stored in the same memory. Similarly, the present invention improves arbitrary waveform generators by storing a compressed version of a desired arbitrary waveform, instead of the uncompressed version of the arbitrary waveform, in the signal generator's waveform memory. During signal generation, the compressed waveform is decompressed in real time. The uncompressed waveform drives a D/A converter that generates the desired analog waveform. The present invention's simplicity, and its ability to be implemented using parallel compression and decompression elements, allows its use at the high sampling rates of test and measurement instruments. Using the present invention, storage elements in test and measurement equipment can hold significantly longer waveforms in a fixed amount of memory. Users of the present invention can also determine the proper balance between the fidelity and the duration of the decompressed waveform by adjusting various compression and decompression control parameters.

42 Claims, 49 Drawing Sheets

U.S. PATENT DOCUMENTS

2003/0188005 A1* 10/2003 Yoneda et al. .............. 709/231

OTHER PUBLICATIONS

Türkboylari et al. "An Efficient Algorithm for Estimating the Signal-to-Interference Ratio in TDMA Cellular Systems" IEEE Transactions on Communications, vol. 46, No. 6, Jun. 1998, pp. 728-731.

Velazquez et al. "Design of Hybrid Filter Banks for Analog/Digital Conversion" IEEE Transactions on Signal Processing, vol. 46, No. 4 Apr. 1998 pp. 956-967.

Venbrux et al. "A VLSI Chip Set for High-Speed Lossless Data Compression" IEEE Transactions on Circuits and Systems for Video Technology, vol. 2, No. 4, Dec. 1992, pp. 381-391.

Weller "Relating Wideband DSO Rise Time to Bandwidth: Lose the 0.35!" edn.com Dec. 12, 2002 pp. 89-94.

Wu et al. "Lossless Compression of Hydroacoustic Image Data" IEEE Journal of Oceanic Engineering, vol. 22, No. 1, Jan. 1997 pp. 93-101.

Yoo et al. "A Power and Resolution Adaptive Flash Analog-to-Digital Converter" ISLPED '02 Aug. 12-14, 2002 Monterey, California Copyright 2002 pp. 233-236.

Agilent Technologies "Frequency and Time-Selective Power Measurements with the Agilent 89410A and 89440A" Copyright 1993, 2000, 2001 pp. 1-8.

NoiseCom.com "Noise Basics" 1998, pp. 33-35.

Arramreddy "An FPGA Approach for SNR Estimation Using Phase-Only Data" University of Arkansas Aug. 1999 pp. 1-11.

Lampinen et al. "A New Dual-Mode Data Compressing A/D Converter" IEEE International Symposium on Circuits and Systems, Jun. 9-12, 1997 pp. 429-432.

LeCroy "Measuring Noise Time, Frequency, and Statistical Domain Analysis" LeCroy Applications Brief No. L.A.B. 426, Nov. 1999, consisting of 2 pages.

LeCroy "How Fast Must I Sample? How Sampling Rate Affects Time Measurement Uncertainty" LeCroy Application Brief No. LAB 429, Aug. 2000, consisting of 2 pages.

LeCroy "Using Histograms I Use Statistical Analysis to Characterize Random Events" LeCroy Application Brief No. L.A.B. 718, Aug. 1996, consisting of 2 pages.

LeCroy "Using Histograms II Statistical Analysis Helps Determine Product Specifications" LeCroy Application Brief No. L.A.B. 719, Sep. 1996, consisting of 2 pages.

LeCroy "Using Histograms III Statistical Analysis As A Diagnostic Tool" LeCroy Application Brief No. L.A.B. 720, Sep. 1996, consisting of 2 pages.

LeCroy "Using Histograms IV Viewing Waveforms Related to Specific Histogram Data" LeCroy Application Brief No. L.A.B. 721, Sep. 1996, consisting of 2 pages.

Matzner et al. "An SNR Estimation Algorithm Using Fourth-Order Moments" IEEE 1994 p. 119.

"MPEG" www.ats.ucla.edu/at/software/scivis/mpeg/mpeg.htm 1996/1997, consisting of 4 pages.

Natarajan "Filtering Random Noise Via Data Compression" IEEE 1993 pp. 60-69.

Natarajan "Filtering Random Noise from Deterministic Signals via Data Compression" IEEE Transactions on Signal Processing, vol. 43, No. 11, Nov. 1995, pp. 2595-2605.

Data Translation, Inc. "In Choosing a Data Acquisition Board, Overall Accuracy=ENOB" 2000, pp. 1-6.

Bai et al. "Two-Pass Quantile Based Noise Spectrum Estimation" Center for Spoken Language Understanding OGI School of Science and Engineering at OHSU, 2003, 4 pgs.

Benz et al. "A Comparison of Several Algorithms for SAR Raw Data Compression" IEEE Transactions on Geoscience and Remote Sensing vol. 33, No. 5 Sep. 1995 pp. 1266-1276.

Engelson et al. "Lossless Compression of High-Volume Numerical Data from Simulations" IDA, Linköping University Jan. 13, 2000 pp. 1-13.

Agilent Technologies "10 Steps to Selecting the Right Oscilloscope" Copyright 1998, 2000 consisting of 5 pages.

Ives et al. "Lossless Compression of Waveform Data Using Multiple-Pass Adaptive Filtering" IEEE 2000 pp. 2648-2650.

Stearns et al. "Lossless Compression of Waveform Data for Efficient Storage and Transmission" IEEE Transactions on Geoscience and Remote Sensing, vol. 31, No. 3 May 1993 pp. 645-654.

Tektronix "Bandwidth and the Influence of Digital Signal Processing", Dec. 2002, consisting of 13 pages.

Tektronix "Effects of Bandwidth on Transient Information" Copyright 1998 consisting of 4 pages.

Rodriquez et al. "Adaptive Method for SNR Estimation in Speech Signal" Electronics Letter, vol. 32, No. 5 Feb. 29, 1996 pp. 421-422.

Shin et al. "Simple SNR Estimation Methods for QPSK Modulated Short Bursts" IEEE 2001 pp. 3644-3647.

Pauluzzi et al. "A Comparison of SNR Estimation Techniques for the AWGN Channel" IEEE Transactions on Communications, vol. 48, No. 10, Oct. 2000 pp. 1681-1691.

Pinho "An Online Preprocessing Technique for Improving the Lossless Compression of Images With Sparse Histograms" IEEE Signal Processing Letters, vol. 9, No. 1 Jan. 2002 pp. 5-7.

Pinho "Preprocessing Techniques for Improving the Lossless Compression of Images with Quasi-Sparse and Locally Sparse Histograms" IEEE 2002 pp. 633-636.

Ruscak et al. "Using Histogram Techniques to Measure A/D Converter Noise" Analog Dialogue, vol. 29, No. 2, 1995, consisting of 4 pages.

Evans et al. "Efficient Real-Time Noise Estimation Without Explicit Speech, Non-Speech Detection: An Assessment on the Aurora Corpus" IEEE 2002 pp. 985-988.

Fang "VLSI Processor Design of Real-time Data Compression for High-Resolution Imaging Radar" IEEE Apr. 1994 pp. 441-444.

Gawedzki "Analysis of Measurement Signals Compression Algorithm Properties in the Time Domain" IEEE Instrumentation and Measurement Technology Conference May 21-23, 2001 pp. 725-728.

Gritzali et al. "Noise Estimation in ECG Signals" IEEE Engineering In Medicine & Biology Science 10th Annual International Conference 1988 consisting of 2 pages.

He et al. "Effective SNR Estimation in OFDM System Simulation" IEEE 1998 pp. 945-950.

Hong et al. "SNR Estimation in Frequency Domain Using Circular Correlation" Electronics Letters vol. 38, No. 25, Dec. 5, 2002 pp. 1693-1694.

Klimesh "Quantization Considerations for Distortion-Controlled Data Compression" TMO Progress Report 42-139 Nov. 15, 1999 pp. 1-38.

Konstantinos et al. "An Architecture for Lossy Compression of Waveforms Using Piecewise-Linear Approximation" IEEE Transactions on Signal Processing, vol. 42, No. 9 Sep. 1994 pp. 2449-2454.

Konstantinides et al. "Noise Estimation and Filtering Using Block-Based Singular Value Decomposition" IEEE Transactions on Image Processing, vol. 6, No. 3 Mar. 1997 pp. 479-483.

Kovac "Efficient Data Compression Algorithm for Data Loggers, Measurement Equipment and Remote Data Analysis Applications" IEEE 1998 pp. 47-48.

"Popular Sampling Rates" http://sox.sourceforge.net/AudioFormats-3.html, Nov. 14, 1998, consisting of 2 pages.

Craven et al. "Lossless Coding for Audio Discs" J. Audio Eng. Soc., vol. 44, No. 9 Sep. 1996 pp. 706-720.

Nelson et al. "The Data Compression Book" Chapter 10 (Speech Compression) Publication 1996 pp. 289-319.

Agilent Technologies, Inc. "Agilent Technologies 3000 Series Oscilloscopes Data Sheet" Jun. 17, 2005.

Tektronix, Inc. "Digital Storage Oscilloscopes" Aug. 2005.

LeCroy Corporation "Wave Runner (R) 6000A Series" Sep. 2005.

National Instruments Corporation "100 MS/s, 14 Bit Arbitrary Waveform Generator" 2004.

Agilent Technologies, Inc. "Agilent 33220A MHz Function Arbitrary Waveform Generator Data Sheet" Mar. 14, 2005.

Tektronix, Inc. "AWG 400 Series Arbitrary Waveform Generators" Aug. 2001.

* cited by examiner

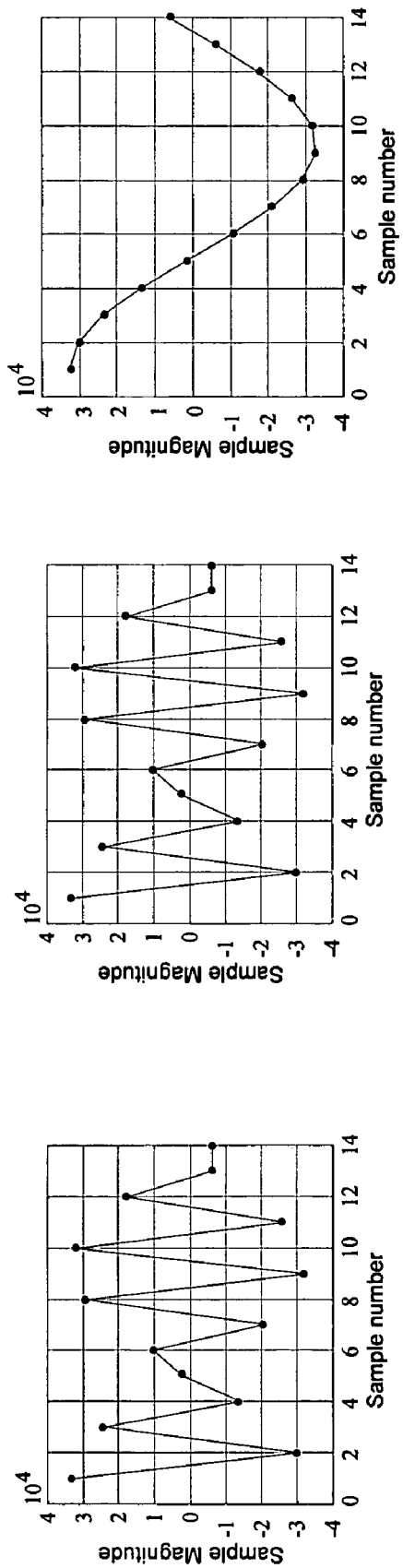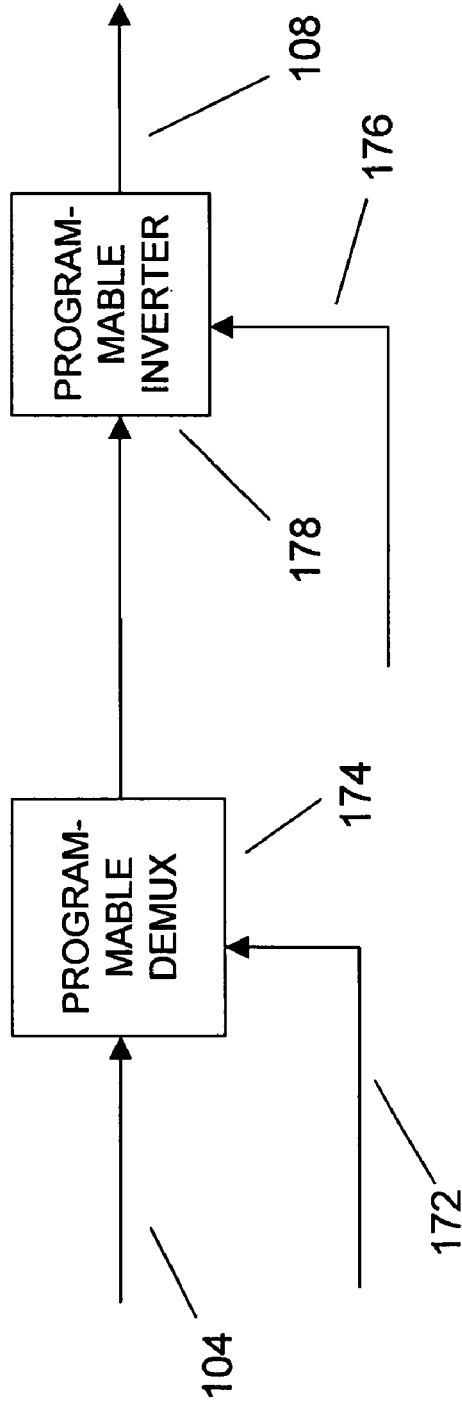
Fig. 15

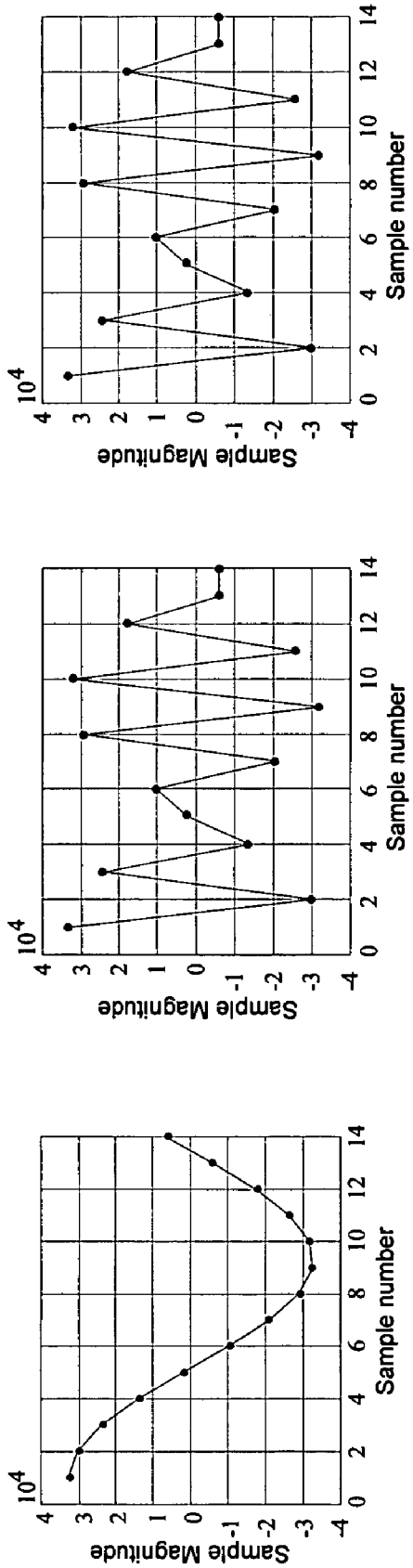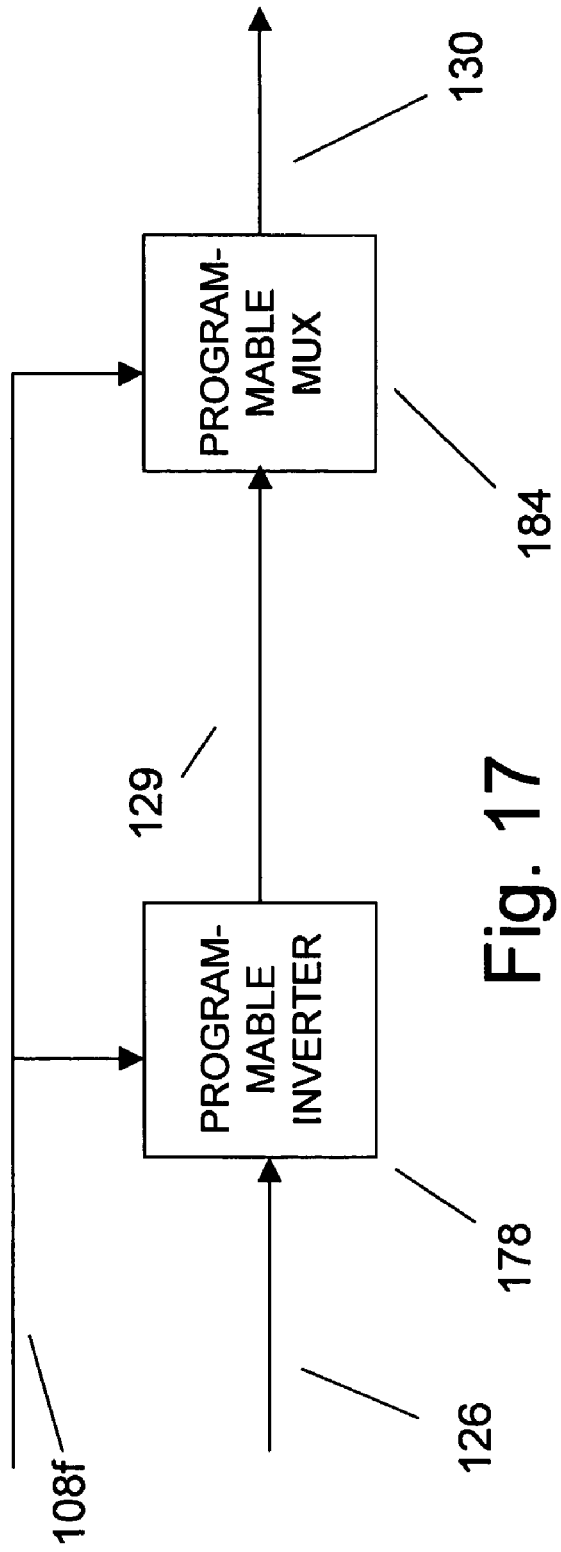
Fig. 17

ENHANCED TEST AND MEASUREMENT INSTRUMENTS USING COMPRESSION AND DECOMPRESSION

1.0 BACKGROUND

Field of Invention

This invention relates to the integration of lossless and lossy compression and decompression functions into test and measurement instruments that acquire, generate, or process high-speed sampled analog signals, such as oscilloscopes and signal generators.

2.0 BACKGROUND

A desirable goal in sampled data systems is to minimize the representation of the signal being sampled. In minimizing the representation, two related results are achieved:
 a) the amount of storage required for the signal is minimized, and
 b) the bandwidth required for transmitting the signal is decreased.

By decreasing storage and bandwidth requirements, significant cost savings are also realized.

Recently, the rapid increase in the amount of sampled data, sampled at ever-increasing sampling rates, has also increased the potential benefits of minimizing the digital representation of analog signals. Sampled analog signals consume significant bandwidth and memory during acquisition, processing, and storage, especially when such signals are stored in a storage medium for later retrieval and analysis. For this reason, a smaller representation of a sampled analog signal translates directly into cost savings, decreasing both the amount of memory required to store the signal and the time or bandwidth required to transmit the signal from one location to another. Certain applications, specifically those in test and measurement equipment and in analog-to-digital and digital-to-analog conversion, benefit from the use of compression and decompression. Such applications, and their corresponding benefits, are further described below.

A number of references are referred to herein including:
[1] http://sox.sourceforge.net/AudioFormats-3.html
[2] http://www.ats.ucla.edu/at/software/scivis/mpeg/mpeg.htm
[3] Tektronix Application Note "XYZs of Oscilloscopes", May 2001, Document 03W-8605-2.
[4] Tektronix Application Note. "Effects of Bandwidth on Transient Information." 1998. www.tek.com.
[5] Weller, Dennis. "*Relating Wideband DSO Rise Time to Bandwidth: Lose the 0.35!*" *EDN Magazine,* 12 Dec. 2002, pp. 89–94.
[6] Agilent Tech Note 5968-2322E. "10 Steps to Selecting the Right Oscilloscope." May 2000. www.agilent.com.

2.1 Prior Art Compression Methods for Speech, Audio, Images, and Video

Because the aforementioned benefits arise from compressing analog signals, it has already been common practice to try to compress certain kinds of sampled analog signals under certain conditions. A variety of prior art techniques for compressing specific kinds of analog signals, such as speech, audio, images, and video, are well known to those skilled in the art. Furthermore, such speech, audio, image, and video signals are usually acquired at standardized sampling rates. Examples of signal-specific compression techniques, and their corresponding uncompressed sample rates, include:

For speech: ADPCM and CELP, with standard uncompressed sampling rates of 8 ksamp/sec and sample widths of 8 bits/sample
 For audio: MP3 and Dolby AC-3, with standard uncompressed sampling rates of 44.1 ksamp/sec or 48 ksamp/sec and integer divisors or multiples thereof, such as 88.2 (2×44.1), 22.05 (44.1/2), 11.025 (44.1/4), 96 (2×48) 24 (48/2), and 12 (48/4) ksamp/sec, and sample widths of 16 or 24 bits/sample [1]
 For images: JPEG and GIF, with 8 to 24 bits per pixel of color, limited choice of aspect ratio (4:3 or 16:9), and image size (number of pixels) of 320×240 to 1600× 1200.
 For video: MPEG, G.723, and H.261, with limitations on the number of frames per second, bits per pixel of color, aspect ratio, and image size (number of pixels). For details, we include the following excerpt from [2]:
  There are two limitations when using MPEG to make scientific visualization movies, which are picture rates and image sizes. These limitations are due to the fact that MPEG was developed to meet certain requirements and standards found in the television and motion picture industry. The requirements and standards for television are the formats of the National Television System Committee (NTSC) used in the United States and Japan, and the Phase-Alternation-Line (PAL) and Sequentiel Couleur Memorie (SECAM) of Europe.
  As a result, there are only a few picture rates (frames/sec-fps) coding available for MPEG-1 movies, which are 24, 25, 30, 50 and 60 fps. Image sizes also have limitations for best movie playback results. MPEG-1 maximum image sizes are approximately 352×240 pixels (NTSC) and 352×288 pixels (PAL). The generic MPEG-2 standard allows virtually all possible frame-rates. Also, it handles the image sizes of MPEG-1, full CCIR-601 720×480 pixels, and other user-defined image sizes. However, if you are using playback software alone, it is recommended to keep image sizes relatively small to play the movie at reasonable speeds. For example, MPEG-1 is intended to be used with an image size of 352×288 pixels to play it back in software at 24–30 fps. Another factor that prevents MPEG movies to be played at reasonable speeds in software is system load. The higher the load, the slower the playback speed. MPEG boards provide a solution to these limitations and offer much higher playback performances.

However, many sampled analog signals do not contain speech, audio, images, or video. Such signals do not have any associated "standard" sampling rates. Examples of such analog signals include but are not limited to:
 Communication signals (at baseband, at an intermediate frequency, or at RF)
 Electronic signals generated by, or within, integrated circuits
 Temperature and pressure signals
 Vibration and stress measurement signals
 Geophysical signals
 Medical signals (EEG, EKG, ultrasound, etc.)

While the aforementioned analog signals may not have a "standard" sampling rate associated with their processing by an A/D or D/A converter, they do have a predictable minimum sampling rate that is based on the Nyquist theorem, which states that the sampling rate must be at least two times as high as the analog signal bandwidth.

The present invention provides effective compression results for any sampled analog signal, regardless of its location in the normalized frequency band (from 0 Hz or DC to the Nyquist frequency at half the sampling rate), for signals with unknown or varying signal-to-noise ratio (SNR), and especially for signals such as (but not limited to) those listed above that have heretofore not been effectively compressed in real time due to limitations of existing prior art compression algorithm complexity, and due to restrictions on allowable sample rates.

2.2 Signal Characteristics for the Present Invention: Not Application-Specific

While other compression techniques offer satisfactory compression performance for speech, audio, image, and video signals, the present invention provides the benefits of compression to a larger, broader class of signals: the general class of sampled analog signals, especially those sampled data signals that are acquired, generated, or processed at high sampling rates. Furthermore, the present invention's simplicity allows it to compress or to decompress (or both), in real time, signals whose bandwidth (and thus also the required sampling rate) is much higher than those signals with narrower bandwidths, such as speech, audio, image, and video signals. The present invention is especially effective in providing useful compression of digitized analog signals:

whose sampling rate is 1 Msamp/sec or higher (much higher than the sampling rate required for speech and audio signals), and which are not rasterized, that is, not organized into sequential or interleaved horizontal lines (such as those that create an image or a sequence of images [video]).

For the remainder of this patent application, we refer to such signals as high-speed analog signals.

Bandlimited signals are those signals that occupy a small to moderate percentage of the so-called Nyquist bandwidth. Those skilled in the art will recognize that an analog signal whose highest frequency component is f Hz must be sampled at a rate that is at least 2*f Hz, so that the sampled waveform uniquely represent the original analog signal. Stated differently, for a given sampling rate $f_s$, the Nyquist bandwidth is $f_s/2$. If the analog signal is sampled at a rate lower than $f_s/2$, an undesirable phenomenon called aliasing occurs. Aliasing is undesirable because if it is allowed to occur, the same sample stream can represent more than one signal. When aliasing occurs, the frequency source of the signal energy is ambiguous, and the signal is therefore effectively useless.

Those skilled in the art will recognize that it is common practice to sample an analog signal at a rate that is often significantly greater than the Nyquist bandwidth. For example, oscilloscope manufacturers commonly refer to the "5 times rule" [3] or the "3× to 10× rule" [6]; also see [4] and [5] for discussions relating sampling rate, bandwidth, and rise time. In other words, the sampling rate used to sample an analog signal should be at least five times higher than the highest frequency component of the analog signal. In this case, the bandwidth of interest is just ⅕ (20%) of the Nyquist rate, instead of the theoretical ½ (50%). As the percentage of the sample bandwidth decreases from 50% to 20% (for example), the notion of a bandlimited signal becomes applicable. The lower the percentage of spectral occupancy (percent of the Nyquist bandwidth that is occupied by the desired signal), the more bandlimited the nature of the digitized signal. The concept of bandlimited signals is well known to those skilled in the art. Bandlimited signals are frequently encountered in scientific, industrial, medical, electronic, and communications applications. While the present invention decreases the required data rate of signals with relatively modest bandlimiting (2×), the present invention's utility also improves as the amount of bandlimiting increases.

One reason for a lack of compression solutions for the general class of high-speed analog signals is the perceived difficulty of compressing them. The following signal parameters are the primary ones chosen to characterize the analog signals that are efficiently compressed by the present invention:

the signal's center frequency
the signal's bandwidth
the signals noise floor or signal-to-noise ratio (SNR)

Among high-speed analog signals, broad variations in these three parameters contribute to the general perception that sampled high-speed analog signals cannot be compressed.

2.3 Analog Signal Assumptions of Prior Art Compression Methods

Prior art compression techniques for speech, audio, images and video all make certain assumptions about the analog signal characteristics listed above:

the signal's signal energy (center frequency) is at or near DC (0 Hz), the signal's bandwidth is narrow and predictable, compared to the sampling rate, the signal's SNR is high (i.e. the sound is not noisy, or the image is not grainy).

If these signal characteristics are not met, prior art compression results will suffer.

In contrast, the present invention provides effective compression for analog signals whose center frequency, bandwidth, and SNR can vary over time. Indeed, it is a goal of the present invention to monitor certain signal parameters over time, including the signal's center frequency, bandwidth, and SNR, and to adjust compressor and decompressor operations according to the measured or estimated signal parameters. Because existing speech, audio, image, and video compression techniques have made the assumptions listed above about the signals they are compressing, prior art compression techniques are not effective if the bandwidth, SNR, and center frequency of the signal to be compressed vary over time.

Furthermore, compression of speech, audio, image, and video signals takes advantage of the limitations of human hearing and vision. Human hearing has the following characteristics:

Frequency limits: approximately from 50 Hz to 20 kHz,
Non-uniform frequency sensitivity (Bark curve)
Temporal masking: loud sounds mask quieter sounds that come later,
Frequency masking: strong frequencies mask weaker, nearby frequencies Both speech and audio compression methods take advantage (and thus depend on) one or more of these characteristics of human hearing in order to achieve acceptable compression results. The goal of speech and audio compression algorithms is to minimize the perceived audible difference between the original speech or audio signal and the resulting speech or audio signal after a compress-decompress cycle.

Thus both speech and audio compression algorithms minimize distortions that humans can hear. The distortions minimized by speech and audio compression algorithms are not the appropriate or applicable distortion metrics for judging compression quality if the input signal is not audible, i.e. was not obtained from an analog signal with maximum frequency at or below 20 kHz.

Similarly, human vision has the following characteristics:
Wavelength limits: approximately from 400 nm to 700 nm
Non-uniform frequency sensitivity
Greater sensitivity to luminance (brightness) than to chrominance (color)
Perception of photographic features in "clumps" (humans easily notice edges in images or video)

Both image and video compression methods take advantage (and thus depend on) one or more of these characteristics of human vision in order to achieve acceptable compression results. The goal of image and video compression algorithms is to minimize the perceived visual difference between the original image or video signal and the resulting image or video signal after a compress-decompress cycle. Thus both image and video compression algorithms minimize distortions that the human visual system notices. The distortions minimized by image and video compression algorithms are not appropriate or applicable distortion metrics for judging compression quality if the input signal is not visual, i.e. was not obtained from an input analog signal that represents a still or a moving image.

To further identify the limitations of signal-specific performance of speech, audio, image, and video compression methods, these signal-specific compression techniques can only be applied if the input signal belongs to the compression method's signal class. If the input analog signal belongs to another signal class, the compression technique may make inappropriate assumptions that degrade the resulting signal after a compress-decompress cycle. A speech compression algorithm does not achieve acceptable compression results on an image. Similarly, a video compression algorithm does not achieve acceptable compression results on an audio signal. For this reason, speech and audio compression algorithms are not appropriate for compressing a communications signal, a geophysical signal, or an oscilloscope waveform, because the assumptions made by the compression method (frequency limits, non-uniform frequency sensitivity, and frequency and temporal masking) are not applicable to such a communications signal.

Thus the many application-specific compression solutions developed for speech, audio, images, and vision, while valuable in those applications, are not effective for compressing a broad class of bandlimited, high-speed analog signals. The characteristics of such high-speed analog signals differ significantly from the input signal characteristics assumed by prior art speech, audio, image, and video compression algorithms.

2.4 Complexity of Prior Art Compression Methods

Lossy audio and video compression techniques typically require significant signal processing effort to achieve their compression and decompression results. For instance, the lossy MPEG video and audio compression algorithms often require special, expensive signal processing hardware to compress or to decompress an MPEG stream in real time at a high quality level. While decompression of lossy-compressed signals can sometimes be performed by a personal computer's (PC) central processing unit (CPU) without such special hardware, real-time lossy audio and video compression often requires special, expensive hardware support. This hardware acceleration adds to the cost of the computer system, which is a drawback to such compression.

There is a predictable relationship between the sampling rate required to represent a signal and the MIPS or gates required to compress such a signal. For example, an audio signal's bandwidth occupies about 20 kHz, which is determined by the frequency limits of human hearing. When sampling audio signals, there is no need to represent frequencies higher than 20 kHz because the human auditory system (hearing) cannot detect such frequencies. Similarly, for images and video, the human visual system cannot perceive the difference between images that change every $\frac{1}{30}^{th}$ of a second (the frame rate), and those that change more often than that. Since a single frame (image) can be represented with a few hundred thousand pixels, video signals require at most a few MHz of bandwidth. Using more than a few MHz to represent video or images would be a waste, since the human visual system cannot perceive the additional pixels or the faster frame rate.

Even if speech, audio, image, and video compression algorithms could effectively compress signals with wider bandwidths (and for which their assumptions about signal content were not intended), there is a fundamental complexity problem in applying such compression algorithms at higher sampling rates. To illustrate this fundamental problem, let us consider using a prior art audio compression algorithm (MP3) to compress a communications signal with a 20 MHz bandwidth.

A typical audio signal is sampled at 48 ksamp/sec. The MP3 audio compression algorithm requires about 20 MIPS (million instructions per second) on a programmable digital signal processor (DSP), such as the Texas Instruments TMS320C5409 processor. Given these parameters, each input sample of an audio stream requires [20 MIPS/48 ksamp/sec=] 416 instructions/sample.

Now, in order to digitize our 20 MHz communications signal, the required sampling rate is at least 40 Msamp/sec (the Nyquist rate), or using the aforementioned "5 times rule" for oscilloscopes, preferably 100 Msamp/sec. Regardless of what kind of signal is being compressed, the MP3 algorithm still uses an average of 416 instructions per sample. But since the sample stream of our communications signal now arrives at 100 Msamp/sec, we would need a processor that can perform 416*100M=41.6×10E9, or 41.6 Giga-operations, per second. Clearly, processors with this many operations do not exist today, and even if they did exist, they would require prohibitive amounts of power and area to implement MP3 at this sampling rate. Consequently, the cost of such processors would be prohibitive. To summarize, the application of speech, audio, image, and video compression solutions to signals with significantly higher sampling rates is impractical and expensive, because such prior art compression solutions do not scale effectively and hence are too complex to be applied to signals with significantly higher sampling rates.

2.5 Lossy and Lossless Compression

Applications exist where the approximations introduced by lossy compression methods are unacceptable. For example, in medical imaging applications, the fuzziness introduced by lossy image compression methods can remove details that are crucial for a correct diagnosis by a doctor. In audio applications, especially in the fields of professional audio post-production and archiving, lossy audio compression techniques introduce unacceptable artifacts.

Another class of compression algorithms (not intended for speech, audio, image, or video signals) was developed to compress the text, spreadsheet, and program (application) files typically found on computers. Algorithms that compress these kinds of files are of necessity lossless. They exactly re-create the original file from its compressed version. For these kinds of compression applications, even a single error in the re-creation of the original file from its compressed version would be catastrophic. An uncompressed file simply would not be processed or interpreted correctly if it did not exactly match the original file. U.S. Pat. No. 4,558,302 to Welch (1985) is a well-known, prior art lossless data compression method.

Computer files containing text, spreadsheets, or programs can be compressed effectively through lossless data compression methods that exploit the statistical properties of such files. In a text file, for instance, the likelihood of the letter "q" being followed by the letter "u" for English text approaches 100%. Lossless data compression algorithms that reduce the storage required to represent the files exploit the statistical characteristics present in such common computer files. Unfortunately, the statistical properties of computer files differ significantly from those computer files that contain digital audio or video. For this reason, lossless data compression algorithms designed for text, spreadsheet, or program files that are applied to sampled audio or video signals typically result in little or no reduction in storage. Sampled data signals do contain redundancies, but existing lossless data compression algorithms are not designed to detect or to exploit the redundancies specific to such signals.

Another drawback of lossless data compression methods intended for typical computer files is that they are not designed to run in real time. For audio and video signals, "real time" is defined as requiring less processing time to compress or to decompress the signal than is required to listen to (speech, audio) or to view (video) the signal. The amount of processing (MIPS or gates) required to effectively compress computer files containing text, spreadsheets, or programs is significant. Even if acceptable compression ratios could be achieved on audio or video files by these text compression methods, they would in all likelihood not run in real time as defined above.

The present invention enables both lossless and lossy compression of high-speed analog signals. Users of the present invention can select the present invention's lossless compression mode, which usually results in at least a 2:1 compression ratio for bandlimited signals. Lossless mode ensures that the sampled high-speed analog signal can be exactly re-created, bit for bit, from a compressed version of the signal that is created using the lossless compression mode of the present invention. Alternately, users of the present invention can also select its lossy compression mode. Using the present invention's lossy compression mode, users select either a fixed compression ratio (such as 3:1 or 2.6:1) or a maximum acceptable distortion level (such as 15 dB or 2.4 LSBs), and the present invention compresses the sampled high-speed analog signal according to the user-selected constraints. Furthermore, the present invention can include a preprocessor that converts signals with non-ideal characteristics for the compressor (such as a non-baseband center frequency, or a low SNR) into a signal with more preferable characteristics for the compressor. To summarize, the present invention offers users both a lossless and a lossy operating mode.

2.6 Differences Between Prior Art Compression Methods and the Present Invention

With regard to the use of incremental processing (additional MIPs or gates), prior art compression algorithms for speech, audio, images, and video apply such incremental processing resources to increased compression ratios or decreased distortion. In contrast, the present invention maintains a relatively constant algorithm complexity and applies incremental processing resources (additional MIPS or gates) to increasing the maximum achievable sampling rate.

Similarly, prior art compression methods for speech, audio, images, and video attempt to minimize a given human-perceptual distortion level which, by design, is frequency-specific. In contrast, the present invention introduces wideband distortions that affect all frequencies relatively equally, or which remove selected frequencies by comparatively simple filtering.

Finally, the perceptual curves used in prior art speech, audio, image, and video compression methods are fixed, since they are based on human hearing and vision, which does not change over time. Prior art compression methods simply try to minimize the perceived distortions in a given frequency band, and at a given bit rate, rather than trying to measure whether the distortions so introduced will be noticeable. In contrast, the present invention monitors the sampled input signal's center frequency, noise floor, and bandwidth and adjusts the preprocessor and/or compressor operation to adapt to the sampled input signal's characteristics. In one particular embodiment of the present invention, the preprocessor measures the wideband noise floor of the sampled input signal and can inform users when the wideband distortions introduced by LSB removal are measurable. Thus during lossy compression, the present invention can inform users when distortions above the input signal's noise floor occur.

2.7 Summary of Drawbacks of Prior Art Compression Methods

To summarize, existing lossy compression methods developed for signals that are intended for human listening or viewing suffer from the following drawbacks when applied to a broader class of wideband, bandlimited sampled high-speed analog signals:
 a) they incorrectly use assumptions about signal characteristics that are not applicable,
 b) they cannot operate at increasingly fast sampling rates due to their complexity,
 c) they cannot operate effectively as the center frequency, bandwidth, or noise floor (SNR) of the input signal varies,
 d) they minimize distortion metrics that reflect known limitations of human hearing and vision, but such metrics are not appropriate for non-audible, non-visual signals,
 e) they do not inform users when the distortions introduced during lossy compression will be noticeable.

3.0 OBJECTS AND ADVANTAGES

There is an increasing need for algorithms that compress and decompress sampled analog signals in real time, where the compressed representation requires significantly less bandwidth and storage than the original sampled data signal. It is appreciated that the compression and decompression methods of the present invention fulfill these requirements. Furthermore, the present invention scales with sampling rates, i.e. as faster A/D and D/A converters are developed, the present invention scales to process signals from such improved converters. A particular implementation of the present invention, utilizing parallel processing for compression or decompression, offers scalability to higher sampling rates by using two or more compressors, or two or more decompressor, working together to compress a sampled input signal at increasingly higher sampling rates. The present invention requires only a moderate amount of processing resources: programmable logic elements of a field-programmable gate array [FPGA], gates of an application-specific integrated circuit [ASIC], or MIPS of a programmable processor, such as a DSP or microprocessor. Thus the present invention's compression and decompression operations enable sampled data acquisition applications requiring real-time compression, as well as sampled signal generation applications requiring real-time decompression.

Accordingly, several objects and advantages of the present invention are:
a) to provide identical reconstruction of sampled high-speed analog signals from their compressed representation,
b) to provide a lossy method of representing sampled high-speed analog signals that meet a user-specified compression ratio or user-specified distortion level,
c) to minimize an appropriate distortion metric (root-mean-square error) for compressed, sampled analog signals,
d) to provide a significant decrease in the storage requirements for the compressed signal when compared to the storage required for the original sampled signal;
e) to provide a significant decrease in the bandwidth requirements to transfer the compressed signal, when compared to the bandwidth required to transfer the uncompressed, sampled signal,
f) to provide an efficient, scalable, and parallelizable method for compressing and decompressing sampled analog signals in real time, compressing the uncompressed output of an A/D converter and decompressing the compressed input of a D/A converter,
g) for test and measurement devices such as oscilloscopes that capture sampled versions of analog signals in a fixed amount of physical memory, to provide a user-selectable increase in the effective amount of memory by compressing the sampled signals prior to their storage in a physical memory,
h) for signal generators that store sampled versions of analog signals in a fixed amount of physical memory, to provide a user-selectable increase in the effective amount of that memory by compressing the sampled signals prior to storage in a physical memory,
i) for computer busses or networks that connect electronic components or boards carrying sampled analog signals to other such components or boards, to provide a method for transmitting wider bandwidths, or more channels, at the same physical data rate of an existing bus, cable, or network, or to decrease the number of connectors, cables, or wires needed to carry the sampled analog signals,
j) for enhanced A/D converters, to provide a method of compressing the output of A/D converters that lowers the data rate or number of pins at the digital output of such enhanced A/D converters,
k) for enhanced D/A converters, to provide a method of decompressing the compressed input of D/A converters that lowers the data rate or number of pins at the digital input of such enhanced D/A converters, Further objects and advantages of my invention will become apparent from a consideration of the drawings and ensuing description.

4.0 SUMMARY

In a sampled data compression and sampled data decompression system, the present invention uses one or more preprocessors to improve the compression performance of one or more compressors. The preprocessor optionally increases the redundancy, lowers the bandwidth, changes the sampling rate, or decreases the noise of an input signal to be compressed, so that the compression rate at the output of the compressor is improved. During decompression, a decompressor recreates the original preprocessor output signal, and a postprocessor reverses the operations performed by the preprocessor in order to recreate the sampled input signal originally provided as input to the preprocessor. Preprocessor and compressor operations, as well as decompressor and postprocessor operations, are simple mathematical functions suitable for hardware implementation in ASICs or FPGAs, or (at lower sampling rates) on programmable DSPs or microprocessors. The simplicity of the present invention's preprocessor, compressor, decompressor, and postprocessor enables real-time compression and decompression of analog signals at high sampling rates. Specific examples of applications in test and measurement, data conversion, and data transfer across busses, cables, and networks are developed to demonstrate the improved performance achieved when these applications integrate certain embodiments of the present invention.

5.0 DESCRIPTION OF DRAWINGS

In the drawings, closely related, numbered components use the same number with different alphabetic suffixes.

FIG. 15 shows an example of FIG. 12's operation when the signal period results in a demultiplexing by 1 and inversion of every other demultiplexed sample.

FIG. 17 shows an example of how FIG. 15's original signal is recovered through inversion followed by multiplexing.

Figure 23:
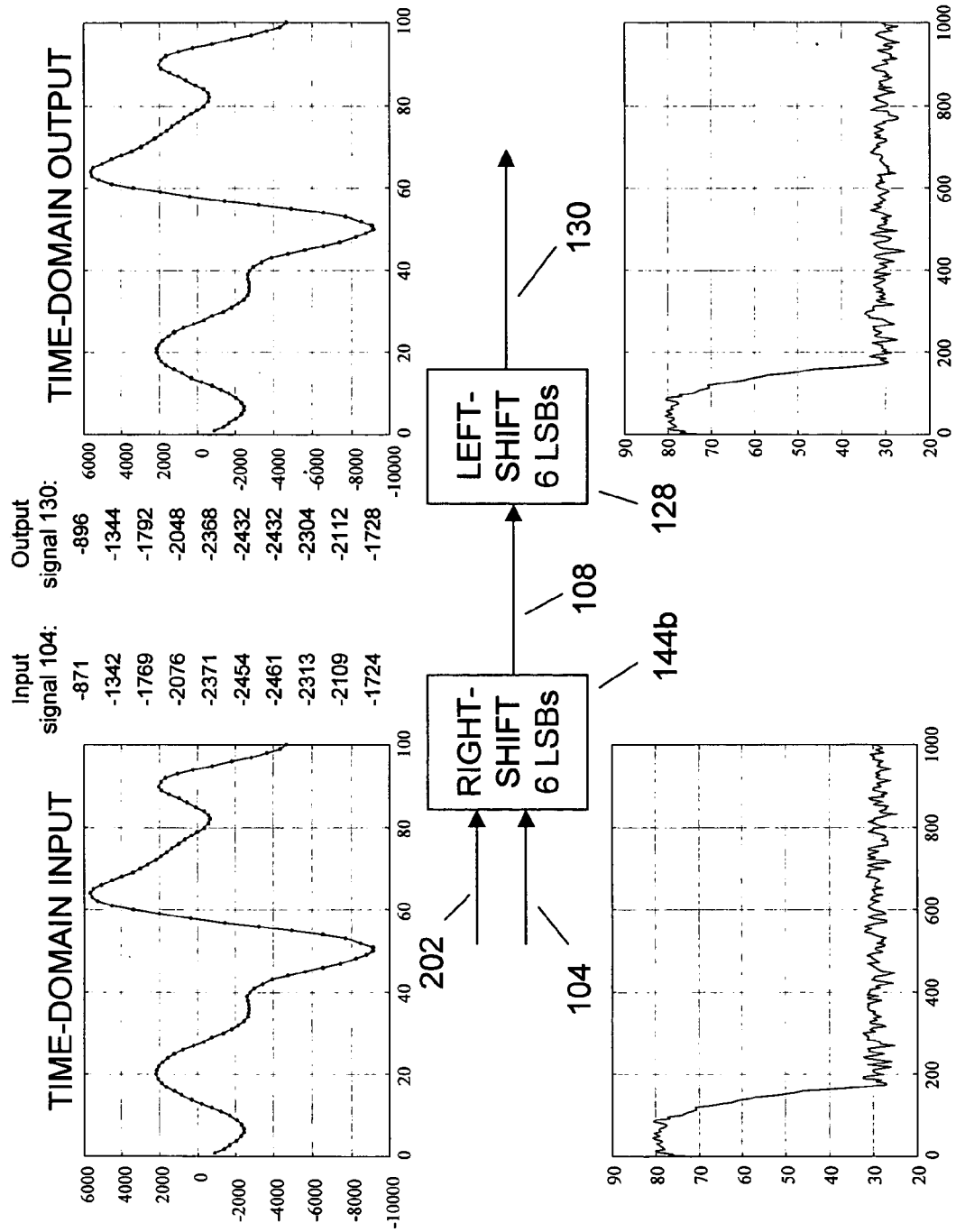

FIG. 23 provides an example of how removing LSBs affects the time-domain signal and the signal spectrum.

Figure 24:
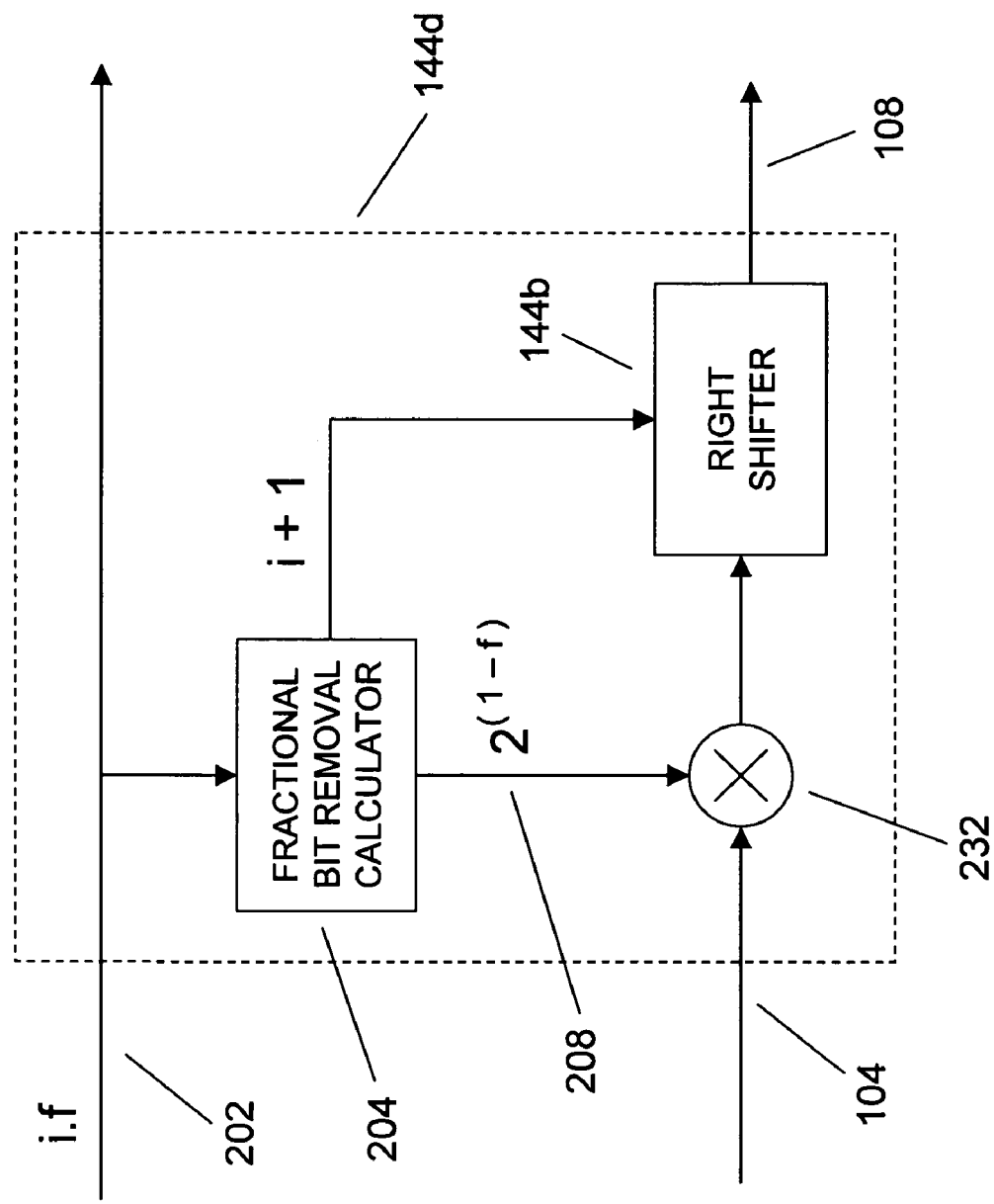

FIG. 24 illustrates fractional bit rate removal.

Figure 20:
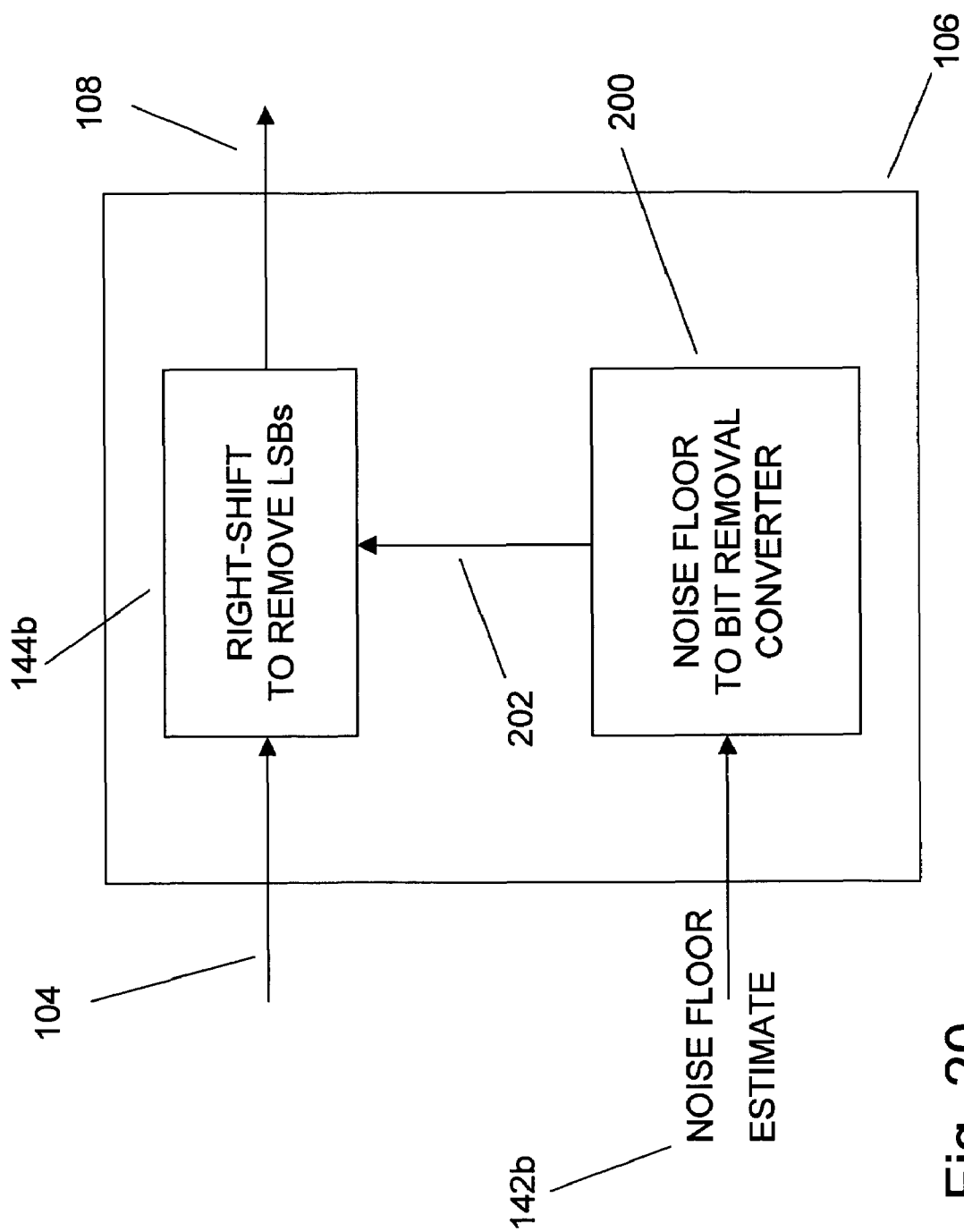
FIG. 20 shows a signal preprocessor that removes LSBs based on a control parameter that is derived from a noise floor estimate.
Figure 25:
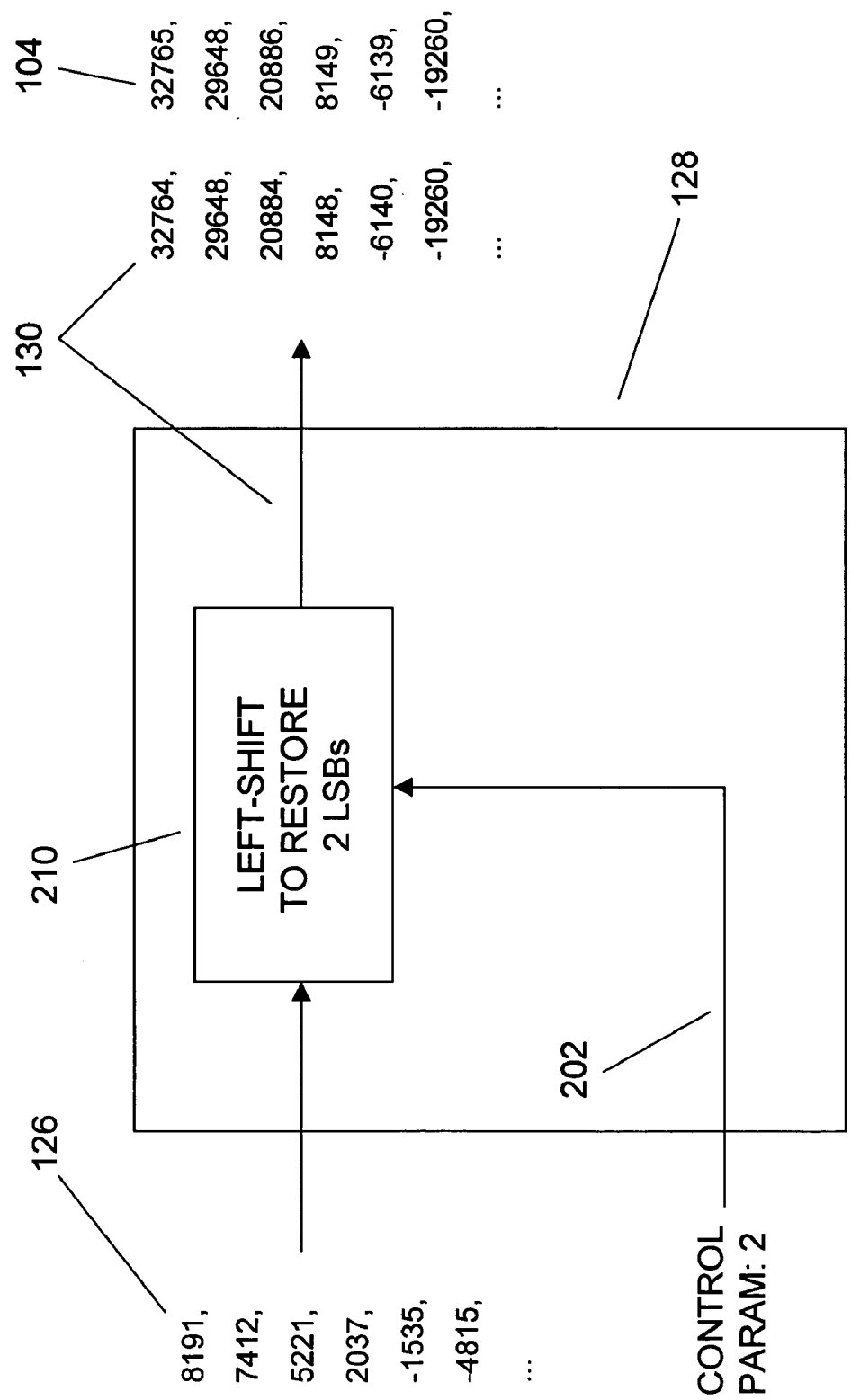

FIG. 25 shows a signal postprocessor that restores the original magnitude of FIG. 20's signal by left-shifting the decompressed samples received from a decompressor.

Figure 26:
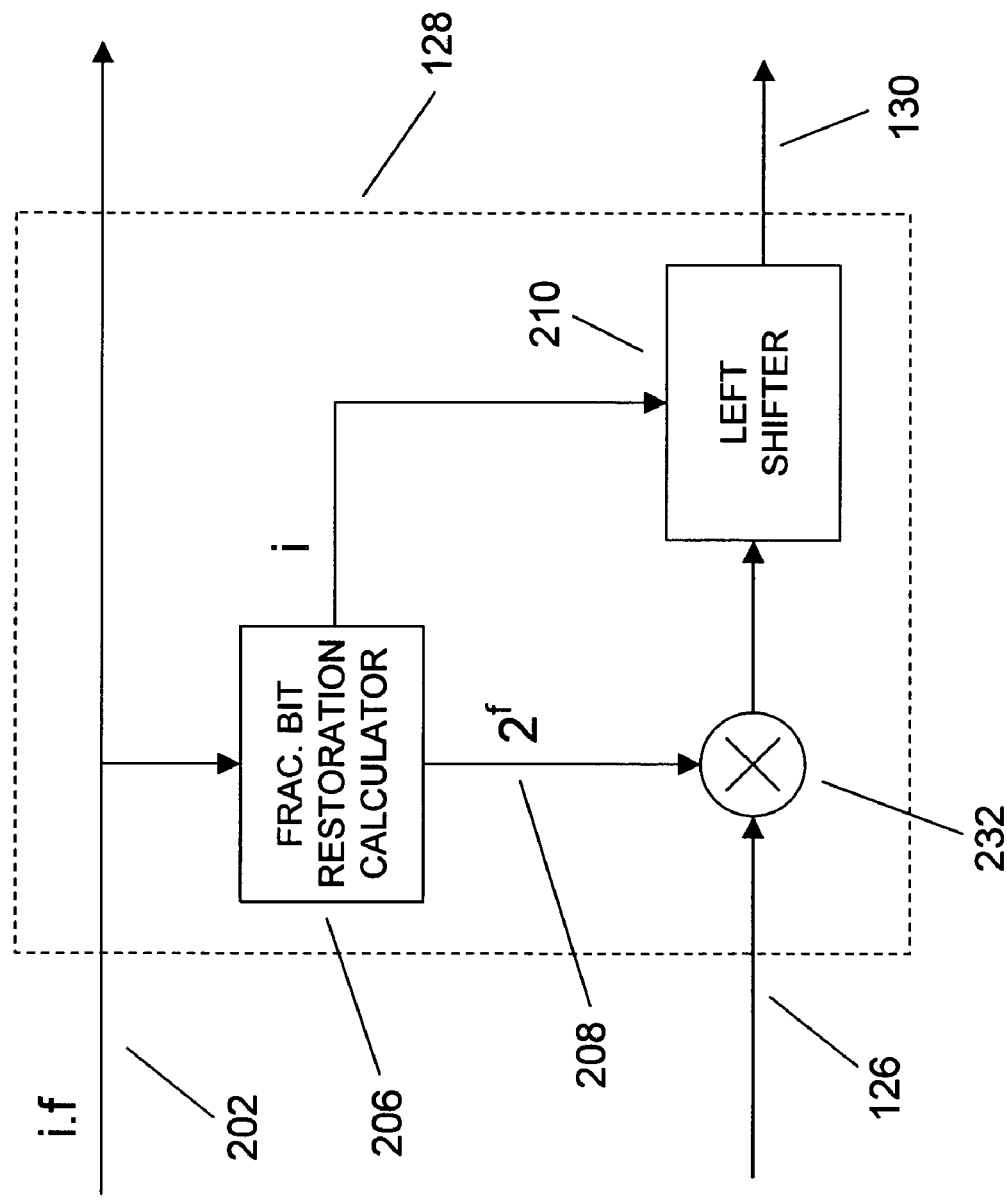

FIG. 26 demonstrates fractional bit rate restoration.

Figure 7:
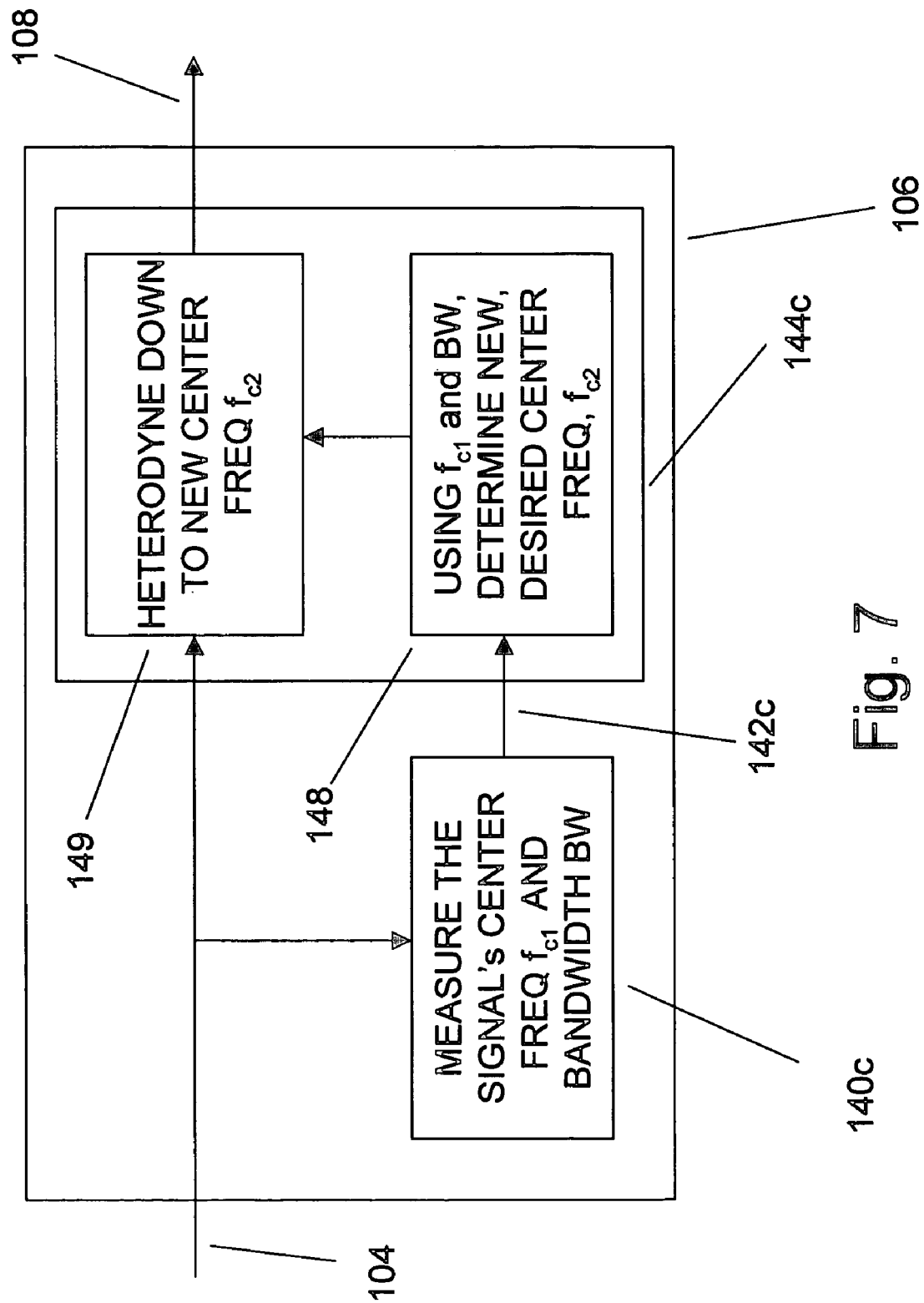
FIG. 7 shows an adaptive signal translation algorithm, which translates an input signal to another frequency based on an estimate of the signal's center frequency and bandwidth.
Figure 27:
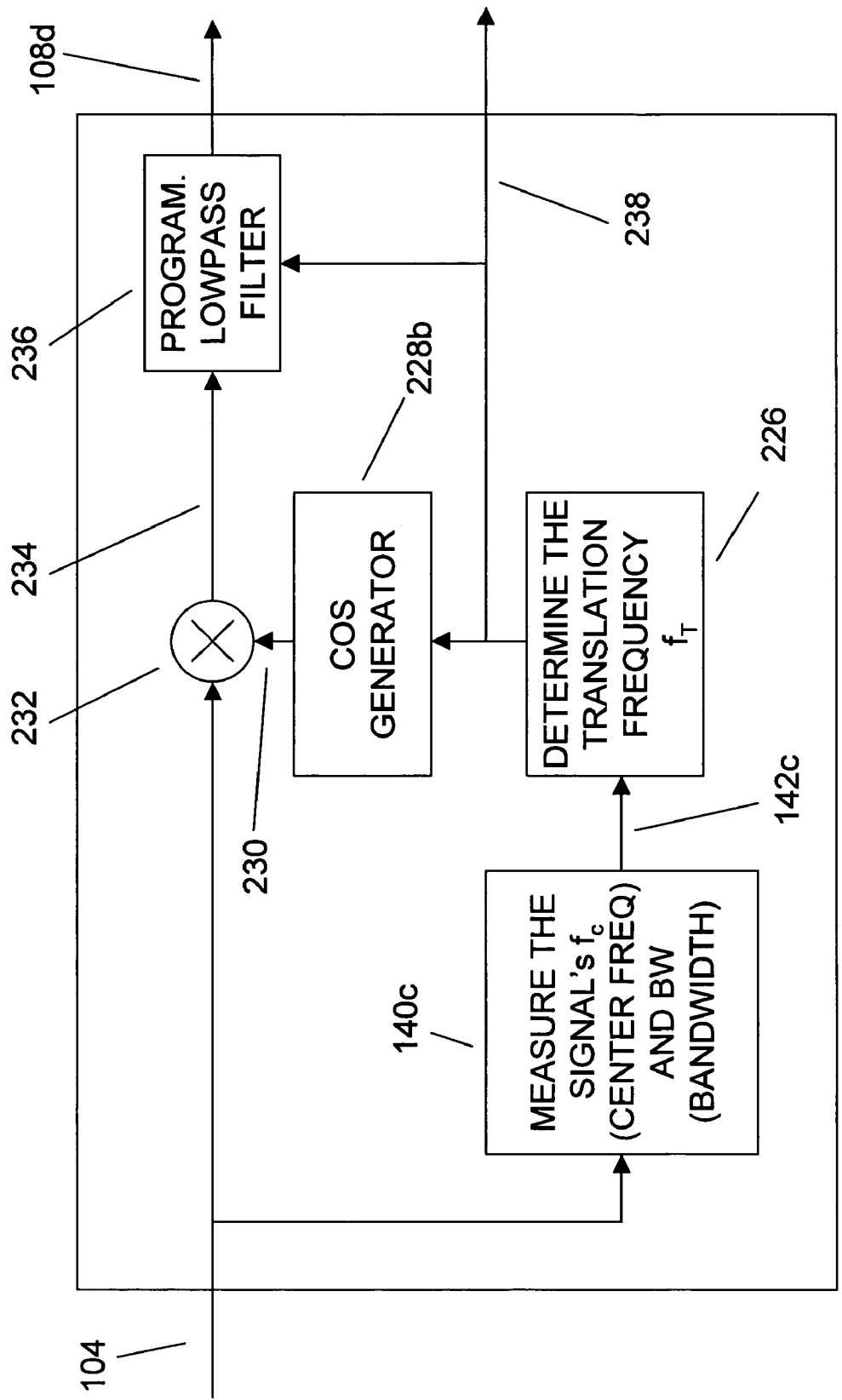

FIG. 27 shows an example of FIG. 7's adaptive frequency translation algorithm that lowers an input signal's center frequency by translating a real signal.

Figure 28:
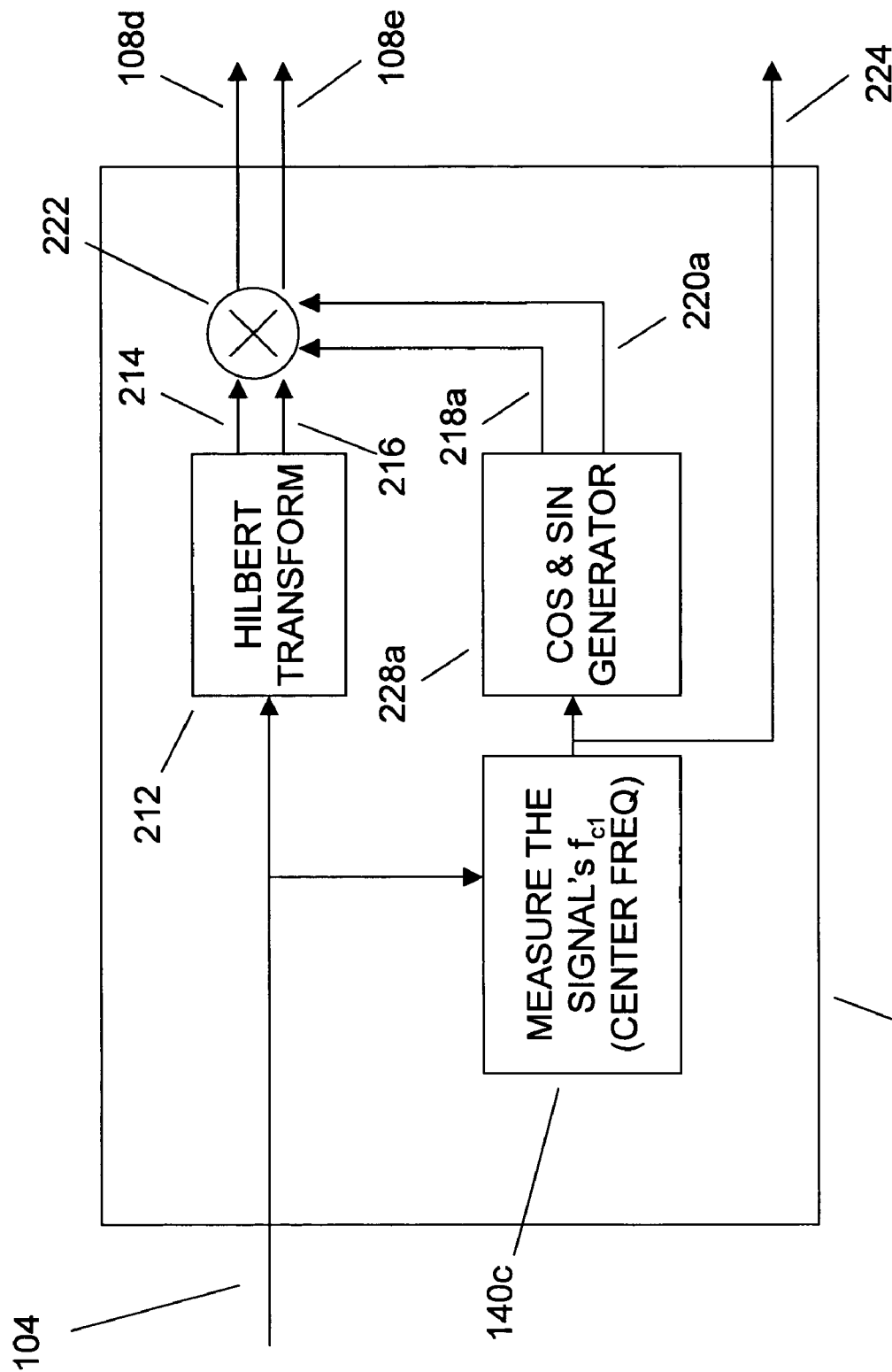

FIG. 28 shows an example of FIG. 7's adaptive frequency translation algorithm that lowers an input signal's center frequency by translating an analytic signal.

Figure 29:
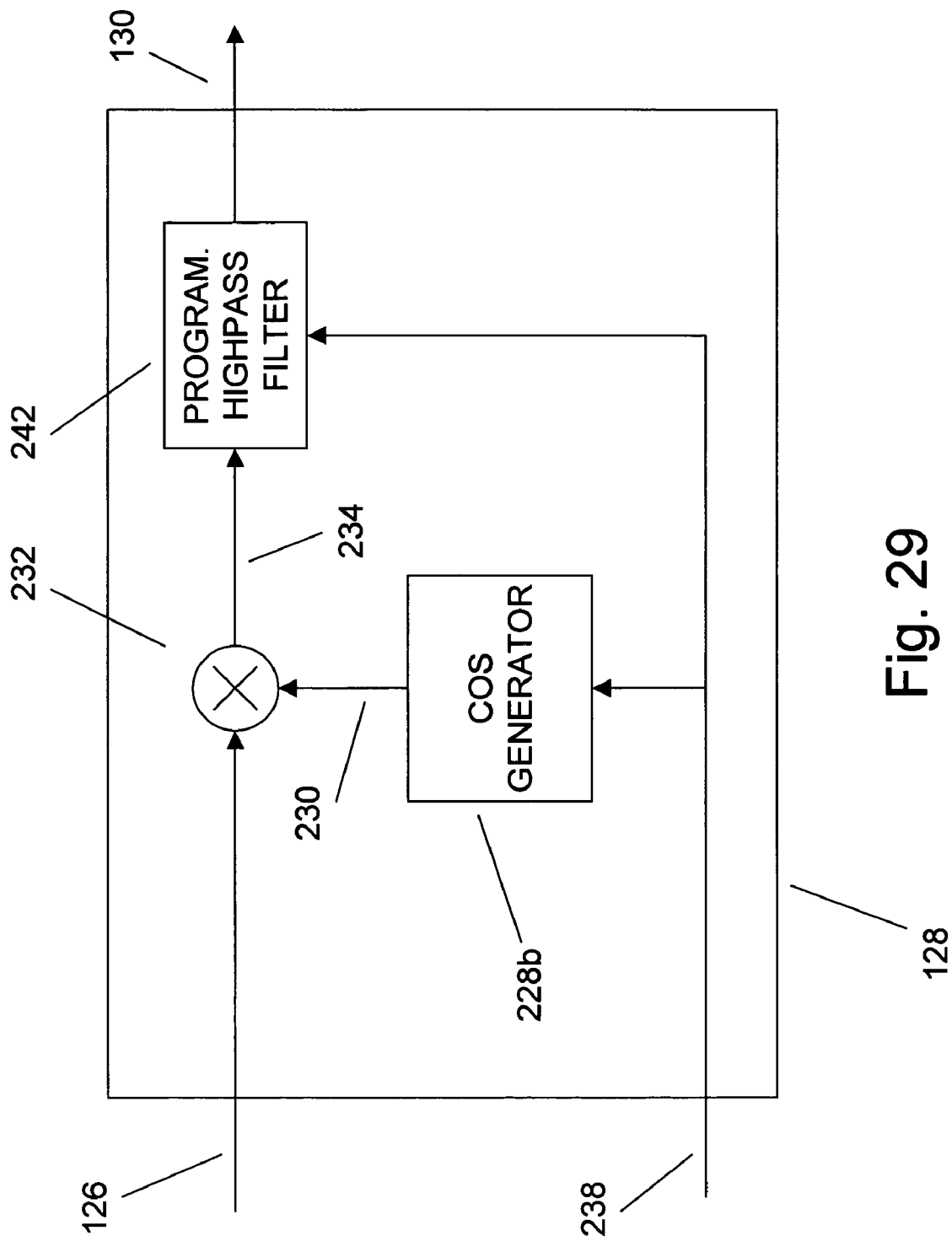

FIG. 29 shows a postprocessor that raises a real signal's center frequency back to its original center frequency, reversing the frequency lowering of FIG. 27.

Figure 30:
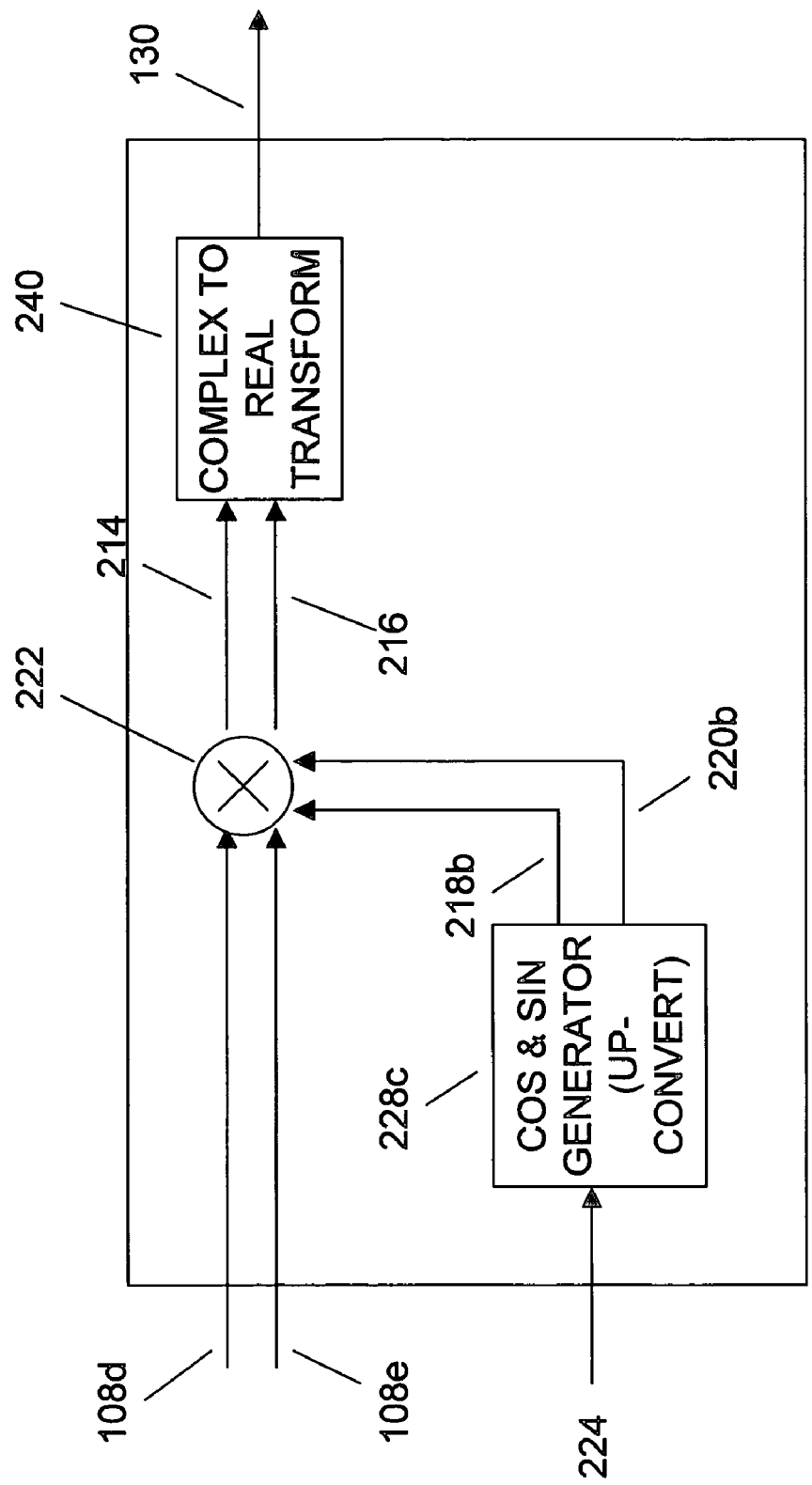

FIG. 30 shows a postprocessor that raises an analytic signal's center frequency back to its original center frequency, reversing the frequency lowering of FIG. 28.

Figure 31:
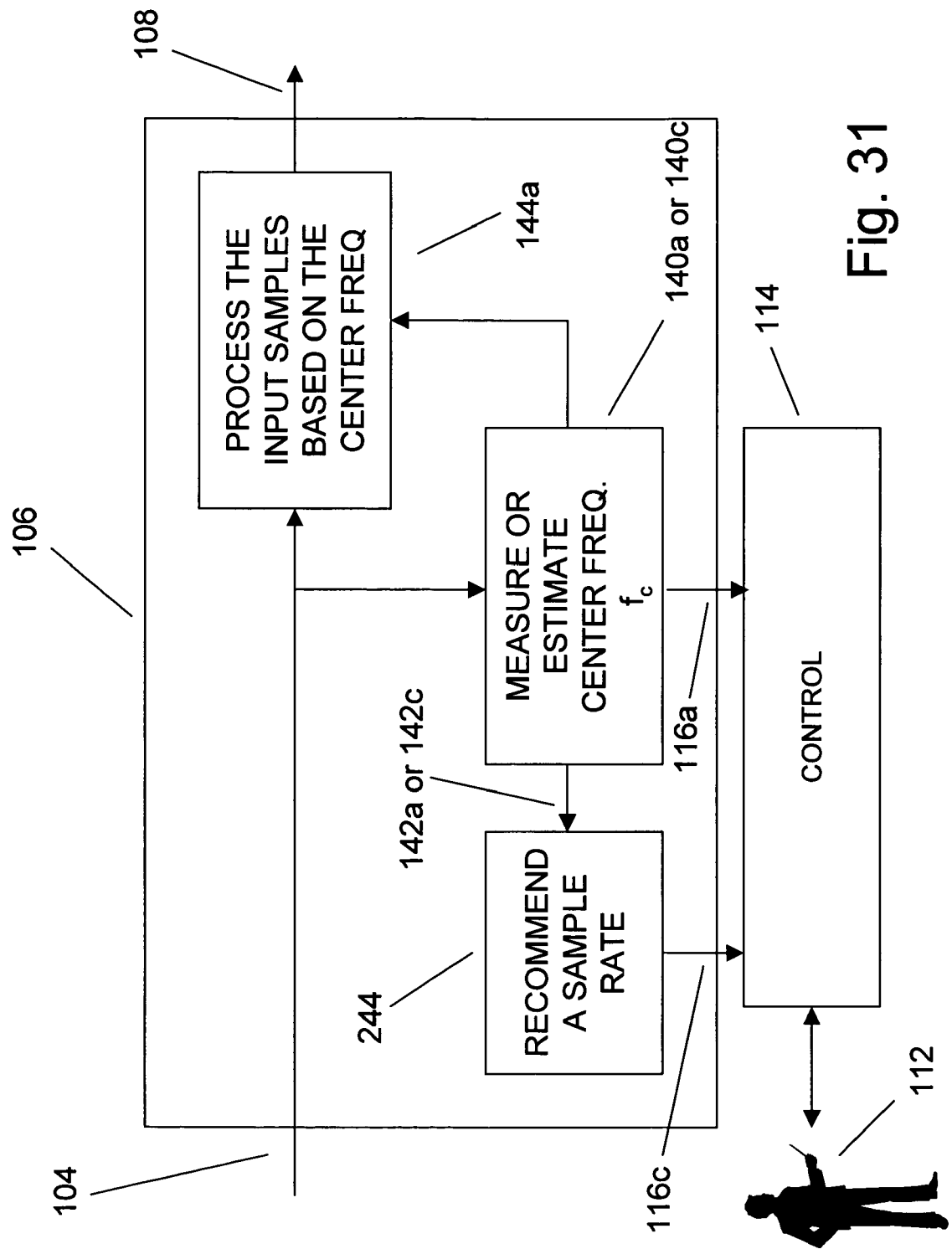

FIG. 31 shows a sample rate adjustment algorithm that recommends a change in sample rate to a control processor or to a user.

Figure 32:
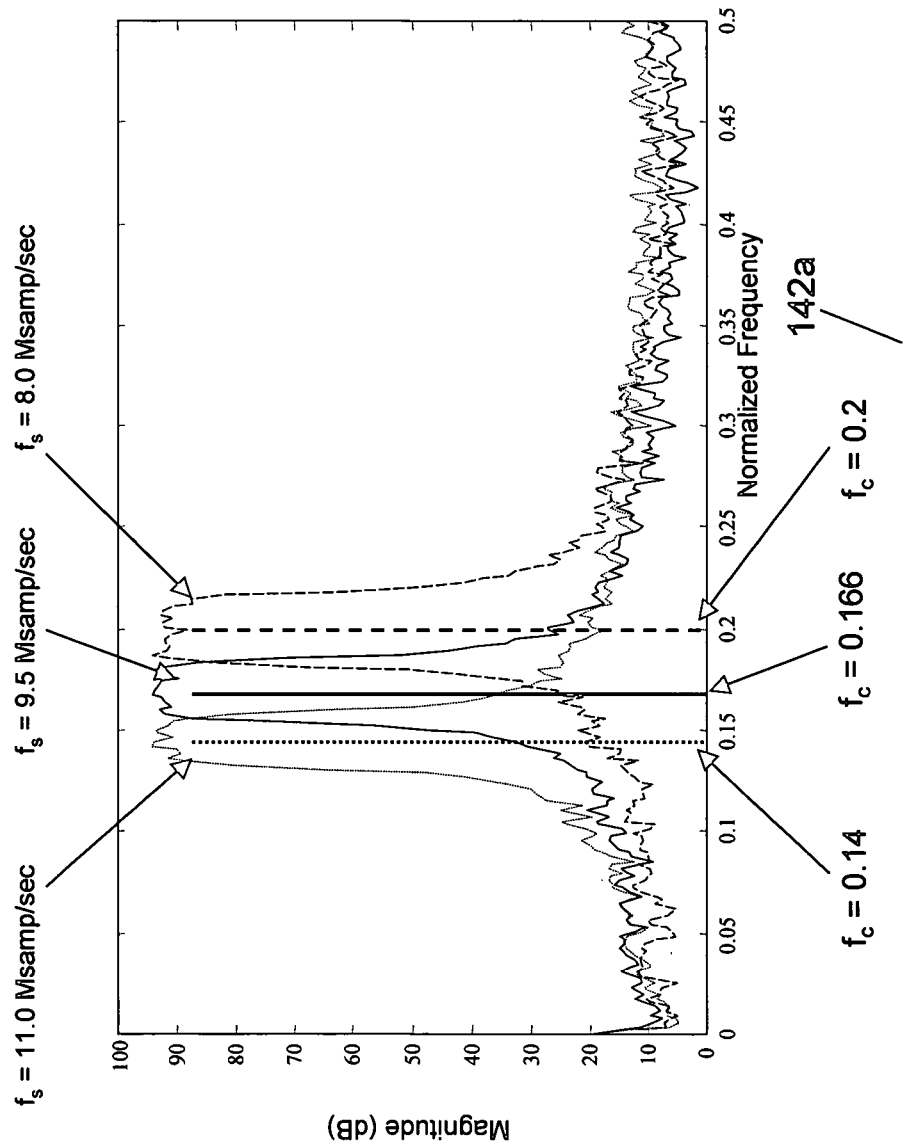

FIG. 32 provides three examples of how an analog signal's normalized center frequency changes with sampling rate.

Figure 33:
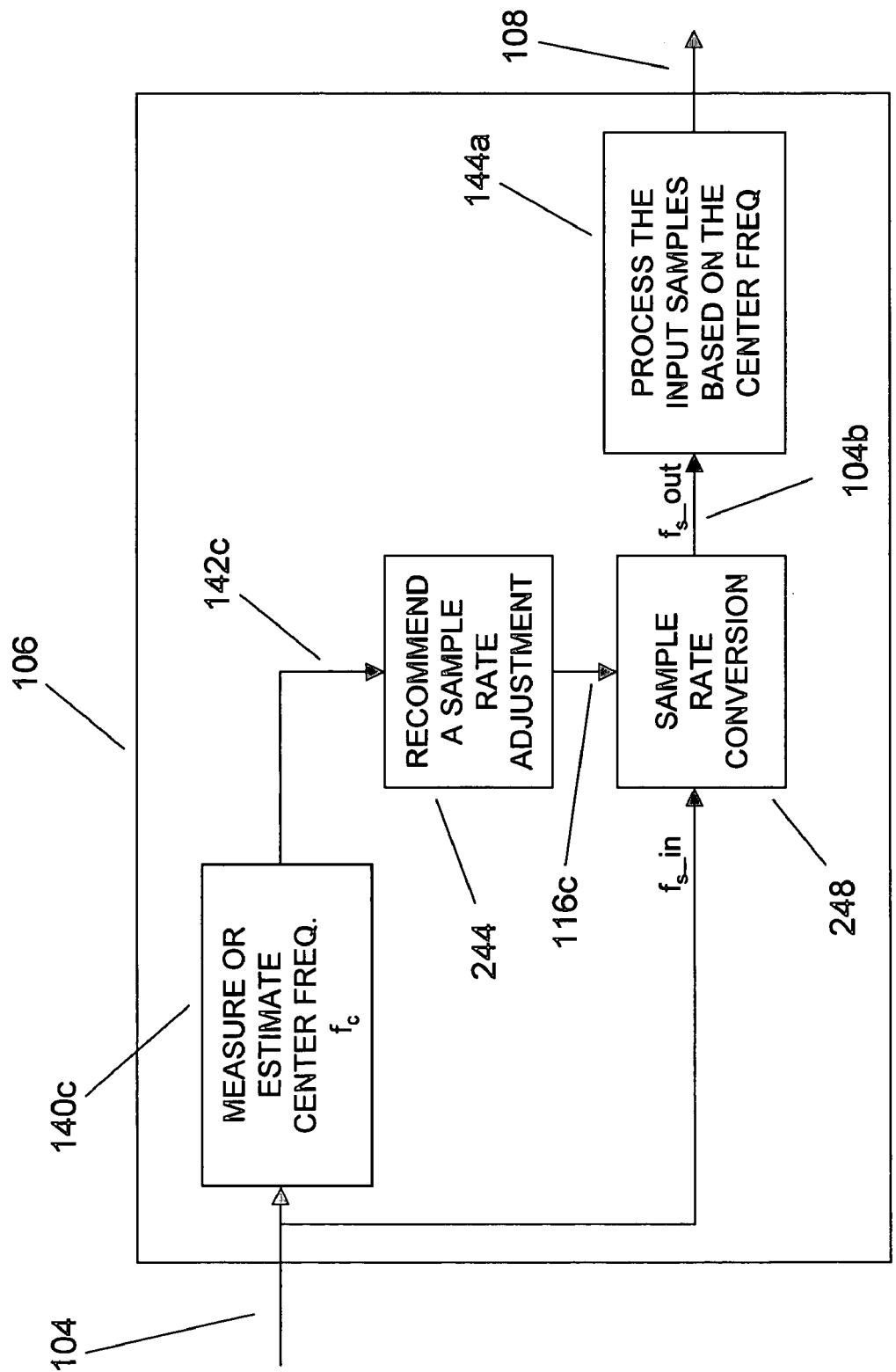

FIG. 33 shows a system where a recommended sample rate adjustment is used automatically to control a sample rate converter.

Figure 34:
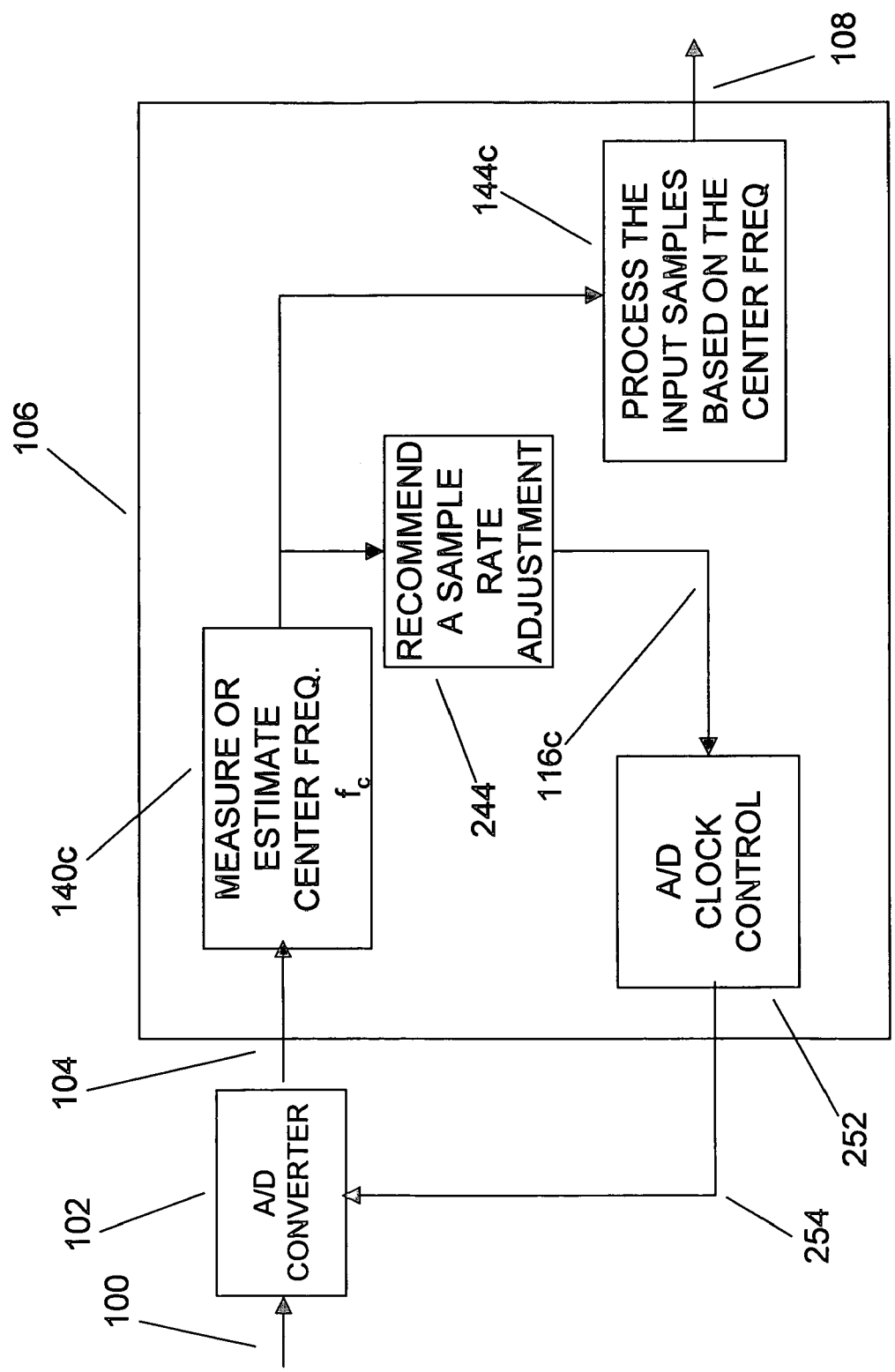

FIG. 34 shows a system where a recommended sample rate adjustment is used automatically to control the sample clock of an A/D converter.

Figure 35:
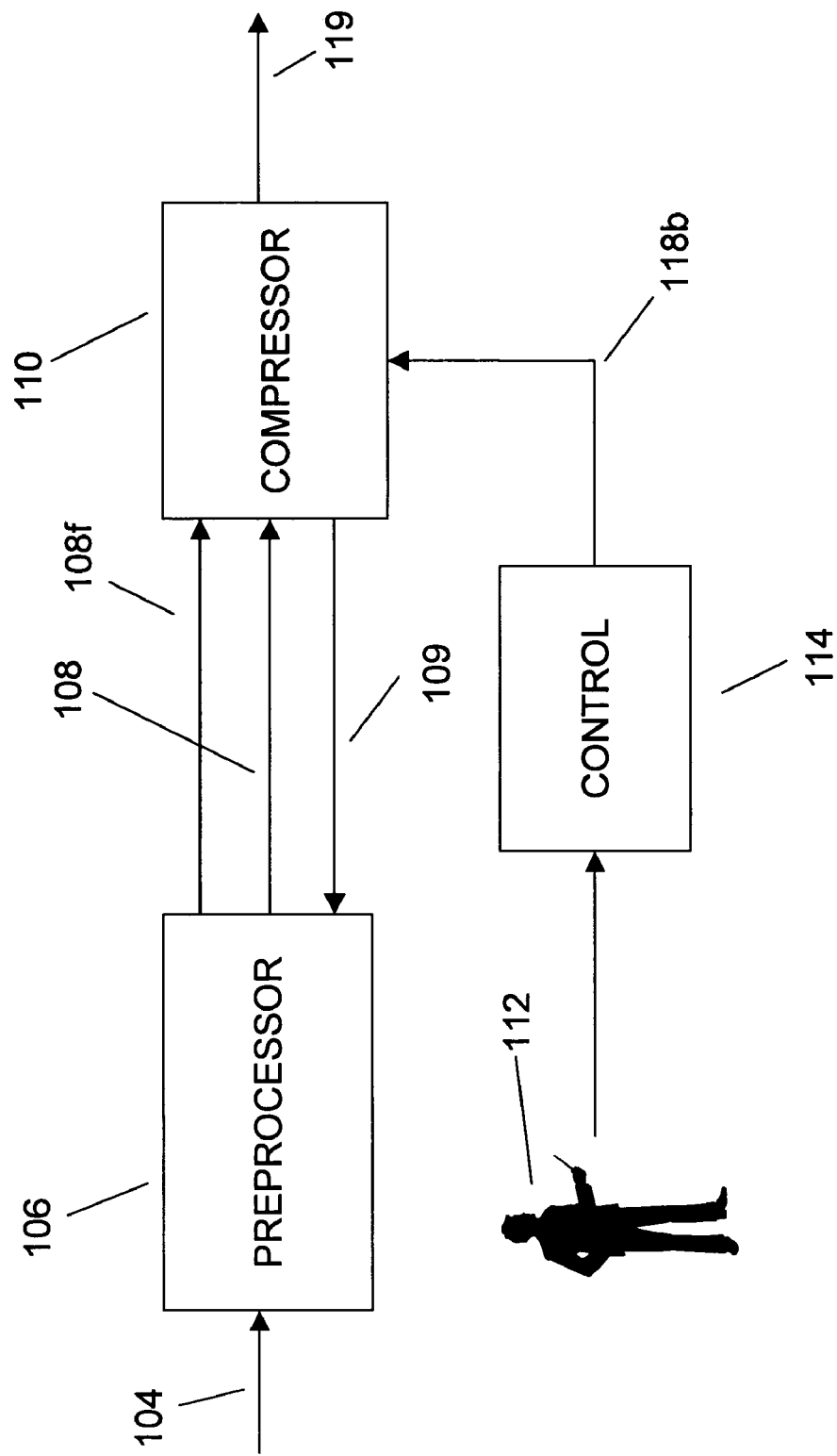

FIG. 35 shows how a preprocessor and a compressor interact to achieve a desired compression ratio.

Figure 36:
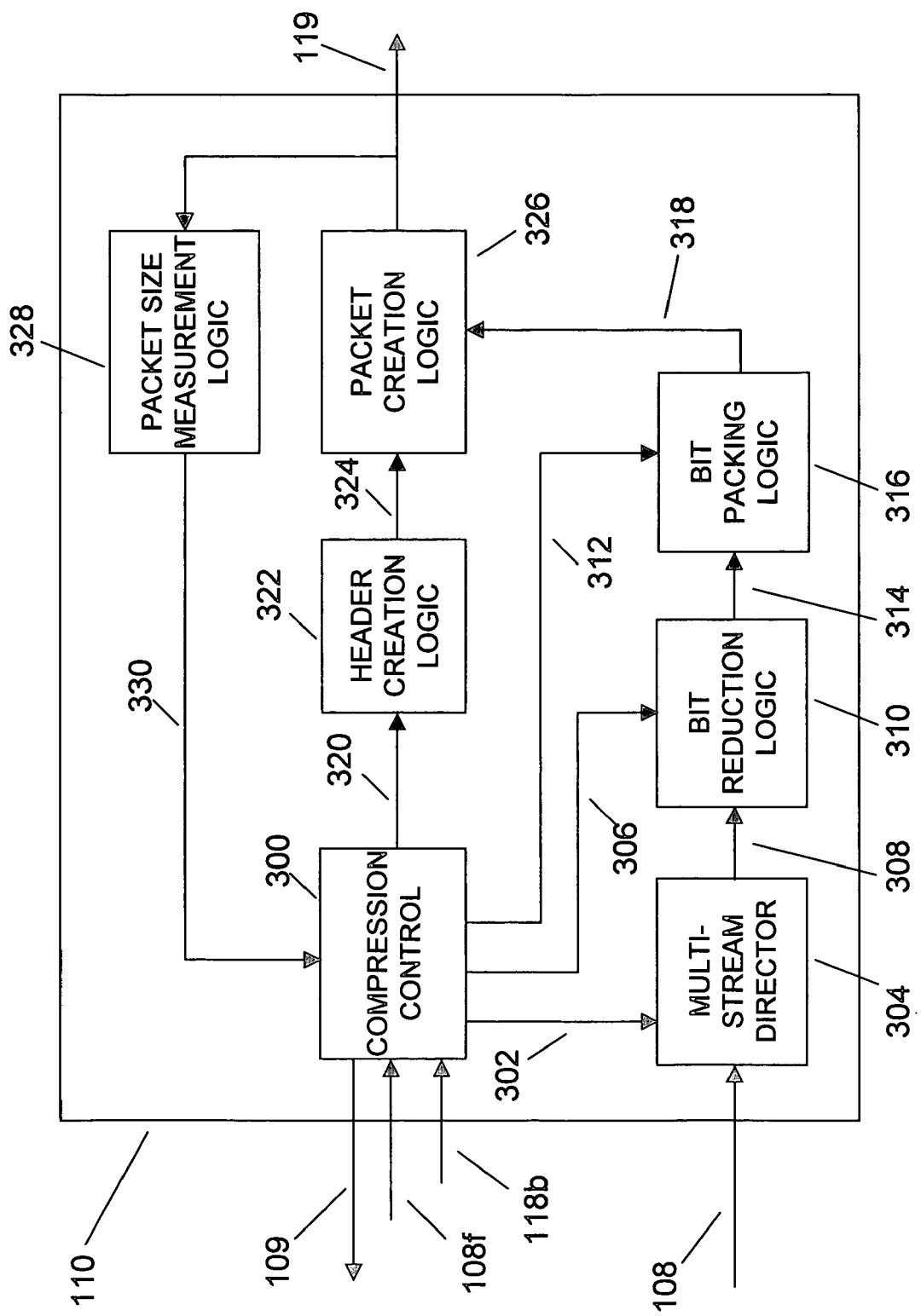

FIG. 36 provides details about compressor components in FIG. 35's adaptive compression system.

Figure 37:
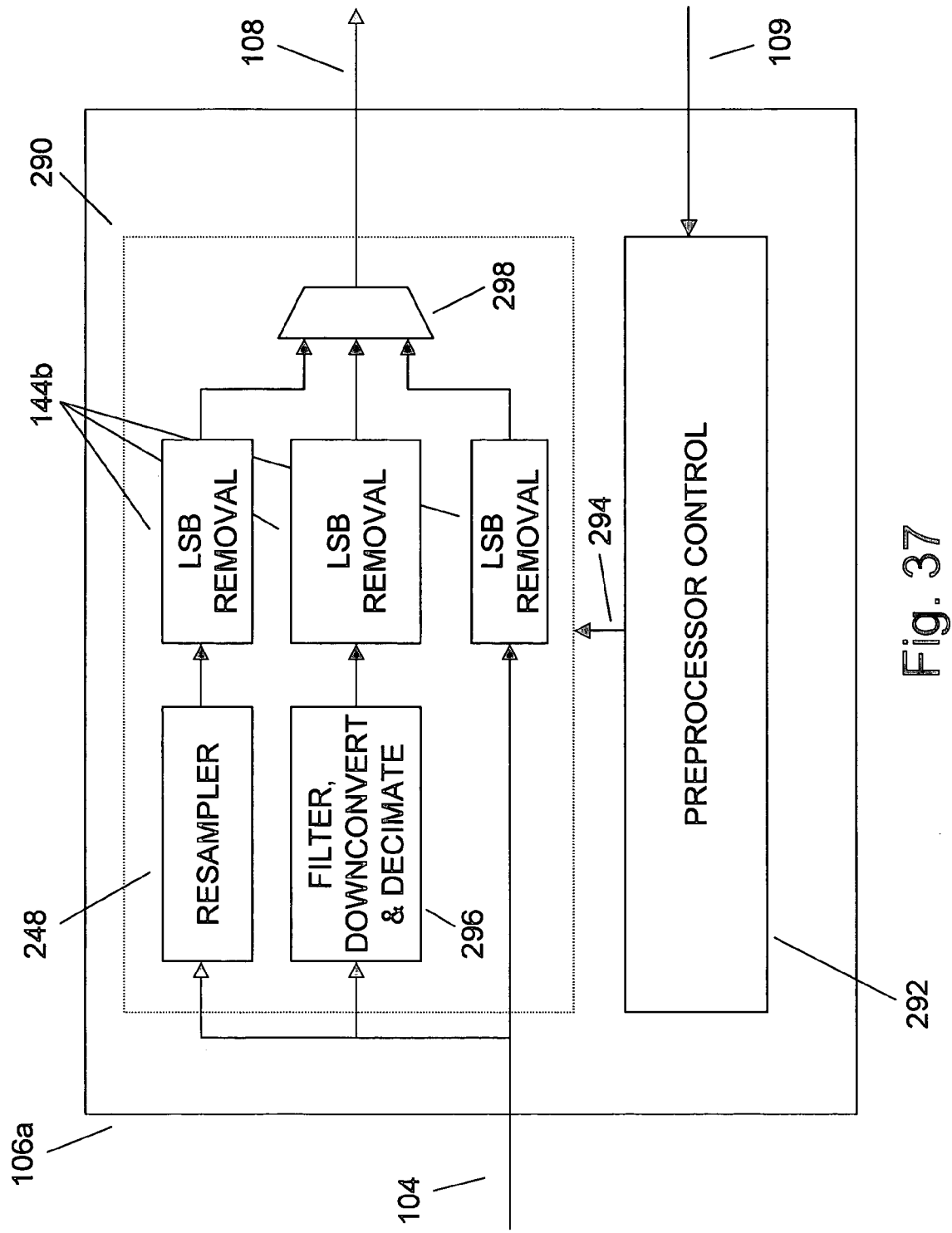

FIG. 37 provides details about preprocessor components in FIG. 35's adaptive compression system.

Figure 1:
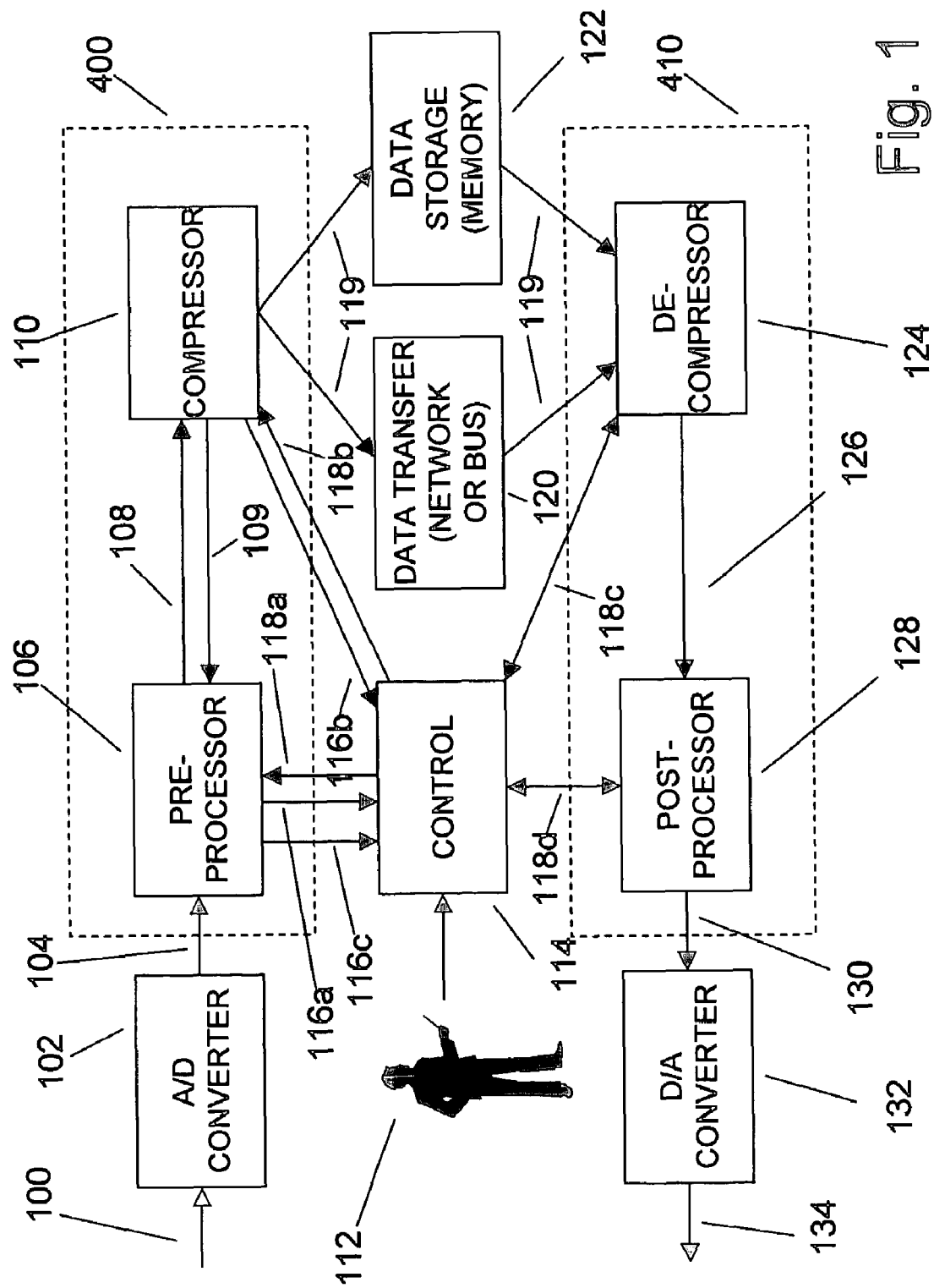
FIG. 1 shows an overview of the efficient, sampled analog data compression and decompression method implemented by the present invention.
Figure 38:
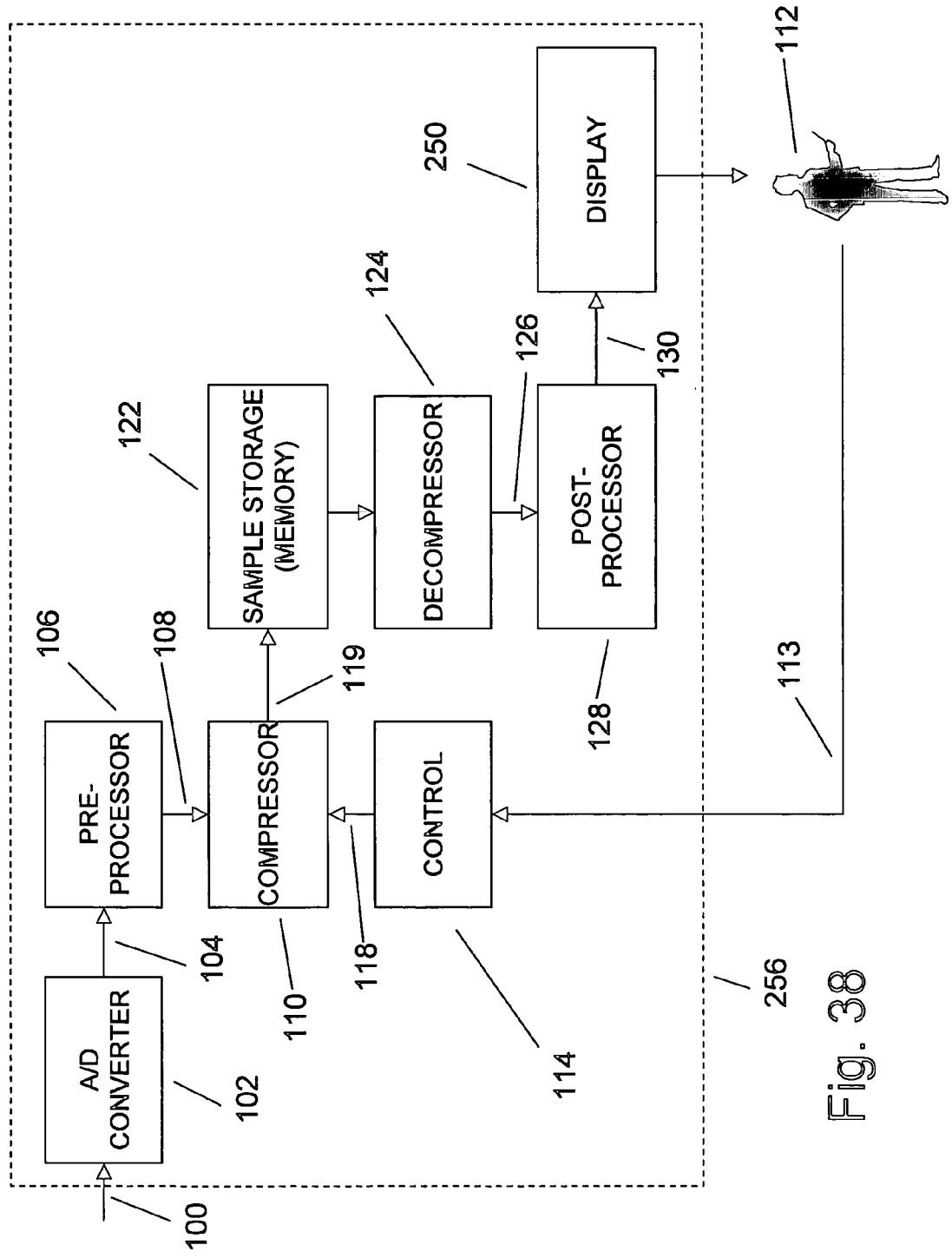

FIG. 38 demonstrates the use of FIG. 1's efficient compression and decompression methods in an oscilloscope application.

Figure 39:
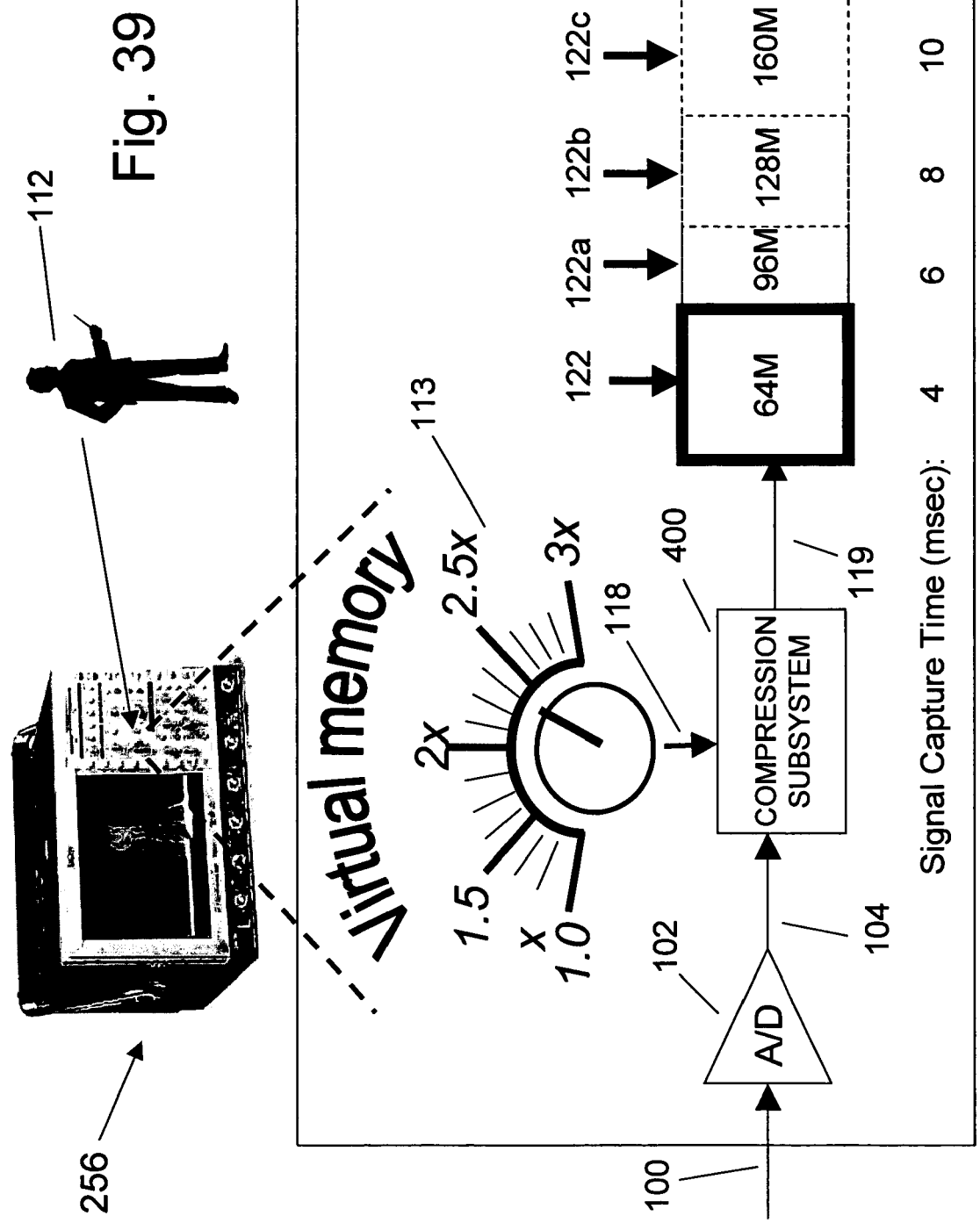

FIG. 39 shows how an oscilloscope user would use FIG. 38's compression control to increase the effective amount of capture memory.

Figure 40:
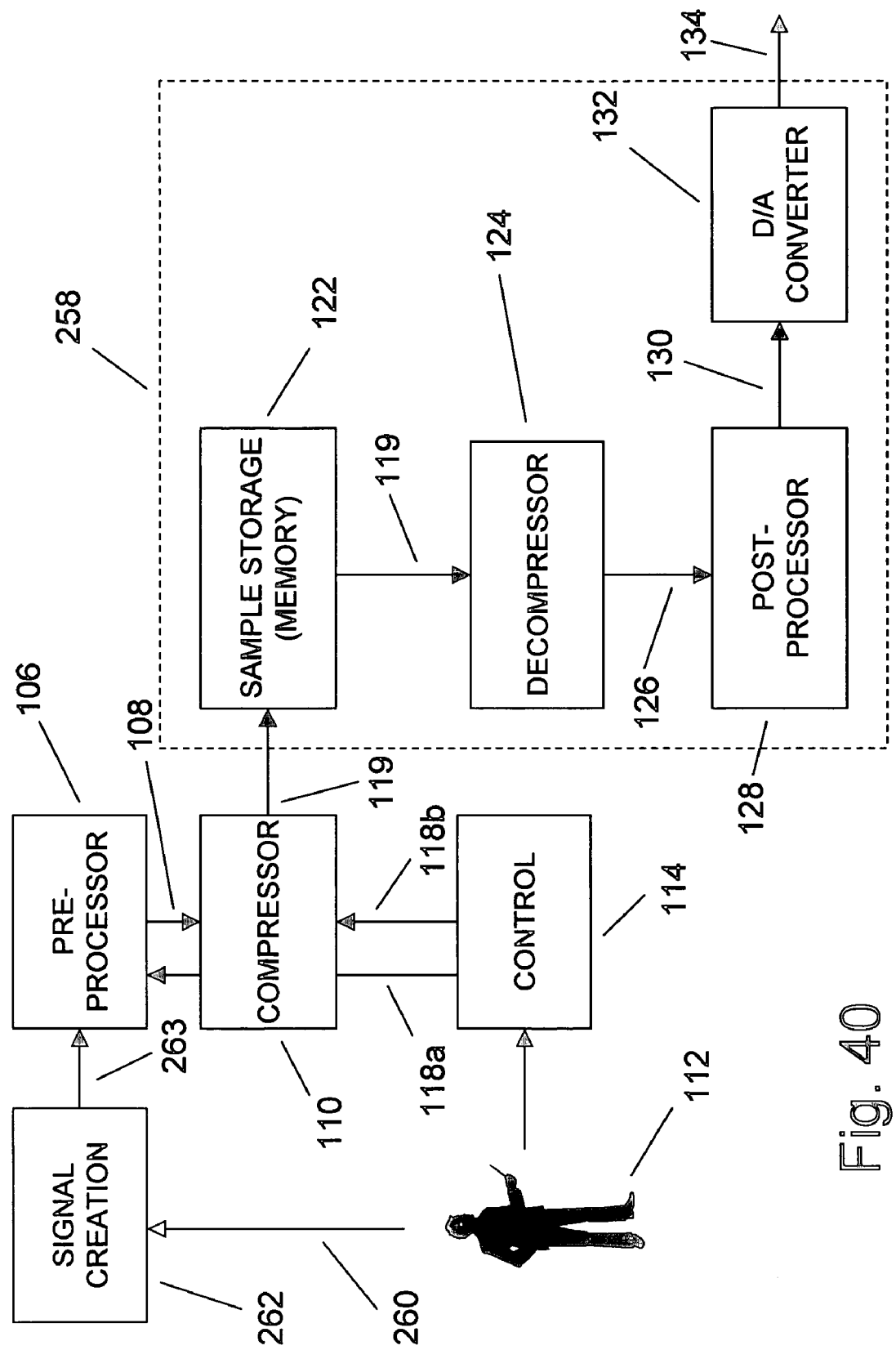

FIG. 40 shows the use of FIG. 1's efficient compression and decompression methods in a signal generator application.

Figure 41:
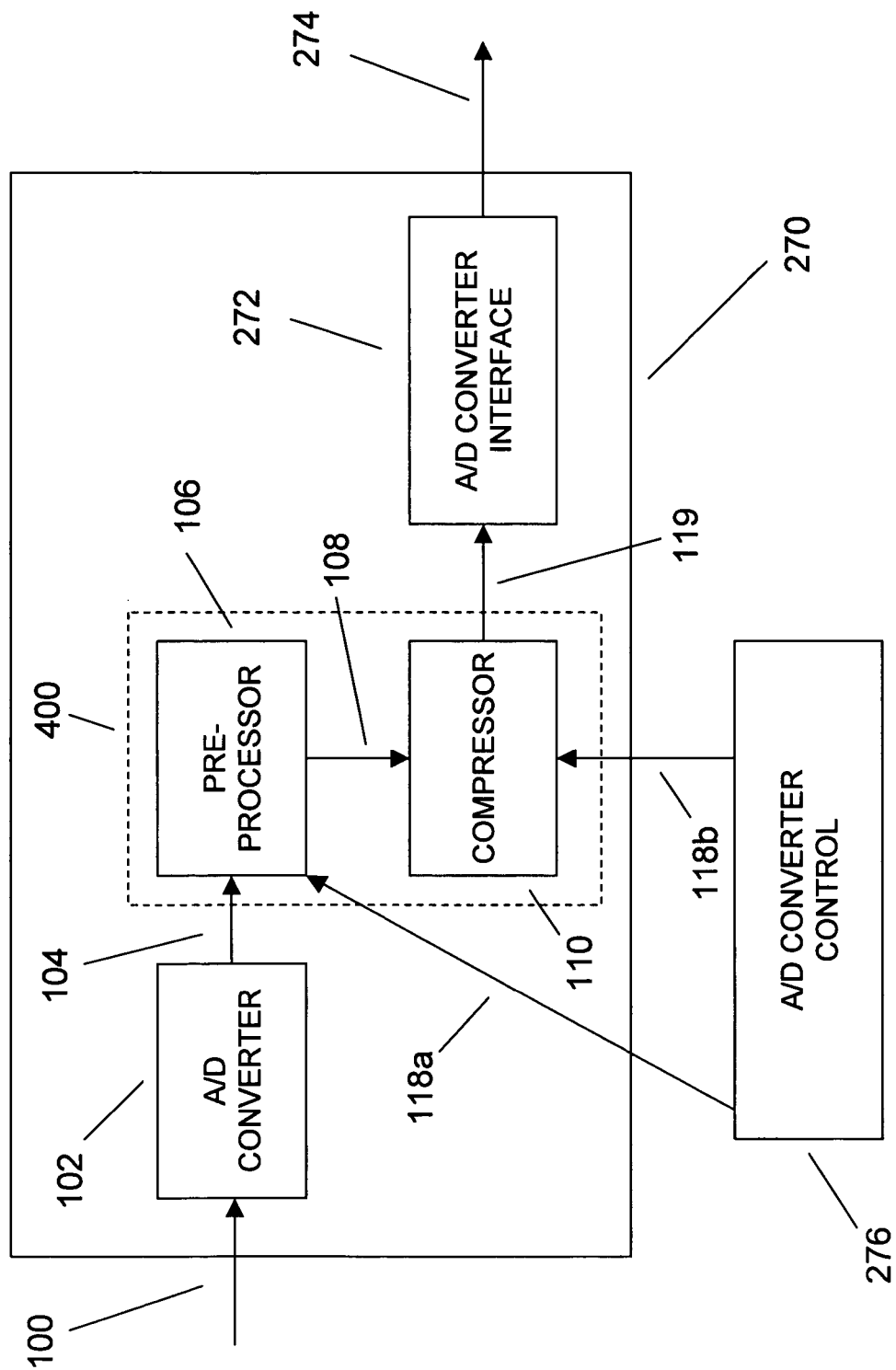

FIG. 41 shows the use of FIG. 1's preprocessor and compressor ed in an enhanced analog-to-digital (A/D) converter.

Figure 42:
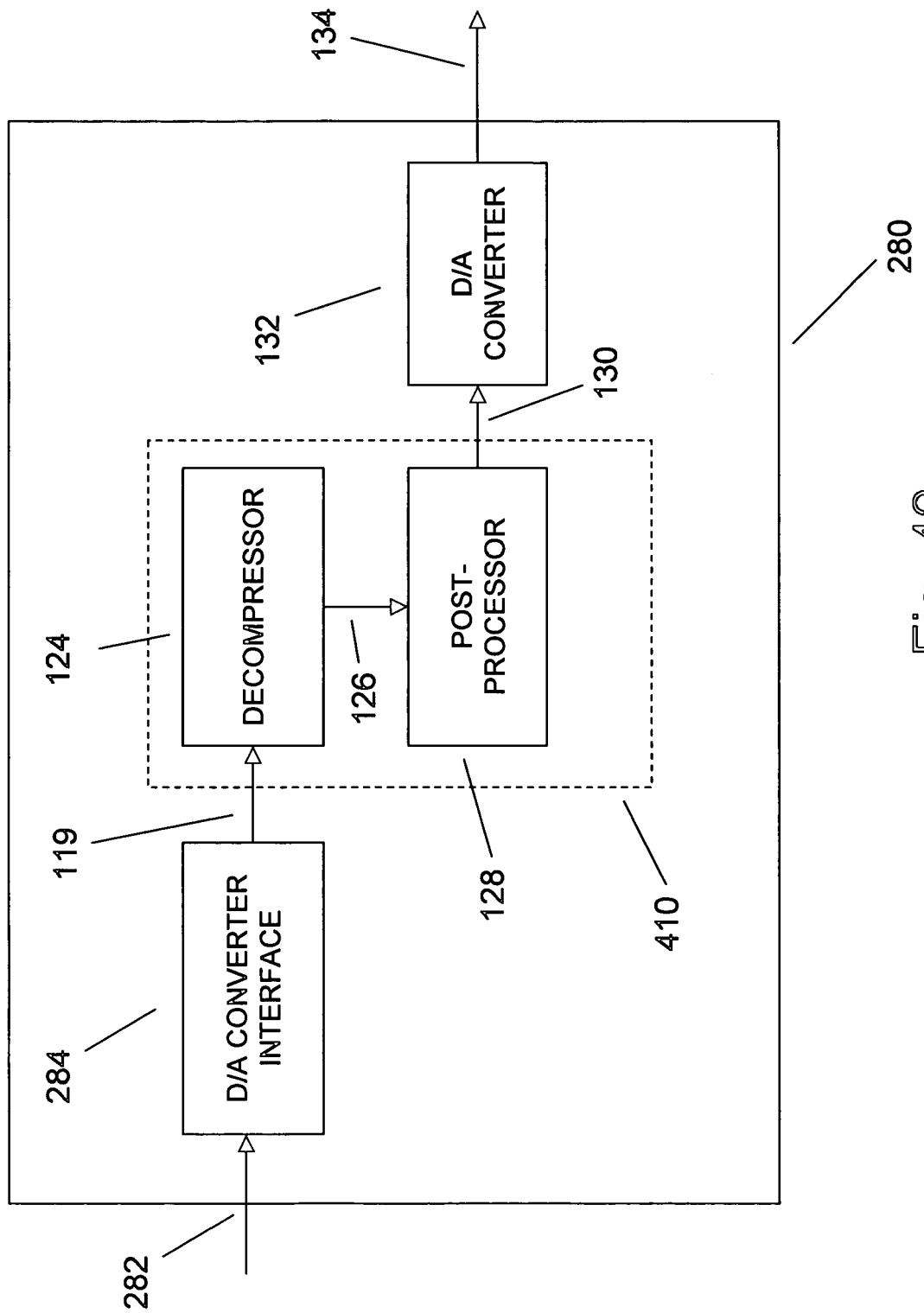

FIG. 42 shows the use of FIG. 1's decompressor and postprocessor in an enhanced digital-to-analog (D/A) converter.

Figure 43:
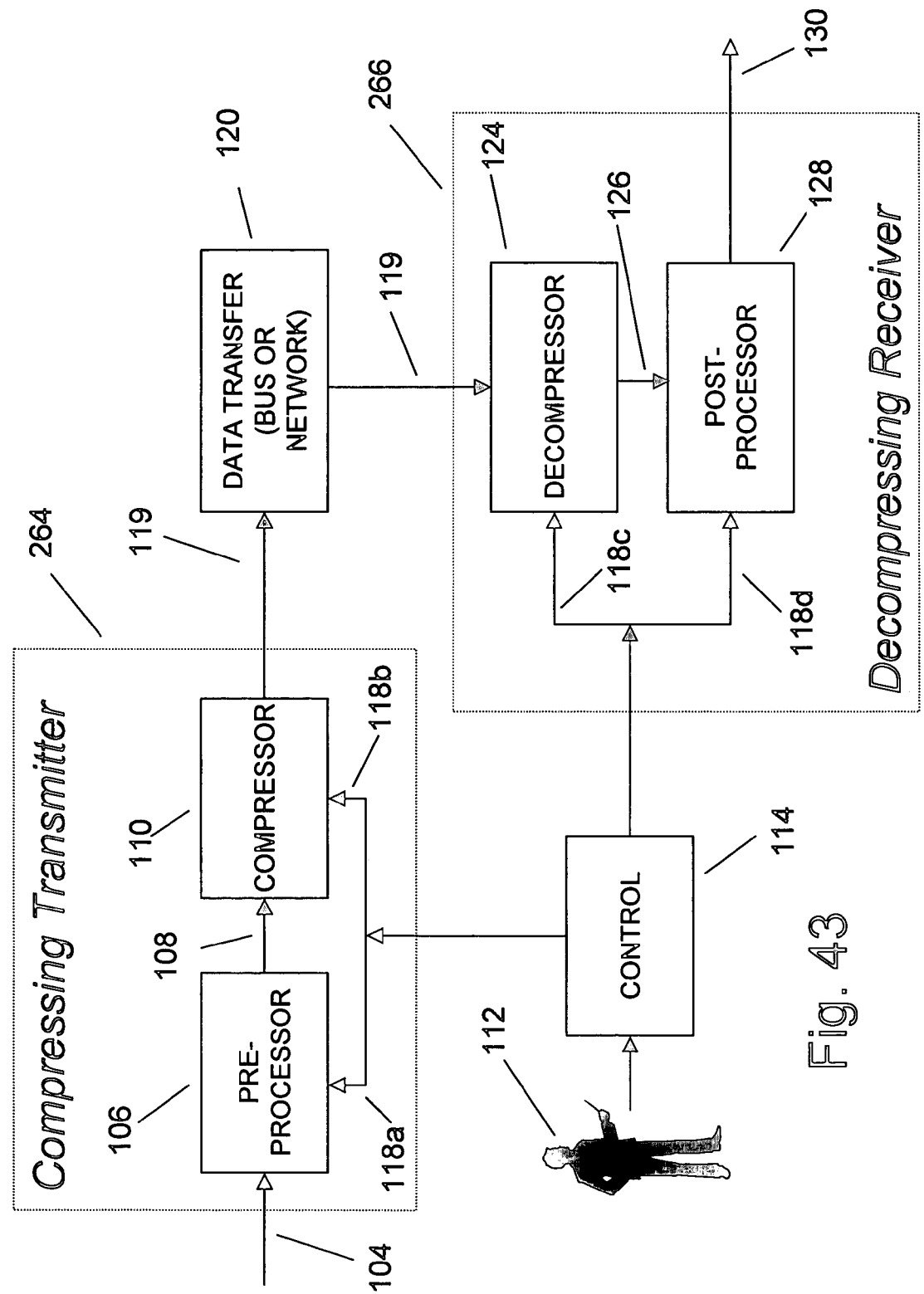

FIG. 43 shows the use of FIG. 1's compression and decompression methods being used in a unidirectional bus or network transfer application.

Figure 44:
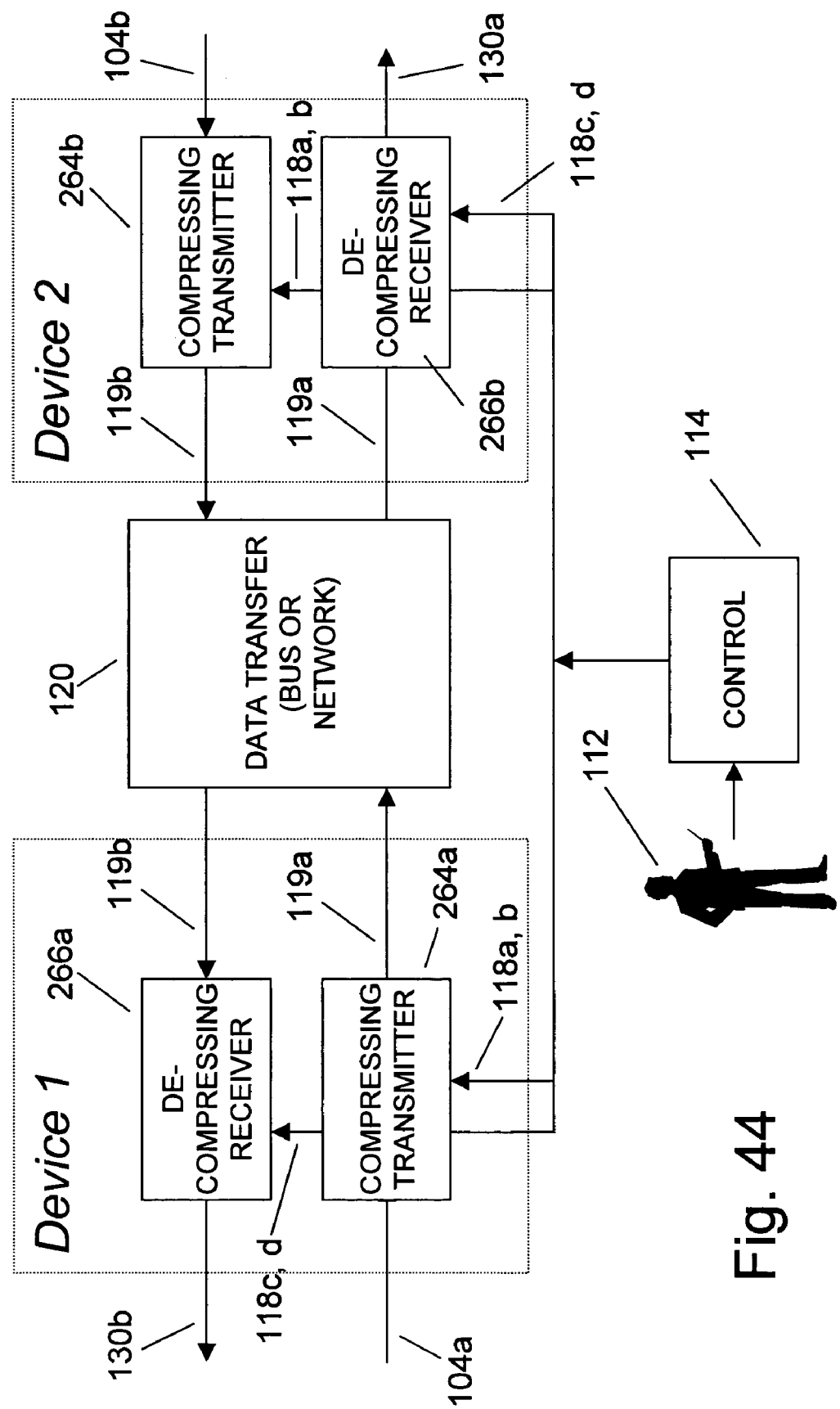

FIG. 44 shows the use of FIG. 1's compression and decompression methods being used in a bi-directional bus or network transfer application.

Figure 45:
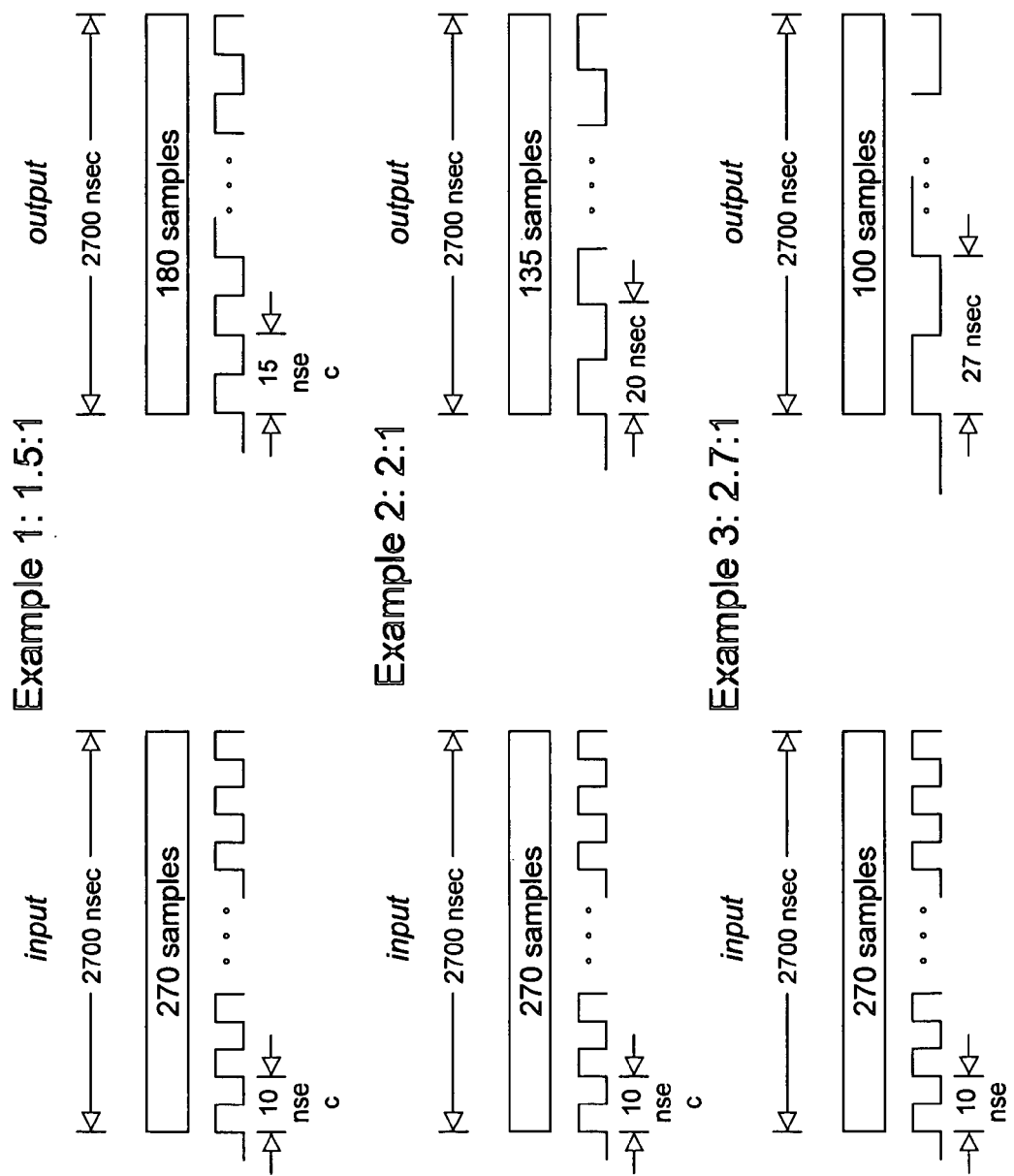

FIG. 45 shows how the clock rate used to store or to transfer compressed packets can be reduced to exactly match a user-specified compression ratio.

Figure 46:
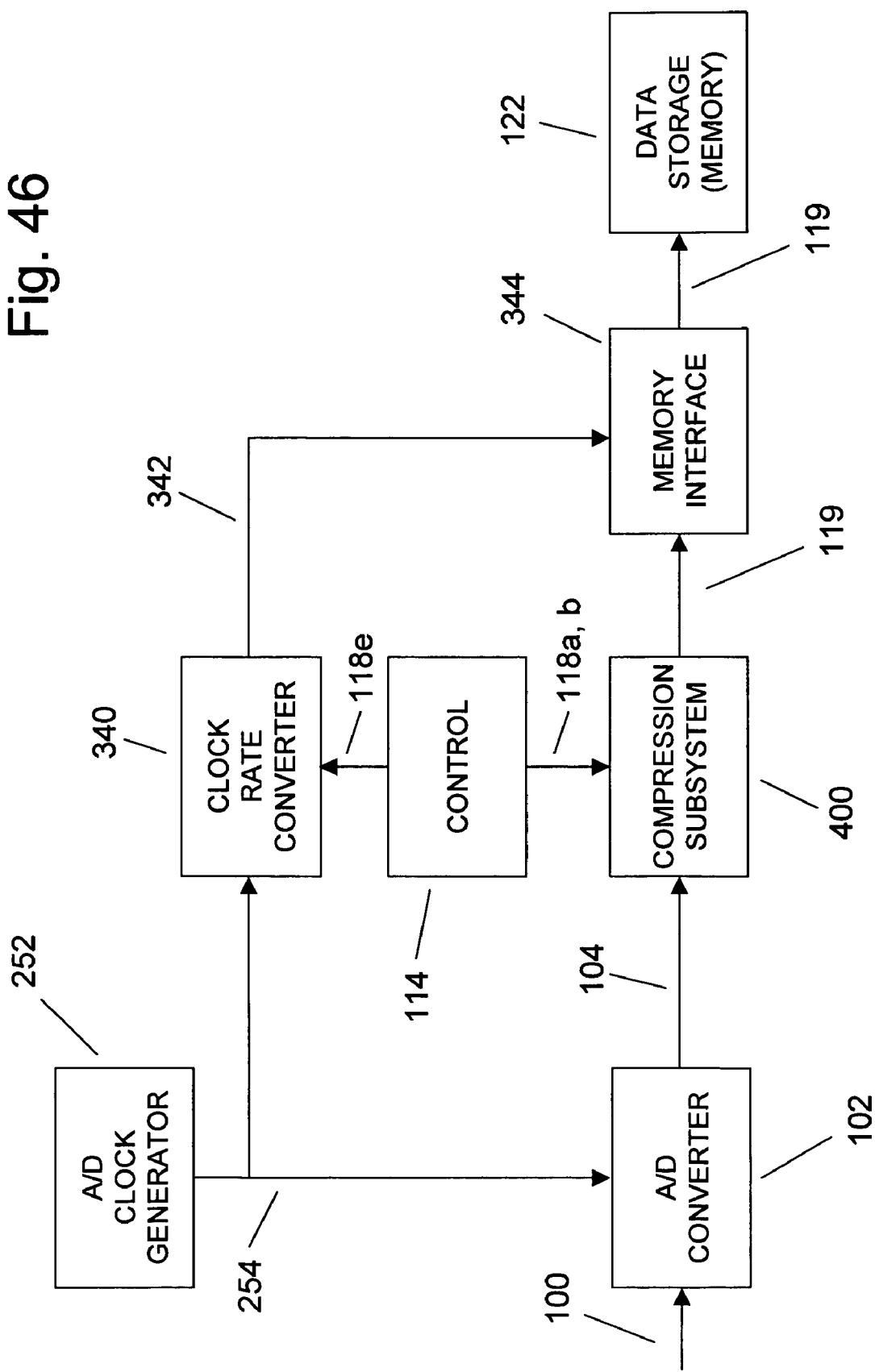

FIG. 46 shows how the present invention can be coupled with a clock rate converter to provide a memory interface for the compressed signal that operates at a lower clock rate.

Figure 47:
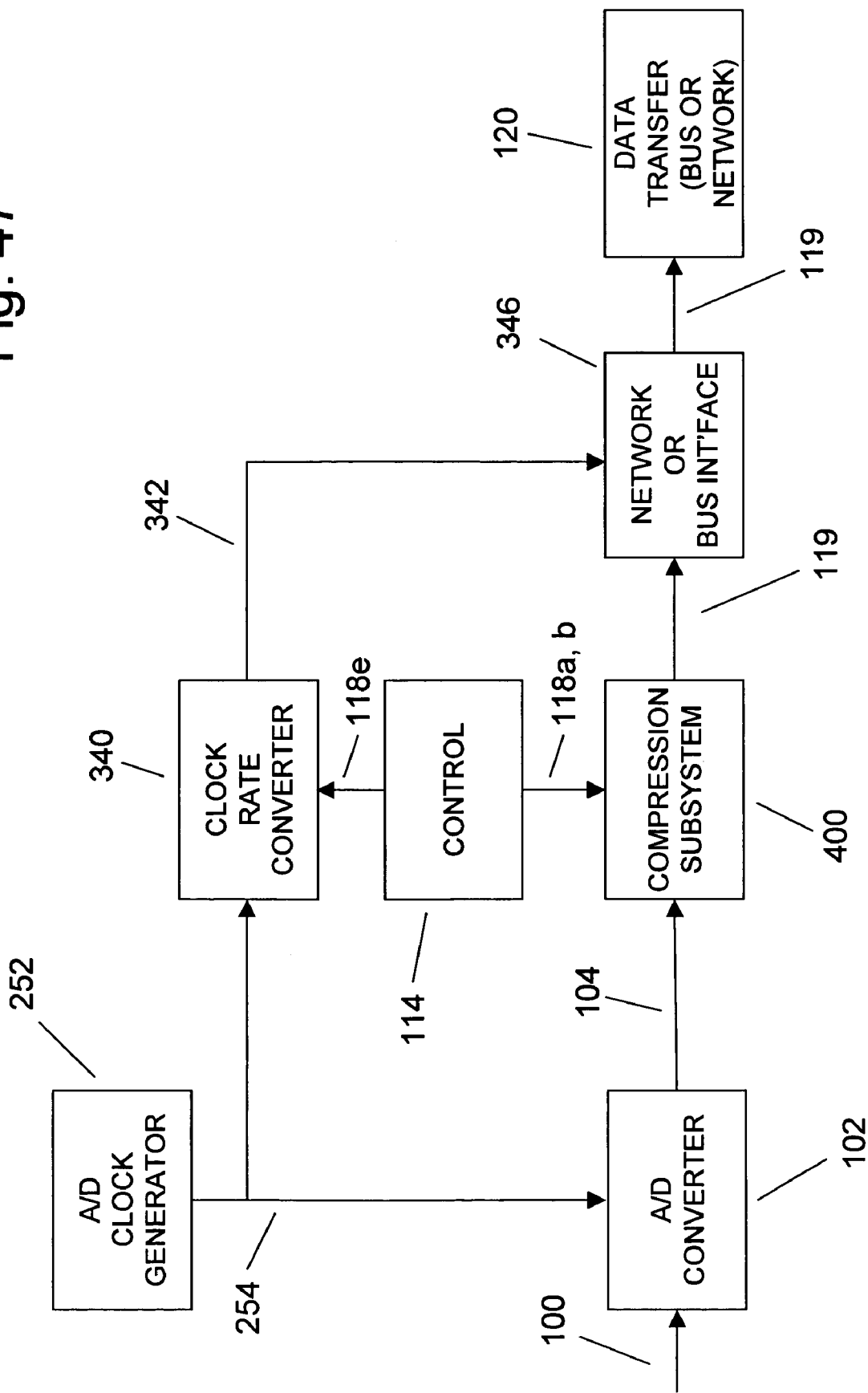

FIG. 47 shows how the present invention can be coupled with a clock rate converter to provide a network or bus interface for the compressed signal that operates at a lower clock rate.

Figure 48:
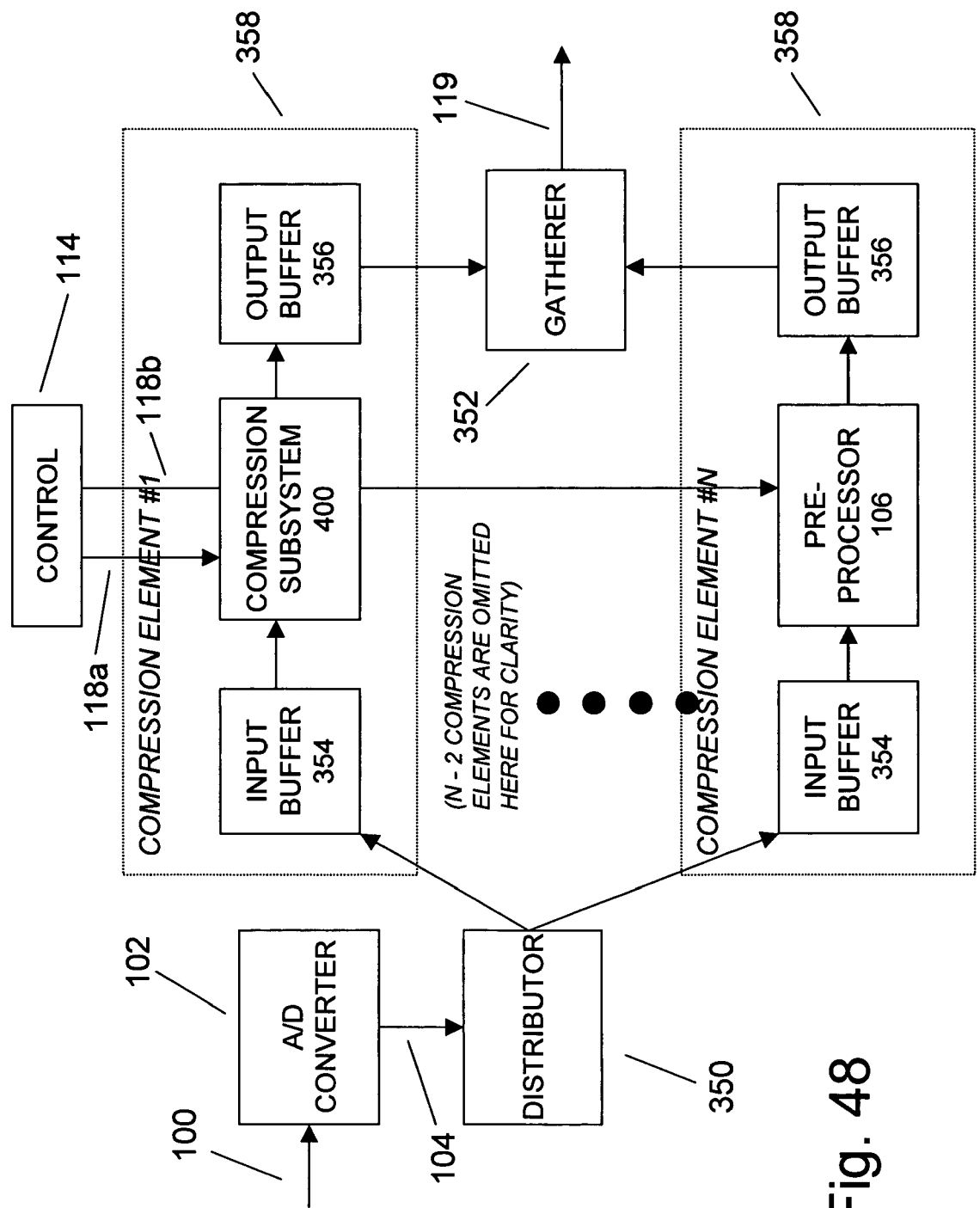

FIG. 48 shows how multiple compression subsystems simultaneously operate to compress sampled data at increased sampling rates.

Figure 49:
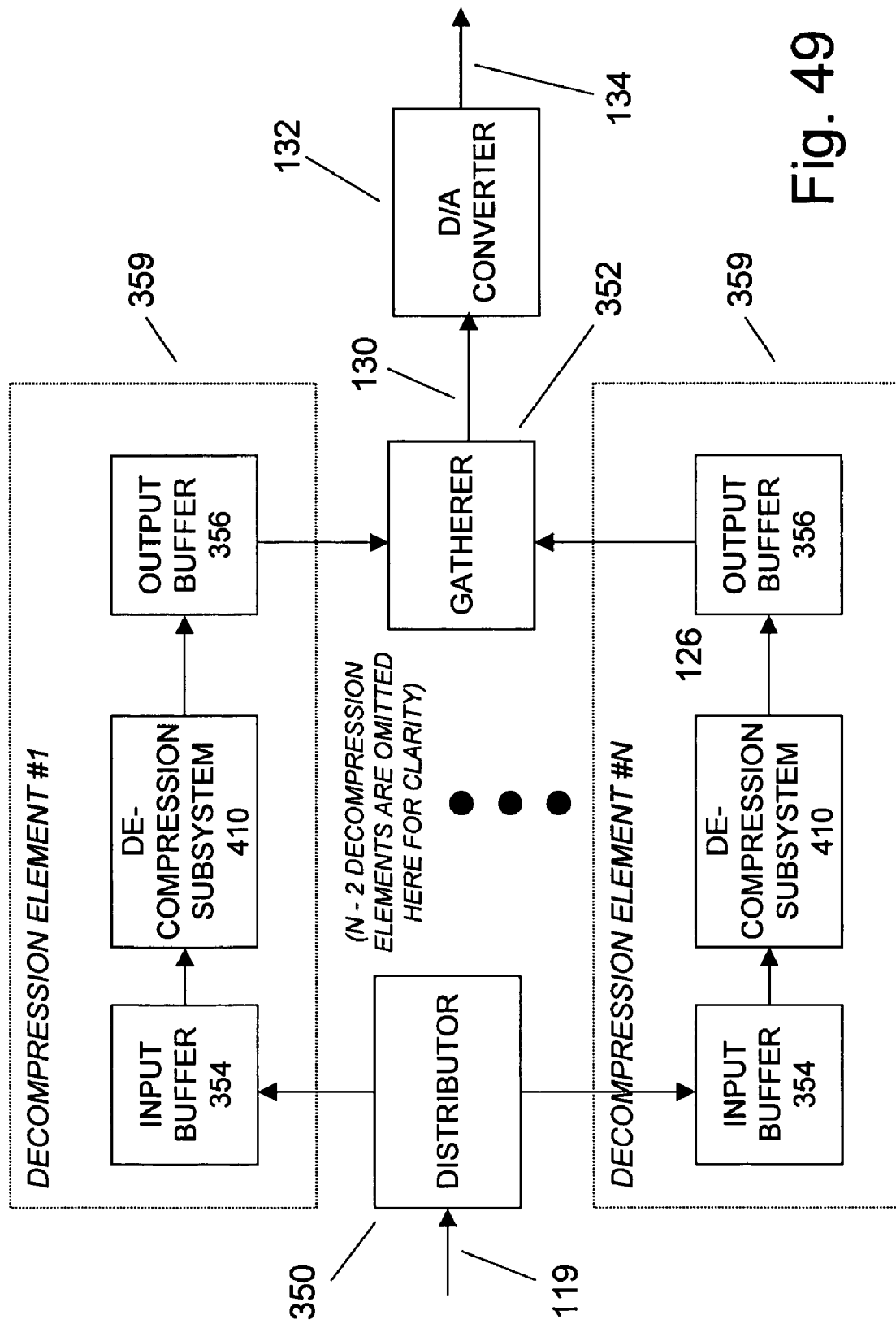

FIG. 49 shows how multiple decompression subsystems simultaneously operate to decompress compressed packets that represent sampled analog signals at increased sampling rates.

| 6.0 List of Reference Numerals | |
|---|---|
| 100 | analog input signal |
| 102 | analog-to-digital (A/D) converter |
| 104 | sampled input signal |
| 104b | resampled input signal |
| 106 | preprocessor |
| 106a | preprocessor with compressor feedback |
| 108 | preprocessed signal |
| 108a | preprocessed signal (subset 1) |
| 108b | preprocessed signal (subset 2) |
| 108c | preprocessed signal (subset 3) |
| 108d | preprocessed real signal |
| 108e | preprocessed imaginary signal |
| 108f | preprocessor control parameter |
| 109 | compressor-to-preprocessor coupling signal |
| 110 | compressor |
| 112 | user |
| 113 | user-selected compression control |
| 114 | control block |
| 116a | preprocessor measurement(s) or estimate(s) |
| 116b | compressor measurement(s) or estimate(s) |
| 116c | recommended sample rate |
| 118 | control parameter(s) |
| 118a | preprocessor control parameter(s) |
| 118b | compressor control parameter(s) |
| 118c | decompressor control parameter(s) |
| 118d | postprocessor control parameter(s) |
| 118e | clock rate converter control parameter(s) |
| 119 | compressed/encoded signal |
| 120 | data transfer logic |
| 122 | data storage logic |
| 122a | virtual memory, 1.5:1 setting |
| 122b | virtual memory, 2:1 setting |
| 122c | virtual memory, 2.5:1 setting |
| 124 | decompressor |
| 126 | decompressor output signal |
| 126a | decompressed real signal |
| 126b | decompressed imaginary signal |
| 128 | postprocessor |
| 129 | inverter output signal |
| 129a | inverter output signal (subset 1) |

-continued 6.0 List of Reference Numerals

| | |
|---|---|
| 129b | inverter output signal (subset 2) |
| 129c | inverter output signal (subset 3) |
| 130 | postprocessed signal |
| 132 | digital-to-analog (D/A) converter |
| 134 | analog output signal |
| 140 | preprocessor parameter measurement/estimation logic |
| 140a | signal period measurement/estimation logic |
| 140b | noise floor measurement/estimation logic |
| 140c | center frequency and bandwidth measurement/estimation logic |
| 142 | preprocessor parameter measurements/estimates |
| 142a | period estimate |
| 142b | noise floor estimate |
| 142c | center frequency and bandwidth estimates |
| 142d | signal level estimate |
| 142e | signal-to-noise ratio estimate |
| 144 | parameter-controlled preprocessor logic |
| 144a | re-ordering and inversion logic |
| 144b | bit removal logic |
| 144c | frequency translation logic |
| 144d | fractional bit removal logic |
| 146 | frequency selection logic |
| 150 | frequency transformation logic |
| 151 | signal spectrum |
| 152 | centroid calculation logic |
| 154 | center frequency measurement/estimate |
| 156 | reciprocal function |
| 160 | zero crossing measurement logic |
| 161 | zero crossing durations |
| 162 | zero crossing averaging logic |
| 164 | zero crossing accumulator |
| 166 | zero crossing event counter |
| 168 | event counter threshold |
| 169 | averager |
| 170 | demultiplexer and inverter control selection logic |
| 172 | demultiplexer control logic |
| 174 | demultiplexer |
| 175 | demultiplexed signal |
| 176 | inverter control logic |
| 178 | inverter |
| 180 | signal period thresholds |
| 181 | demultiplexer control options |
| 182 | inverter control options |
| 183 | header flag options |
| 184 | multiplexer logic |
| 186 | histogramming logic |
| 187 | maximum selection logic |
| 188 | magnitude calculation logic |
| 190 | lowpass filter (LPF) |
| 191 | bandpass filter (BPF) |
| 192 | highpass filter (HPF) |
| 194a | LPF signal maximum selection or averaging logic |
| 194b | HPF signal maximum selection or averaging logic |
| 194c | input signal maximum selection or averaging logic |
| 195 | signal level (dB) estimate |
| 196 | minimum selection logic |
| 197a | noise floor magnitude estimate |
| 197b | signal magnitude estimate |
| 198a | noise base 2 logarithm logic |
| 198b | signal base 2 logarithm logic |
| 199 | adder |
| 200 | noise floor to bit removal converter |
| 202 | bit removal control parameter |
| 204 | fractional bit removal calculator |
| 206 | fractional bit restoration calculator |
| 208 | fractional gain |
| 210 | left-shifting logic |
| 212 | analytic signal generation logic |
| 214 | real part of analytic signal |
| 216 | imaginary part of analytic signal |
| 218a | cosine part of downconversion tone |
| 218b | cosine part of upconversion tone |
| 220a | sine part of downconversion tone |
| 220b | sine part of upconversion tone |
| 222 | complex multiplier |
| 224 | downconversion tone parameter |
| 226 | frequency translation calculation logic |
| 228a | complex downconversion tone generator |

-continued 6.0 List of Reference Numerals

| | |
|---|---|
| 228b | real tone generator |
| 228c | complex upconversion tone generator |
| 230 | frequency translation tone |
| 232 | multiplier |
| 234 | sum and difference output signal |
| 236 | programmable lowpass filter |
| 238 | frequency translation parameter |
| 240 | complex-to-real transformation logic |
| 242 | programmable highpass filter |
| 244 | sample rate recommendation logic |
| 248 | sample rate conversion logic |
| 250 | display subsystem |
| 252 | A/D clock control logic |
| 254 | A/D sampling clock |
| 256 | digital storage scope |
| 258 | signal generator |
| 260 | signal generator control logic |
| 262 | signal creation logic |
| 263 | uncompressed signal generator signal |
| 264 | compressing transmitter |
| 266 | decompressing receiver |
| 270 | enhanced A/D converter |
| 272 | A/D converter interface logic |
| 274 | A/D converter output |
| 276 | A/D converter control logic |
| 280 | enhanced D/A converter |
| 282 | D/A converter input |
| 284 | D/A converter interface logic |
| 290 | bit rate reduction options |
| 292 | preprocessor control logic |
| 294 | bit rate reduction control logic |
| 296 | filtering, downconversion, and decimation logic |
| 298 | selection logic |
| 300 | compression control logic |
| 302 | multi-stream control parameters |
| 304 | multi-stream director |
| 306 | bit reduction control parameters |
| 308 | multi-stream director output |
| 310 | bit reduction logic |
| 312 | bit packing control parameters |
| 314 | bit reduction output |
| 316 | bit packing logic |
| 318 | bit packing output |
| 320 | compression control header parameters |
| 322 | header creation logic |
| 324 | header creation output |
| 326 | packet creation logic |
| 328 | packet size measurement logic |
| 330 | packet size measurement |
| 340 | clock rate converter |
| 342 | clock rate converter output signal |
| 344 | memory interface |
| 346 | network or bus interface |
| 350 | distributor |
| 352 | gatherer |
| 354 | input buffer |
| 356 | output buffer |
| 358 | enhanced compression subsystem |
| 359 | enhanced decompression subsystem |
| 400 | compression subsystem |
| 410 | decompression subsystem |
| 600 | lossless/lossy operating mode selection |
| 610 | rate/distortion operating mode selection |
| 620 | distortion level selection |
| 630 | data rate selection |

The following outline provides a table of contents for all of the figures. Indented items below a heading indicate an expansion of detail of the heading item.

Figure 2:
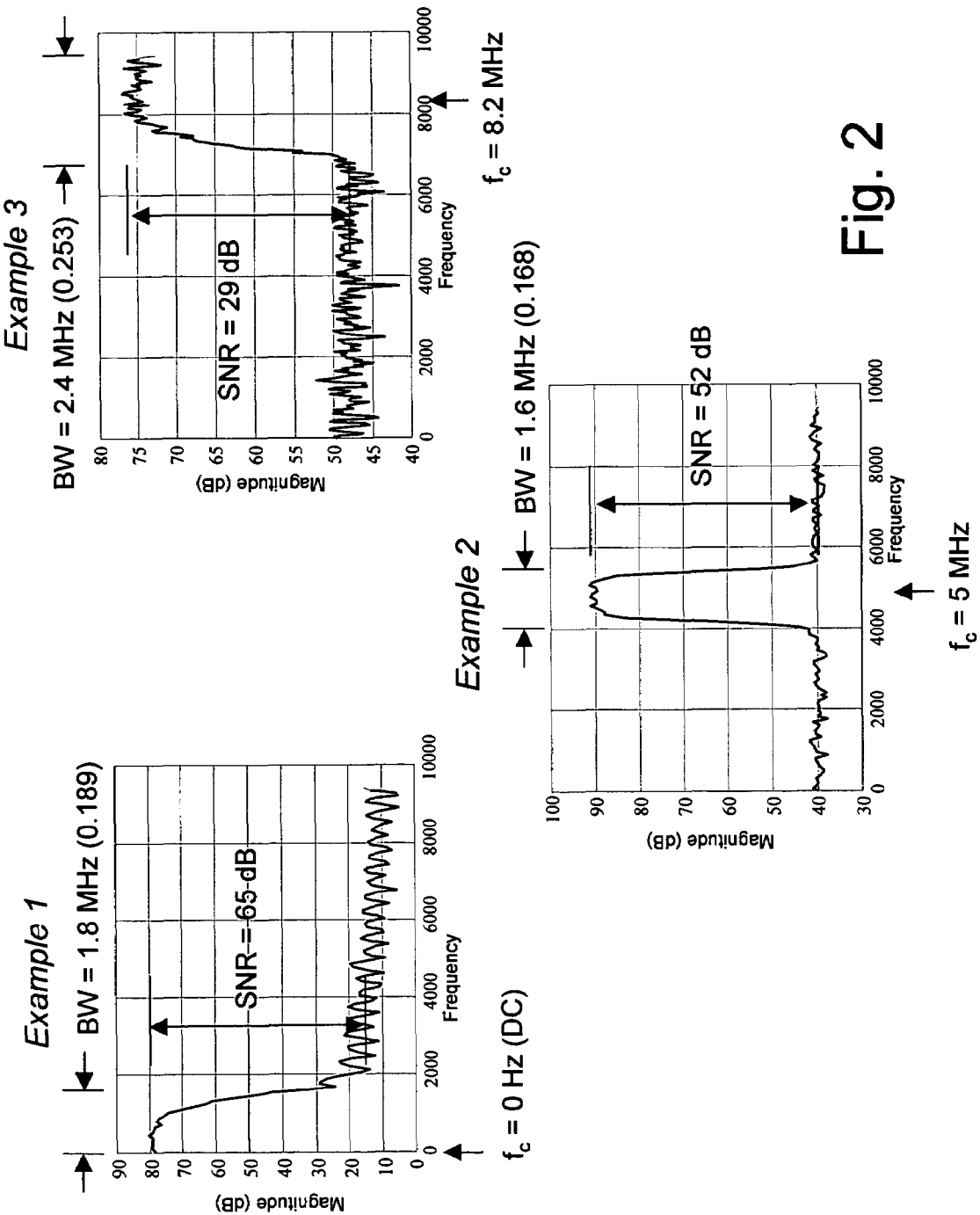
FIG. 2 illustrates the center frequency, dynamic range, and bandwidth of signals with lowpass, bandpass, and highpass characteristics.
Figure 3:
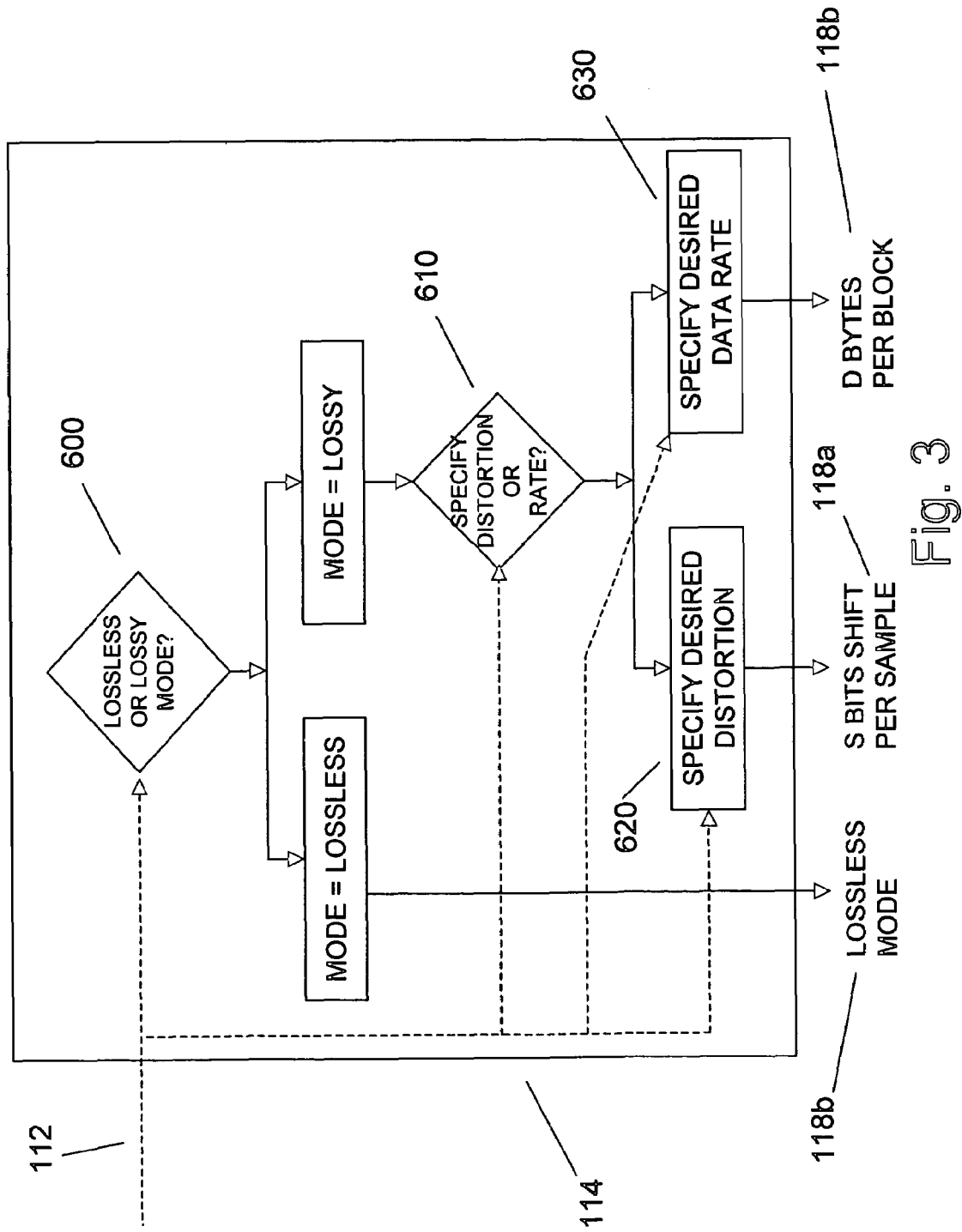
FIG. 3 shows a flowchart of user decisions that determine the control parameters of the compression and decompression methods.

Compression & Decompression System (FIG. 1)
    Signal Parameter Definitions (FIG. 2)
    User Control (FIG. 3)

-continued

Preprocessor (FIG. 4)
    Parameter estimation
        Measure signal period (FIG. 5)
            Frequency domain period estimation (FIGS. 8, 9)
            Time domain period estimation (FIGS. 10, 11)
        Measure noise floor (FIG. 6)
            Frequency domain noise floor estimation (FIG. 18)
            Time domain noise floor estimation (FIG. 19)
        Measure center frequency and bandwidth (FIG. 7)
    Preprocessor actions
        Demux and invert certain samples (FIGS. 5, 12, 13, 14, 15)
        Remove LSBs (FIGS. 6, 20, 22, 23, 24)
        Downconvert the center frequency (FIGS. 7, 27, 28)
        Change sampling rate $f_s$
            Demonstrate the effects of changing $f_s$ (FIG. 32)
            Recommend a different $f_s$ to user (FIG. 31)
            Control a sample rate converter (FIG. 33)
            Modify A/D converter sampling clock (FIG. 34)
    Interaction with Compressor (FIGS. 35, 36, 37)
Postprocessor
    Invert and multiplex certain samples (FIGS. 15, 16)
    Restore LSBs (FIG. 25, 26)
    Upconvert the input signal (FIGS. 29, 30)
Applications
    Oscilloscope application (FIGS. 38, 39)
    Signal generator application (FIG. 40)
    A/D converter application (FIG. 41)
    D/A converter application (FIG. 42)
    Bus/network transfer application (FIGS. 43, 44)
    Clock rate decrease examples (FIG. 45)
    Clock rate decrease for slower memory (FIG. 46)
    Clock rate decrease for slower bus/network (FIG. 47)
    Parallel processing compression/decompression (FIGS. 48, 49)

7.0 DETAILED DESCRIPTION OF INVENTION

An efficient compression and decompression method for sampled high-speed analog signals is described. In the following description, numerous specific details are presented in order to provide a thorough understanding of the present invention. It will be obvious, however, to one skilled in the art that the present invention may be practiced without these specific details. In other instances, well-known methods are not described in detail in order not to unnecessarily obscure the description of the present invention.

FIG. 1 provides an overview of the present invention, in the context of an analog input and an analog output system. The purpose of a compression subsystem 400 is to reduce the sampled data requirements between an analog-to-digital (A/D) converter 102 and a data storage logic 122, or between A/D converter 102 and a data transfer logic 120. The purpose of a decompression subsystem 410 is to reduce the sampled data requirements between data storage logic 122 and a digital-to-analog (D/A) converter 132, or between data transfer logic 120 and digital-to-analog (D/A) converter 132. In the preferred embodiment of the present invention, compression subsystem 400 and decompression subsystem 410 portrayed in FIG. 1 are reduced to practice in a hardware device such as a field-programmable gate array (FPGA), such as those manufactured by companies such as Xilinx, Altera, or Actel, or in an application-specific integrated circuit (ASIC), such as those manufactured by companies such as Taiwan Semiconductor Manufacturing Corporation (TSMC), LSI Logic, or United Microelectronics Corporation (UMC). The invention described below can also be implemented by special-purpose processors, such as Digital Signal Processors (DSPs), discrete components (adders, subtractors, multipliers, shift registers, etc.), or by general-purpose microprocessors. In practice, the present invention uses the resources of FPGAs and ASICs so efficiently that real-time compression and decompression is achievable for systems that process sampled high-speed analog signals. The term "real time" describes a process in which sampled input signal 104 can be compressed by devices incorporating the present invention at least as quickly as A/D converter 102 can sample an analog input signal, or that a decompressed, postprocessed signal 130 can be provided to D/A converter 132 at least as quickly as D/A converter 132 can convert a postprocessed signal 130 to its analog equivalent.

We will first discuss the operation of FIG. 1's compression subsystem 400. A/D converter 102 samples an analog input signal 100, generating sampled input signal 104. Those skilled in the art will appreciate that the sampling rate of A/D converter 102 is determined by a user 112, who selects a sampling rate that will unambiguously represent the analog signal bandwidth of analog input signal 100. In practice, this requires that user 112's sampling rate selection obey the Nyquist criterion, which requires that the A/D sampling rate be at least twice as high as the highest expected frequency component in analog input signal 100. Furthermore, those skilled in the art will recognize that the sampling rate of A/D converter 102 can often be chosen arbitrarily, as long as it obeys the Nyquist criterion. For practical considerations, the sampling rate of A/D converter 102 is often selected to be three, four, or five times higher than the highest expected frequency component of analog input signal 100. Sampled input signal 104 is provided as input to compression subsystem 400. In the preferred embodiment, sampled input signal 104 is coupled to compression subsystem 400 by a parallel or a serial connection implemented as traces on a printed circuit board. However, other electronic coupling embodiments, such as cables or optical fibers, can also provide sampled input signal 104 to compression subsystem 400.

In the present invention, compression subsystem 400 is further divided into two subsystems, a preprocessor 106 and a compressor 110. The purpose of preprocessor 106 is to process sampled input signal 104 so that it can be more effectively compressed by compressor 110. In the preferred embodiment of the present invention, compressor 110 is a lossless compressor, meaning that a compressed/encoded signal 119, which is the output of compressor 110, can be used to exactly reconstruct (without loss) a preprocessed signal 108, which was the original input to compressor 110. For compressor 110 to fulfill its desired function, compressed/encoded signal 119 should contain fewer bits, or provide its output at a lower bit rate, than that of its input signal (preprocessed signal 108). In its lossless embodiment, compressor 110 can be implemented in many ways:

As a first derivative generator, whose output y(I) is simply the difference between the present sample x(I) and the previous sample x(I−1). For instance, the input sample stream 5, 12, 10, 4, −3, −8 has first derivative stream 7, −2, −6, −7, −5 (7=12−5; −2=10−12, etc.)

As a second derivative generator, whose output y(I) is generated through the application of two successive first derivative generators. For instance, the input sample stream 5, 12, 10, 4, −3, −8 has first derivative stream 7, −2, −6, −7, −5 (7=12−5, −2=10−12, etc.) and second derivative stream −9, −4, −1, 2 (−9=−2−7, −4=−6−−2, etc.)

As any lossless compression method, such as U.S. Pat. No. 5,839,100 to Wegener (1998).

Those skilled in the art will recognize that the first derivative generator needs a starting value that is not generated by the first derivative generator. In the example used above, the "5" in the input stream 5, 12, 10, 4, −3, −8 must also be transmitted with the first derivative stream 7, −2, −6, −7, −5. In a similar manner, the second derivative stream −9, −4, −1, 2 must include both the starting first derivative stream value (7) and the first sample of the original input stream (5). The complete output sequences from the first and second derivative generators are thus summarized in the following table:

| Generator | Example Input sequence | Preliminary Output sequence | Starting Value(s) | Final Output sequence |
| --- | --- | --- | --- | --- |
| First deriv. | 5, 12, 10, 4, −3, −8 | 7, −2, −6, −7, −5 | 5 | 5, 7, −2, −6, −7, −5 |
| Second deriv. | 5, 12, 10, 4, −3, −8 | −9, −4, −1, 2 | 5, 7 | 5, 7, −9, −4, −1, 2 |

Those skilled in the art will also recognize that many lossless compression methods perform significantly better when sampled input signal 104 has lowpass characteristics, i.e. when it contains a signal whose strongest frequency components are near DC (zero Hz). When sampled input signal 104 has lowpass characteristics, it simply contains more redundancy between successive samples, redundancy that appropriate compression methods can remove. Signals that exhibit lowpass characteristics exhibit high correlation between successive samples, a correlation that most compression methods can effectively exploit.

The simplest, derivative-based algorithms providing lossless compression depend upon the input signal being a lowpass, baseband, and relatively bandlimited signal, because the frequency response of the derivative function itself is a relatively narrow, highpass function. This highpass function provides significant attenuation (at least 40 dB) near DC, and some attenuation up to 0.375 of the Nyquist frequency. Above 0.375 of the Nyquist frequency, the derivative function actually amplifies frequency components. This is the reason why derivative-based compression systems (such as DPCM and ADPCM) only work for lowpass-type signals: bandpass and highpass signals fall into the range of frequencies that derivative-based compression systems actually amplify, rather than attenuate. The present invention allows existing lossless compression schemes that normally provide effective compression only on lowpass, baseband signals to now operate effectively on bandpass and highpass signals as well, due to the frequency translation that the present invention's preprocessor provides.

A first function of preprocessor 106 is to improve the compression performance of compressor 110, when compared to the compression performance of compressor 110 alone. Because compressor 110 operates most effectively on signals with lowpass characteristics, a goal (but not the only goal) of preprocessor 106 is to modify sampled input signal 104 in such a way that preprocessed signal 108 has lowpass characteristics, regardless of sampled input signal 104's actual characteristics, which may be lowpass, mid-band, or highpass. The present invention enumerates several methods (illustrated as variations of preprocessor 106) that create preprocessed signal 108 with lowpass characteristics, regardless of the characteristics of input signal 104.

A second function of preprocessor 106 is to measure or to estimate other characteristics of sampled input signal 104, such as its noise floor, its center frequency, and its bandwidth. Those skilled in the art will recognize these three parameters can be measured for all analog, real-world signals, especially bandlimited signals. It should be noted that the center frequency, bandwidth, and noise floor of many analog, real-world signals can vary over time. It is also a function of preprocessor 106 to report the noise floor, the center frequency, and the bandwidth of sampled input signal 104 to control block 114, via preprocessor measurements or estimates 116a, or a recommended sample rate 116c (further described with FIGS. 31–34). In turn, control block 114 may adapt the behavior of preprocessor 106 via preprocessor control parameters 118a and can also adapt the behavior of compressor 110 via compressor control parameters 118b, to account for such changes in noise floor, center frequency, and bandwidth. In the preferred embodiment, adaptations in the preprocessor are achieved by adjustments to a component of preprocessor 106 (specifically a parameter preprocessor logic 144, with several alternative embodiments), which will be discussed with FIG. 3.

Compressor 110 may provide feedback parameters or control commands to preprocessor 106 through a compressor-to-preprocessor coupling signal 109. Because compressor 110 generates compressed/encoded signal 119, compressor 110 can determine whether the desired compression ratio (specified by user 112 and passed to compressor 110 by control block 114 as part of compressor control parameters 118b) is being achieved. If the desired compression ratio is not being achieved, compressor 110 can provide parameters or control commands through compressor-to-preprocessor coupling signal 109 that cause preprocessor 106 to generate preprocessed signal 108 that can be more easily compressed. With a lower-frequency result, and/or with fewer bits per sample in preprocessed signal 108, compressor 110 can more easily achieve the user-specified compression ratio. Thus a primary purpose of compressor-to-preprocessor coupling signal 109 is to provide a feedback mechanism from compressor 110 to preprocessor 106 that allows a user-specified compression ratio (or alternately, a user-specified desired bit rate) to be achieved. Compressor-to-preprocessor coupling signal 109 will be further discussed with FIGS. 35–37.

A measure of noise floor is important in a lossless compression system for the following reason: since noise is an unpredictable process, it does not contain any redundancy.

Therefore compressor 110 cannot effectively compress noise or noise-like components of sampled input signal 104. Those skilled in the art will recognize a signal quality metric called the signal-to-noise ratio, or SNR. The SNR expresses the ratio of the desired signal's power and the noise power. A decrease in the signal power, an increase in the noise power, or both, causes a decrease in SNR. An increase in the signal power, a decrease in the noise power, or both, causes an increase in SNR.

A signal with a high SNR is more compressible than a signal with low SNR because the low-SNR signal contains more noise, which (being random) is therefore less compressible. If preprocessor 106 can remove or decrease the noise in sampled input signal 104, the compression performance of compressor 110 will be improved. Preprocessor 106 can measure the noise level or the SNR of sampled input signal 104. Preprocessor 106 can then remove enough (an amount corresponding to the measured noise level) of the least significant bits (LSBs) of each sample of sampled input signal 104. Thus preprocessor 106 can remove noisy bits of sampled input signal 104, which decreases the noise in the signal. Alternately, preprocessor 106 can also remove noise using traditional frequency-selective logic that filters the desired signal to decrease the amplitude of undesired, out-of-band signals. Regardless of the method or methods used by preprocessor 106 to increase the SNR or to decrease the noise level of sampled input signal 104, noise-reduced, preprocessed signal 108 is then provided to compressor 110. The discussion with FIGS. 20–23 provides additional details regarding the effects of LSB removal on the noise floor, the effects of filtering on SNR, and the resulting improvement in compressibility provided by preprocessor 106.

In FIG. 1, control block 114 orchestrates the operation of compression subsystem 400, under the control of user 112. In the preferred embodiment, user 112 specifies a desired compression ratio, or alternately, an acceptable distortion level, to control block 114. Control block 114 sends one or more preprocessor control parameters 118a to preprocessor 106. Control block 114 also sends one or more compressor control parameters 118b to compressor 110. Preprocessor 106 provides one or more preprocessor measurements or estimates 116a to control block 114. Compressor 110 also returns one or more compressor measurements or estimates 116b to control block 114. Compressor 110 can send parameters or control commands to preprocessor 106 using compressor-to-preprocessor control logic 109, in order to achieve the desired compression ratio or the acceptable distortion level specified by user 112. For example, if compressor 110 is not achieving the desired compression ratio specified by user 112, compressor 110 can command preprocessor 106 through compressor-to-preprocessor control logic 109 to reduce the information rate of preprocessed signal 108 through various options, further discussed in detail with FIG. 37.

In this manner, compressor 110 can control or fine-tune one or more of preprocessor 106's processing options to improve the compressibility of preprocessed signal 108. The invocation of such compressibility improvement logic in preprocessor 106 may introduce a difference between the samples of sampled input signal 104 and the corresponding samples of preprocessed signal 108. Distortion can be defined in several ways, including (but not limited to):

1. the absolute difference between sampled input signal 104 and preprocessed signal 108, or
2. the root-mean-square [RMS] difference between sampled input signal 104 and preprocessed signal 108, or
3. the average signed difference between sampled input signal 104 and preprocessed signal 108, or
4. the maximum difference between sampled input signal 104 and preprocessed signal 108 over a user-defined window of N consecutive samples.

However, the distortion introduced when preprocessor 106 invokes one or more of its bit rate reduction methods still achieves user 112's goal, which is to control the bit rate of compressed/encoded signal 119 prior to storage in data storage logic 122 or transfer through data transfer logic 120. In certain embodiments (explained with the discussion of FIGS. 31, 33, and 34), preprocessor 106 can also suggest a recommended sample rate 116c to control block 114. As control block 114 changes the sample rate of A/D converter 102 or otherwise effects a change in the sample rate as specified by recommended sample rate 116c, the compressibility of preprocessed signal 108 is improved, and the resulting bit rate of compressed/encoded signal 119 is reduced.

In many signal acquisition systems that include a signal acquisition device such as A/D converter 102, sampled input signal 104 is often stored in data storage logic 122 or transferred to subsequent signal processing blocks via data transfer logic 120. By storing or transferring compressed/encoded signal 119 instead of sampled input signal 104, the signal acquisition system can lower the size, or the processing rate, or the cost, of data storage logic 122 and/or data transfer logic 120. Compression subsystem 400 of the present invention generates an alternative, smaller compressed/encoded signal 119 in place of sampled input signal 104.

Next, we discuss the operation of FIG. 1's decompression subsystem 410. The primary purpose of decompression subsystem 410 is to un-do the operations of compression subsystem 410, resulting in a postprocessed signal 130 that is identical to (if compression subsystem 400 and decompression subsystem 410 are operating in lossless mode) or very similar to (if compression subsystem 400 and decompression subsystem 410 are operating in a lossy mode) sampled input signal 104. Decompression subsystem 410 receives compressed/encoded signal 119 from data storage logic 122 or data transfer logic 120. The primary purpose of a decompressor 124 is to un-do the operations of compressor 110. The primary purpose of a postprocessor 128 is to un-do the operations of preprocessor 106.

Just as compressor 110 reduced the bits required to represent preprocessed signal 108, decompressor 124 generates a decompressor output signal 126 that contains more bits than compressed/encoded signal 119. If compressor 110 and decompressor 124 apply the corresponding compression and decompression operations of a lossless encoding algorithm, decompressor output signal 126 will be identical to preprocessed signal 108 that was originally input to compressor 110. Corresponding to the earlier example lossless compression methods that can be implemented in compressor 110, let us define the corresponding decompression operations, implemented in decompressor 124, that generate decompressor output signal 126, which will be identical to the original preprocessed signal 108:

The operation of compressor 110, implemented as a first derivative generator, would be un-done by a first integral generator in decompressor 124. The first integral generator's output y(i) is simply the sum of the present sample x(i) and its first derivative. For example, the first derivative stream 7, −2, −6, −7, −5 can be integrated with starting sample 5 to produce the first integral output stream 5, 12, 10, 4, −3, −8 (12=5+7, 10=12−2, etc.)

The operation of compressor 110, implemented as a second derivative generator, would be un-done by a second integral generator in decompressor 124. The second integral generator's output y(i) is generated simply by cascading two first integral generators in series. For example, the second derivative stream second derivative stream −9, −4, −1, 2 can be integrated with starting first derivative sample 7 to produce the second integral output stream 7, −2, −6, −7, −5 (−2=7+−9, −6=−2+−4, etc.), and second integral stream can be integrated with starting input sample 5 to produce first integral stream 5, 12, 10, 4, −3, −8 (12=5+7, 10=12+−2, etc.).

U.S. Pat. No. 5,839,100 to Wegener (1998) describes an effective lossless compressor 110 and lossless decompressor 124 for sampled data.

Postprocessor 128 receives decompressed output signal 126 from decompressor 124. As mentioned earlier, postprocessor 128 applies operations that will un-do preprocessor 106's operations. Since one of preprocessor 106's primary purposes is to ensure that preprocessed signal 108 had lowpass characteristics, regardless of sampled input signal 104's actual frequency characteristics, the purpose of postprocessor 128 is to restore the original frequency characteristics of sampled input signal 104, generating postprocessed signal 130. Similarly, if preprocessor 106 removed LSBs from sampled input signal 104, postprocessor 128 restores those LSBs. The overall magnitude of sampled input signal is maintained even if LSBs are removed prior to compression, because these LSBs are then restored after decompression.

Several control parameters required by decompression subsystem 410 are either:
- stored within compressed/encoded signal 119 as header parameters,
- specified by user 112,
- provided by control block 114.

These parameters can be incorporated into compressed/encoded signal 119 as header information that is embedded within compressed/encoded signal 119. Alternately, these parameters can be provided to decompression subsystem 410 as side information by control block 114. In the preferred embodiment, compressor 110 inserts all control parameters into headers that are embedded within compressed/encoded signal 119. The header or headers may be sent once, multiple times at regular intervals, or multiple times at irregular intervals (for example, only when one or more header parameters change). The header contains whatever information decompressor 124 and postprocessor 128 require to un-do the operations performed by compressor 110 and preprocessor 106, respectively. Header parameters may include (but are not limited to):
- sampled input signal 104's center frequency
- sampled input signal 104's noise floor, SNR, or LSB shift count,
- sampled input signal 104's bandwidth
- sampled input signal 104's original and/or modified sampling rate
- control and selection logic that specifies particular operating modes of compressor 110, which are un-done by decompressor 124
- control and selection logic that specifies particular operating modes of preprocessor 106, which are un-done by postprocessor 128

The header parameters listed above can be stored within compressed/encoded signal 119 in data storage logic 122 or data transfer logic 120. Alternately, in systems where compression subsystem 400 and decompression subsystem 410 are coupled to the same control block 114, control block 114 can provides decompressor control parameters 118c to decompressor 124, as well as postprocessor control parameters 118d to postprocessor 128 during decompression operations. To summarize, in one mode of control, control parameters specifying operating modes and settings of postprocessor 128 and decompressor 124 are retrieved from compressed/encoded signal 119's headers. In another mode of control, decompression subsystem 410 receives decompressor control parameters 118c and postprocessor control parameters 118d from control block 114.

Because one of the purposes of the present invention is to provide efficient logic for processing sampled data signals that are coupled to data converters, postprocessed signal 130 will often be coupled to a digital-to-analog (D/A) converter 132. When driven by postprocessed signal 130, D/A converter 132 generates an analog output signal 134 that in lossless mode is identical to (or in lossy mode, is similar to) original analog input signal 100.

Those skilled in the art will recognize that two analog signals can only be compared in relative terms, since the measurement of analog signals always involves some noise source, even if the only noise source is low-level thermal noise within the measurement or comparison device. It will be helpful to introduce the concept of an analog difference signal, which is generated by subtracting two phase-aligned analog signals. The purpose of phase alignment is to ensure the highest possible correlation between the two analog waveforms, and thus to minimize the RMS error of the analog difference signal. Using the idea of an analog difference signal in the context of the present invention:
- the term "identical" means that the analog difference signal's RMS value is at or below the voltage level represented by the smaller of one LSB of A/D converter 102 and one LSB of D/A converter 132.
- The term "similar to" means that the analog difference signal's RMS value is above the larger of one LSB of A/D converter 102 and one LSB of D/A converter 132, but below a user-specified distortion threshold.

In the first instance, the magnitude of the analog difference signal is determined by the resolution of the data converters. In the second instance, the magnitude of the analog difference signal is determined by a user selection. In many applications, user 112 desires the benefits of working with a smaller compressed/encoded signal 119, rather than with a larger sampled input signal 104 or postprocessed signal 130. The present invention allows user 112 to operate compression subsystems 400 either in a lossless mode, in which case the term "identical" as defined above applies, or in a lossy mode, in which case the term "similar to" as defined above applies. The present invention thus allows user 112 to trade off the data rate of compressed/encoded signal 119 against a user-specified distortion level.

Those skilled in the art of information theory will recognize this familiar tradeoff between the data rate of a signal and the distortion of certain lower-bit-rate representations of the signal. In information theory, this tradeoff is represented by the well-known rate-distortion curve. For a given signal, higher data rates allow lower (or zero) distortion, while lower data rates result in higher distortion. Prior to the present invention, such user-controlled selection of an operating point on a signal's rate-distortion curve was available only for certain low-bandwidth, bandlimited sampled data signals, using prior art compression methods for speech, audio, image, and video signals. Keep in mind that these low-bandwidth signals have correspondingly low sampling rates (samples per second) and also exhibit lowpass characteristics.

However, the present invention allows users to select an appropriate operating point on the rate-distortion curve, for a much larger variety of signals, and at much higher sampling rates. Furthermore, the present invention allows a continuous selection of operating points along the rate-distortion curve, with data rates selected in fractions of bits, and with distortion levels selected in fractions of a dB or fractions of bits. Prior art compression systems often only offer a few, limited choices of compression ratio (such as 2:1, 4:1, and 8:1), rather than a continuous selection range (1.7:1, 1.383:1, 2.4755:1, etc.). Thus the benefits of compression are made available for a much larger, and more general, class of sampled analog signals, and with significantly more granularity along the rate-distortion curve. In effect, the present invention allows sampled analog data users to select any operating point along the rate-distortion curve of any sampled analog signal, regardless of its sampling rate. While prior art compression methods may provide higher compression ratios or lower distortion levels than the present invention for a select, specific subset of low-rate, lowpass sampled analog signals (such as speech, audio, image, and video signals), the present invention allows a much larger class of sampled data users to select appropriate rate-distortion operating points for sampled analog signals, regardless of their bandwidth or sampling rate.

For some applications of the present invention, it is not necessary that every analog input signal 100 be matched with a corresponding analog output signal 134. For example, in data acquisition applications, user 112 wants to capture analog input signal 100 only for subsequent examination and/or processing in the digital domain. In such data acquisition applications, there is no need to regenerate analog output signal 134, because user 112 simply wants to observe or to process sampled input signal 104. A benefit of the present invention is that user 112 can now capture more samples of sampled input signal 104 in a given amount of memory (provided by data storage logic 122), and can now transfer sampled input signal 104 in a reduced bandwidth (provided by data transfer logic 120).

Similarly, in a signal generator application, compressed/encoded signal 119 may be generated off-line and not in real time, for example, by using software on a personal computer [PC]. In such signal generator applications, sampled data signal 104 can be created by simulation software on a PC to represent desired analog output signal 134. The desired sampled data signal 104 that ultimately generates analog output signal 134 can be processed by compression subsystem 400 (also, for example, in software on a personal computer) to generate compressed/encoded signal 119, which can then be stored in data storage logic 122 inside a signal generator. When an enhanced signal generator includes a real-time implementation of decompression subsystem 410, it fetches compressed/encoded signal 119, decompresses and postprocesses it, and provides postprocessed signal 130 to D/A converter 132, which generates analog output signal 134.

In such a signal generator application, analog output signal 134 is the analog representation of the user's original sampled data signal 104. Sampled data signal 104 may or may not have been originally acquired by A/D converter 100. Sampled data signal 104 may simply have been generated by a software application on a personal computer. So for a signal generator application, analog output signal 134 does not necessarily correspond to any particular analog input signal 100.

FIG. 2 illustrates three examples that demonstrate how the following signal parameters can be quantitatively determined from a signal's frequency-domain representation (spectrum):

Center frequency
Bandwidth and spectral occupancy
Signal-to-noise ratio (SNR) and noise floor The concept of spectral occupancy (which is related to the concept of bandwidth) is further used here to define what is meant in the specification by a bandlimited signal, which is the kind of signal most effectively compressed by the present invention.

FIG. 2 contains three examples (Examples 1, 2, and 3) of signal spectra. Those skilled in the art will recognize that signal spectra can be obtained from a stream of samples of sampled input signal 104 through a variety of time-to-frequency transformations. Such transformations include the fast Fourier transform (FFT), discrete Fourier transform (DFT), discrete cosine transform (DCT), wavelet transform, bandpass filter bank, etc. The particular method used to obtain the signal spectra in FIG. 2 is not relevant to the present discussion, which simply seeks to more clearly define the terms "center frequency", "bandwidth", "SNR", "lowpass", "bandpass", etc. FIG. 2's three examples assume a sampling frequency of 19 Msamp/sec (Nyquist bandwidth of 9.5 MHz). These parameters are summarized for each of FIG. 2's examples in the following table:

| Example | Center Freq (MHz) | Bandwidth (MHz) | Spectral occupancy | Signal Power (dB) | Noise Power (dB) | SNR (dB) |
|---|---|---|---|---|---|---|
| 1 | 0 | 1.8 | 0.189 | 80 | 15 | 65 |
| 2 | 5 | 1.6 | 0.168 | 92 | 40 | 52 |
| 3 | 8.2 | 2.4 | 0.253 | 77 | 48 | 29 |

The signal of FIG. 2's Example 1 is often called a lowpass or baseband signal, because it is centered at 0 Hz (DC). Such baseband signals are most effectively compressed by existing, lossless compression algorithms for speech, audio, images, and video. While the signal does not have to be centered exactly at 0 Hz, the energy of baseband signals is nevertheless always skewed towards 0 Hz (DC). The signal of FIG. 2's Example 2 is often called a bandpass or a mid-band signal, because its energy is centered in the middle of the spectrum. The signal of FIG. 2's Example 3 is called a highpass signal, because its energy is skewed towards the higher frequencies (i.e. towards the Nyquist frequency, which equals half the sampling rate). To summarize, the location of a signal's center frequency in relation to the Nyquist frequency determines whether the terms "lowpass", "baseband", "bandpass", or "highpass" are used to describe a particular sampled data signal.

To those skilled in the art, a signal's signal-to-noise ratio (SNR) is a key parameter that quantifies the signal's quality. As its name implies, SNR is the ratio between the signal's power and the power of the noise in the Nyquist bandwidth from 0 Hz to half the sampling rate. SNR is a metric of signal quality: the higher the SNR, the better the signal quality. SNR is typically measured on a logarithmic scale (decibels, or dB), rather than on a magnitude scale, to better represent the wide dynamic range that SNR can assume. SNR is calculated as the difference between the signal power (measured in dB) and noise power (measured in dB). Signal power can be observed from a signal spectrum by locating the strongest spectral component, or by averaging the signal components around the center frequency of a signal. Similarly, noise power is observed from a signal spectrum by measuring or averaging those spectral components outside the bandwidth of interest, far away from the signal of interest's center frequency. Noise power can also be calculated by histogramming all frequency bins in the spectrum and then by selecting the noise power whose bin contains the highest count. In FIG. 2, Example 1 has a signal power of 80 dB, a noise floor of 15 dB, and a resulting SNR of 65 dB. Example 2 has a signal power of 92 dB, a noise floor of 40 dB, and a resulting SNR of 52 dB. Example 3 has a signal power of 77 dB, a noise floor of 48 dB, and a resulting SNR of 29 dB. The signal of Example 1 has the best signal quality (65 dB) and Example 3's signal has the worst signal quality (29 dB).

A signal's bandwidth and spectral occupancy can also be observed from its spectrum. Those sections of a spectrum where the desired signal energy falls from its peak to the noise floor are called transition bands. Those skilled in the art will recognize that a signal's bandwidth is simply the distance between its lower and upper transition bands. Analog bandwidth is expressed in Hz, kHz, MHz, or GHz, but in sampled data systems, bandwidth can also be expressed as a percentage of the Nyquist frequency or sampling frequency. If bandwidth is expressed in relation to the Nyquist frequency or the sampling rate, it is called the normalized bandwidth or the spectral occupancy. Spectral occupancy describes the percentage of the Nyquist band that the signal of interest occupies between its transition bands. In FIG. 2, the signal of Example 1 has a bandwidth of 1.8 MHz and a normalized bandwidth of 0.189 (1.8 MHz/9.5 MHz). The signal of Example 2 has a bandwidth of 1.6 MHz and a normalized bandwidth of 0.168 (1.6 MHz/9.5 Hz). The signal of Example 3 has a bandwidth of 2.4 MHz and a normalized bandwidth of 0.253 (2.4 MHz/9.5 MHz).

Those skilled in the art will recognize that the term "bandlimited signal" describes a signal whose spectral occupancy does not exceed a certain value, or a signal whose sampling rate is at least a certain multiple of the signal's highest frequency. While the specific parameter that defines a bandlimited signal is application-specific, the present invention generally aims to compress signals with spectral occupancy of 0.33 or less, which corresponds to baseband signals with oversampling of at least 3 samples per Hz. Bandpass or highpass signals may have fewer than 3 samples per Hz. When expressed as a multiple of the signal's highest frequency, "samples per Hz" is also called the oversampling factor. In test and measurement applications (such as those employing oscilloscopes, spectrum analyzers, and signal generators), oversampling factors of 5 or higher for baseband signals are not only desirable but are often required to achieve a specified measurement fidelity. Oversampling a signal improves the ability to make certain signal measurements. Oversampling also increases the required sampling rate of sampled input signal 104 and consequently creates an oversampled signal whose redundancies are effectively removed by the present invention.

Spectral occupancy has a direct relationship to the compressibility (entropy) of sampled input signal 104: the wider the spectral occupancy, the lower the correlation between samples. Because reduced correlation between samples results in a decrease in achievable compression ratios, low spectral occupancies (bandlimited signals) are desirable for compression applications. Without specifying a particular spectral occupancy value, "bandlimited" is a qualitative term that describes signals that can be more effectively compressed than "wideband" or "non-bandlimited" signals. Bandlimited signals can be compressed more effectively than wideband signals, because bandlimited signals have more redundancy to remove. The present invention includes optional bandwidth restriction mechanisms that limit the bandwidth of sampled input signal 104 in cases where wideband signals may be received. Such optional mechanisms may be used to separate a composite wideband sampled input signal 104 (which does not meet the "bandlimited" definition above) into multiple, bandlimited signals, each of which can then be effectively compressed by the present invention.

The present invention couples preprocessor 106 to compressor 110 and, during decompression, couples decompressor 124 to postprocessor 128. Many existing implementations of compressor 110 have been developed for specific kinds of signals: speech, audio, images, and video compression solutions are well known. However, because these signal types (speech, audio, images, and video) are nearly always baseband or lowpass signals, the corresponding compression solutions for such signals are optimized, and in fact are often only effective, for lowpass signals. If signals with bandpass or highpass characteristics were processed by such baseband compression solutions, the results would be unsatisfactory. Bandpass and highpass signals do not exhibit the sample-to-sample correlation of baseband signals upon which most prior art compression methods depend. Thus prior art compression methods do not provide satisfactory results (as expressed by the compression ratio or by the perceived distortion) on bandpass and highpass signals.

Preprocessor 106 of the present invention has three primary goals, all of which increase the compression ratio at the output of compressor 110:
  a) to convert sampled input signal 104 into a signal (or multiple signals) with lowpass characteristics,
  b) to remove random components of sampled input signal 104, either by filtering (removing noise from particular frequency bands) or by integer or fractional LSB removal (removing random bits at or below the noise floor from each sample).
  c) to optionally restrict the bandwidth of sampled input signal 104, simultaneously increasing its SNR and also increasing sample-to-sample redundancy, All three of these results, effected by preprocessor 106, improve the compression performance of compressor 110.

FIG. 3 provides a flowchart of decisions by user 112 that determine the operation of compression subsystem 400. In its preferred embodiment, the present invention has three operating modes:
  lossless compression,
  compression with user-specified bit rate,
  compression with user-specified distortion level.

Those skilled in the art will recognize that the last two selections correspond to a user-selected operating point on a sampled data signal's rate-distortion curve. The present invention allows user 112 to select an operating level on either axis of the rate-distortion curve: the desired data rate, or the desired level of distortion. Because lossless compression results in a lower data rate without introducing any distortion, the present invention often provides a decrease in bit rate without introducing any distortion. On sampled data signals that are bandlimited to 20% of the Nyquist bandwidth, the present invention provides lossless compression ratios in excess of 2:1, and for some sine waves, compression ratios in excess of 10:1, without introducing any distortion (lossless compression).

FIG. 3 indicates that user 112 controls the operation of compression subsystem 400 by making the following selections through control block 114:
  A lossless/lossy operating mode selection 600
  A rate/distortion operating mode selection 610
  (in distortion-controlled operating mode) a distortion level selection 620

(in rate-controlled operating mode) a data rate selection 630

During compression, the resulting user decisions are provided to preprocessor 106 via control parameter(s) to preprocessor 118a, and to compressor 110 via control parameter(s) to compressor 118b.

User 112 selects lossless mode (via lossless/lossy operating mode selection 600) when compressed/encoded signal 119 is to have the highest fidelity, and when compression performance is a secondary goal. User 112 selects lossy mode (via lossless/lossy operating mode selection 600) when compressed/encoded signal 119 is to result in a fixed (or a not-to-exceed) data rate, or when some non-zero amount of distortion is acceptable in exchange for a smaller bit rate. Those skilled in the art will recognize that the amount of compression achieved by the present invention in lossless compression mode will vary, depending on the amount of redundancy in sampled input signal 104. Certain sampled analog signals (such as DC levels) will compress to a high degree without any distortion, because the signal is highly predictable and slowly varying. Other sampled analog signals (such as white noise) will not compress at all, because the signal varies unpredictably and thus has little or no redundancy. By offering a lossless operating mode (as well as a lossy operating mode), the present invention provides user 112 with a benefit (lossless compression) at very little cost (the low-complexity compression and decompression algorithms of the present invention). When operating in lossless mode, the present invention compresses the user's high-redundancy signal with zero distortion (no loss). This losslessly compressed signal can be stored in less data storage logic 122 or transferred via data transfer logic 120 in less bandwidth, or at lower data rates, than sampled input signal 104 would have required.

If user 112 selects lossy mode (via lossless/lossy operating mode selection 600), a further user selection is needed. As discussed earlier, user 112 may want to transform sampled input signal 104 into compressed/encoded signal 119 so that the bit rate of compressed/encoded signal 119 is fixed. Alternately, user 112 may want to transform sampled input signal 104 into compressed/encoded signal 119 so that the distortion level of compressed/encoded signal 119 can be specified. In lossy mode, user 112 selects (via rate/distortion operating mode selection 610) between these two options.

If user 112 selects distortion-limited lossy compression operation (via rate/distortion operating mode selection 610), user 112 also specifies the amount of allowable distortion via distortion level selection 620. Those skilled in the art will recognize that there are at least two alternative ways to interpret such a user-specified distortion level:

(maximum distortion level) the user-specified distortion level should never be exceeded,
(average distortion level) the user-specified distortion level can vary, as long as the average distortion level over N consecutive samples does not exceed the user-specified distortion level.

The present invention supports either interpretation of the user-specified distortion level.

Similarly, if user 112 selects rate-limited lossy compression operation (via rate/distortion operating mode selection 610), user 112 also specifies the desired data rate via data rate selection 630. Those skilled in the art will recognize that there are at least two alternative interpretations for the user-specified data rate:

(maximum rate) the user-specified data rate should never be exceeded,
(average rate) the user-specified data rate can vary, as long as the average data rate over N consecutive samples does not exceed the user-specified data rate The present invention supports either interpretation of the user-specified data rate.

Figure 4:
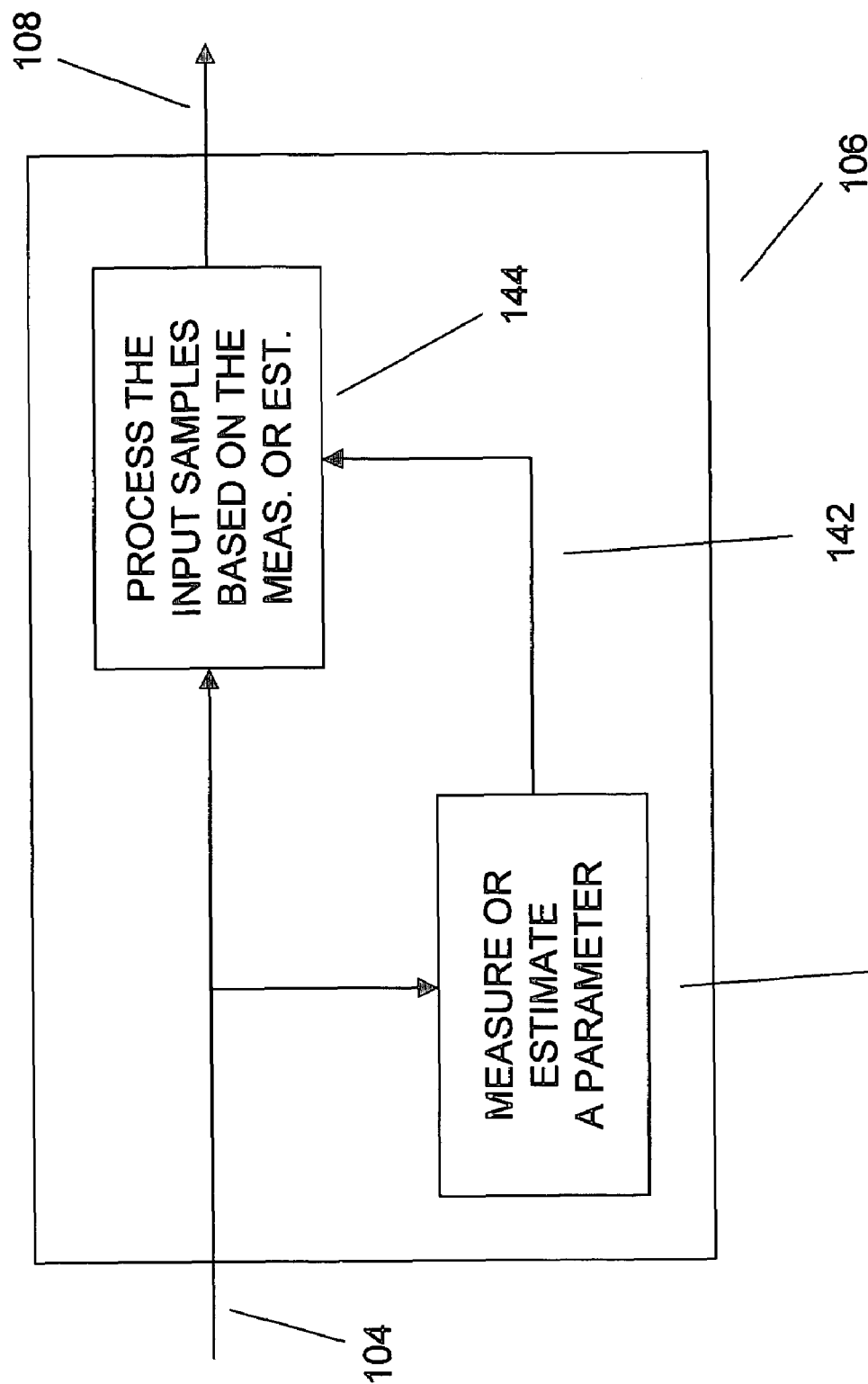
FIG. 4 shows a sampled data preprocessor.

FIG. 4 provides a generic representation of preprocessor 106. At this generic level, preprocessor 106:
  accepts sampled input signal 104,
  makes measurements or estimates of various parameters of sampled input signal 104 using preprocessor parameter measurement/estimation logic 140,
  couples the parameters measured or estimated by preprocessor parameter measurement/estimation logic 140 to a parameter-controlled preprocessor logic 144 via a preprocessor parameter measurements/estimates 142,
  processes sampled input signal 104 according to preprocessor parameter measurements/estimates 142, and
  provides the preprocessed signal 108 at the output of preprocessor 106.

Figure 5:
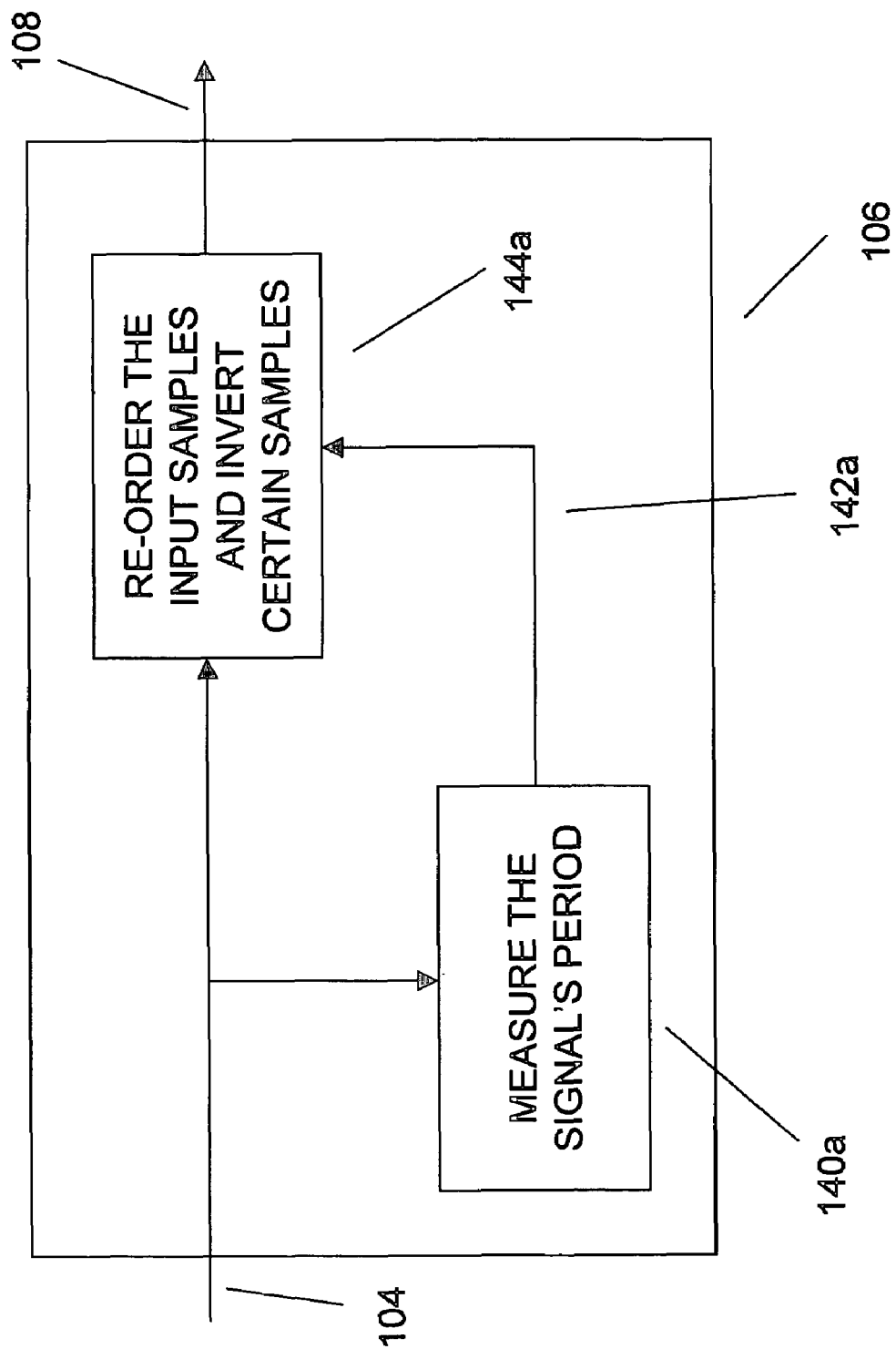
FIG. 5 illustrates an adaptive sample reordering and inversion algorithm, which reorders and inverts selected samples based on an estimate of signal period.
Figure 6:
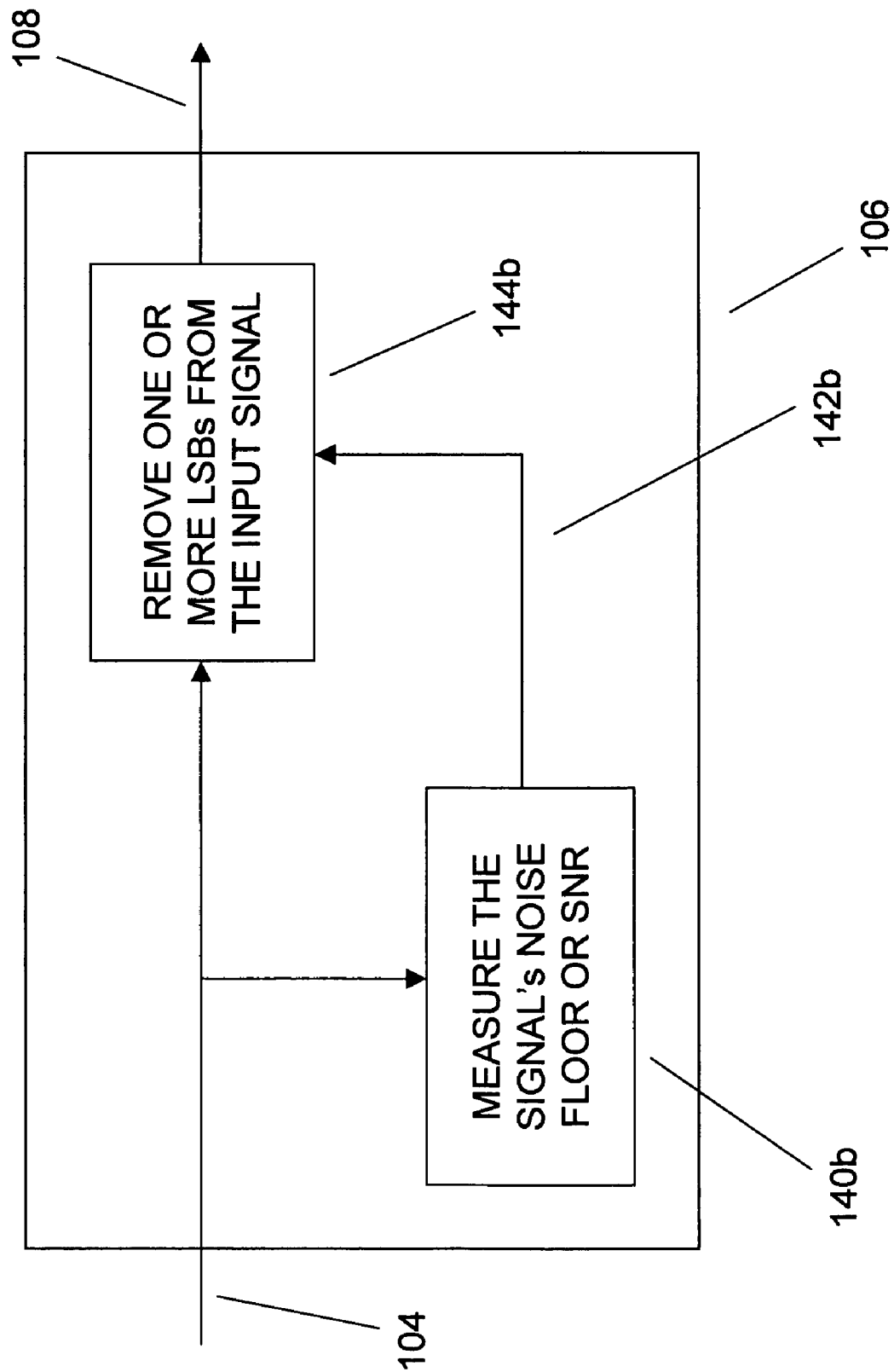
FIG. 6 shows an adaptive least significant bit (LSB) removal algorithm, which removes LSBs based on an estimate of signal noise floor.

As discussed earlier, signal period or center frequency, noise floor, and bandwidth are three fundamental parameters of all analog signals. FIGS. 5, 6, and 7 illustrate how the present invention's preprocessor 106, in three different configurations, measures these three particular parameters and uses the measurements or estimates of these parameters to control the operation of parameter-controlled preprocessor logic 144. The signal parameters listed here (signal period, noise floor, center frequency and bandwidth) are illustrative. Many other individual or additional signal parameters can be measured or estimated by preprocessor parameter measurement/estimation logic 140 and used to affect the operation of parameter-controlled preprocessor logic 144, such as:
  a) signal maximum,
  b) signal minimum,
  c) signal average,
  d) signal median,
  e) signal mode,
  f) number of signals in a user-specified bandwidth,
  g) signal modulation type,
  h) signal peak-to-average ratio,
  i) signal dynamic range,
  j) signal-to-noise ratio, and many others.

FIG. 5 provides an example of how preprocessor 106 can be configured to measure sampled input signal 104's signal period (the reciprocal of the center frequency), and to reorder and invert certain samples of sampled input signal 104 under the influence of a signal period estimate 142a. In FIG. 5, a signal period measurement/estimation logic 140a measures the signal period, defined here as the average number of samples between positive-going zero crossings of the strongest frequency of sampled input signal 104. Those skilled in the art will recognize that the strongest frequency is also called the carrier frequency. The carrier frequency is the reciprocal of the signal period. The signal period is most often expressed in units of samples. For example, a 3 MHz sine wave that is sampled at 20 Msamp/sec has a period of 20/3=6.67 samples per period. For prior art sampled analog signals obtained from speech, audio, image, and video sources, the carrier frequency is almost always DC (0 Hz), and thus the signal period is usually a very large integer value. For example, an analog audio signal sampled at 44.1 ksamp/sec will often have a signal period of hundreds of samples or more. In contrast, many analog signals, especially communication signals, will have non-DC carrier frequencies with correspondingly short signal periods. For signals with non-DC carrier frequencies, prior art compression methods will not work very well because one of their fundamental assumptions (DC carrier frequency) is violated.

In contrast, the present invention uses signal period measurement/estimation logic 140a to produce signal period estimate 142a, and then to use signal period estimate 142a to control a re-ordering and inversion logic 144a. The purpose of this combination of signal period measurement/estimation logic 140a, signal period estimate 142a, and re-ordering and inversion logic 144a is to generate preprocessed signal 108 that has lowpass characteristics, regardless of the center frequency of sampled input signal 104. FIGS. 12 through 15 provide additional details of the operation of re-ordering and inversion logic 140a.

FIG. 6 provides an example of how preprocessor 106 can be configured to measure sampled input signal 104's noise floor, and to remove the LSBs of sampled input signal 104 under the influence of the noise floor estimate. In FIG. 6, a noise floor measurement/estimation logic 140b calculates a noise floor estimate 142b for sampled input signal 104. Those skilled in the art will recognize that the noise floor of sampled input signal 104, along with the largest expected value of sampled input signal 104, establish the dynamic range requirements of the system. The dynamic range thus also establishes the required bit width of each sample of sampled input signal 104. For prior art sampled analog signals obtained from speech, audio, image, and video sources, the noise floor is often very low, and thus the sampled signal quality and dynamic range are very high. For example, an analog audio signal sampled using 16-bit samples has a dynamic range approaching 96 dB. A well-known relationship between the number of bits per sample and the dynamic range is the "6 dB per bit" rule. For example, an 8-bit converter nominally offers 6*8=48 dB of dynamic range, while a 16-bit converter nominally offers 16*6=96 dB of dynamic range.

Unfortunately, the compression performance and distortion levels of prior art compression methods often depend upon having a clean, noise-free sampled input signal 104 available for compression. When the sampled input signal 104 contains appreciable noise, results using prior art compression methods are significantly degraded.

Furthermore, many analog input signals not containing speech, audio, image, and video sources also contain unavoidable amounts of noise. For example, geophysical signals with MHz bandwidths are acquired from sensors that are thousands of feet under the surface of the earth, where temperatures and pressures cause high levels of ambient noise to be captured along with any measurements from these sensors. As a second example, a transmitted communications signal in a wireless system may be severely attenuated at a receiver antenna. Under these circumstances, the desired signal amplitude may be comparable to the amplitude of noise sources in the receiver, corresponding to an SNR of 0 dB—a very noisy signal. Unless a preprocessor (such as that used by the present invention) determines the noise floor of the input signal and adjusts for the noise floor level, a follow-on input signal compressor will compress significant amounts of noise and thus will suffer from degraded performance: lower lossless compression ratios and higher distortion levels after compression.

Those skilled in the art of data conversion will also recognize the difficulty of maintaining dynamic range (bits per sample) as the sample rate is increased. Data converters with 16 or more bits per sample are common and relatively inexpensive at sampling rates of 1 Msamp/sec or lower, while data converters with more than 8 bits per sample are rare and relatively expensive at sampling rates of 1 Gsamp/sec or higher. In compression systems, it is desirable that sampled input signal 104 be as noise-free as possible prior to compression. As mentioned earlier, the noise component of sampled data signals cannot be compressed. Thus the noisier the sampled input signal 104 is, the worse will be the compression ratio of the compressed signal, or the higher will be the distortion of the compressed signal. As sampling rates of data converters increase, it becomes even more important to remove noise from the signal prior to compression, since one bit of noise in an 8-bit sample represents a much larger percentage of SNR or dynamic range loss than one bit of noise in a 16-bit sample. The present invention satisfies this requirement by measuring the noise floor of sampled input signal 104 and then by preprocessing the signal to remove some of the noise.

Figure 18:
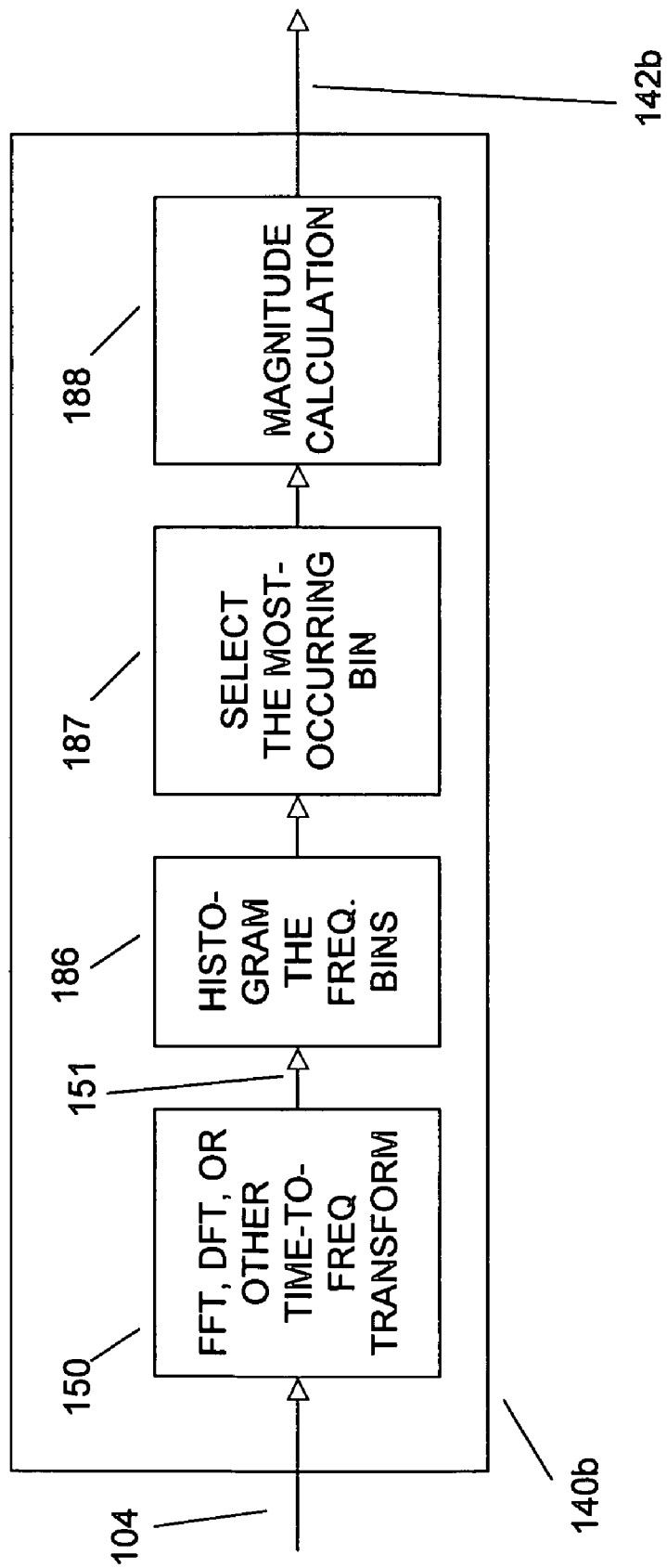
FIG. 18 shows a frequency domain noise floor estimation algorithm.
Figure 19:
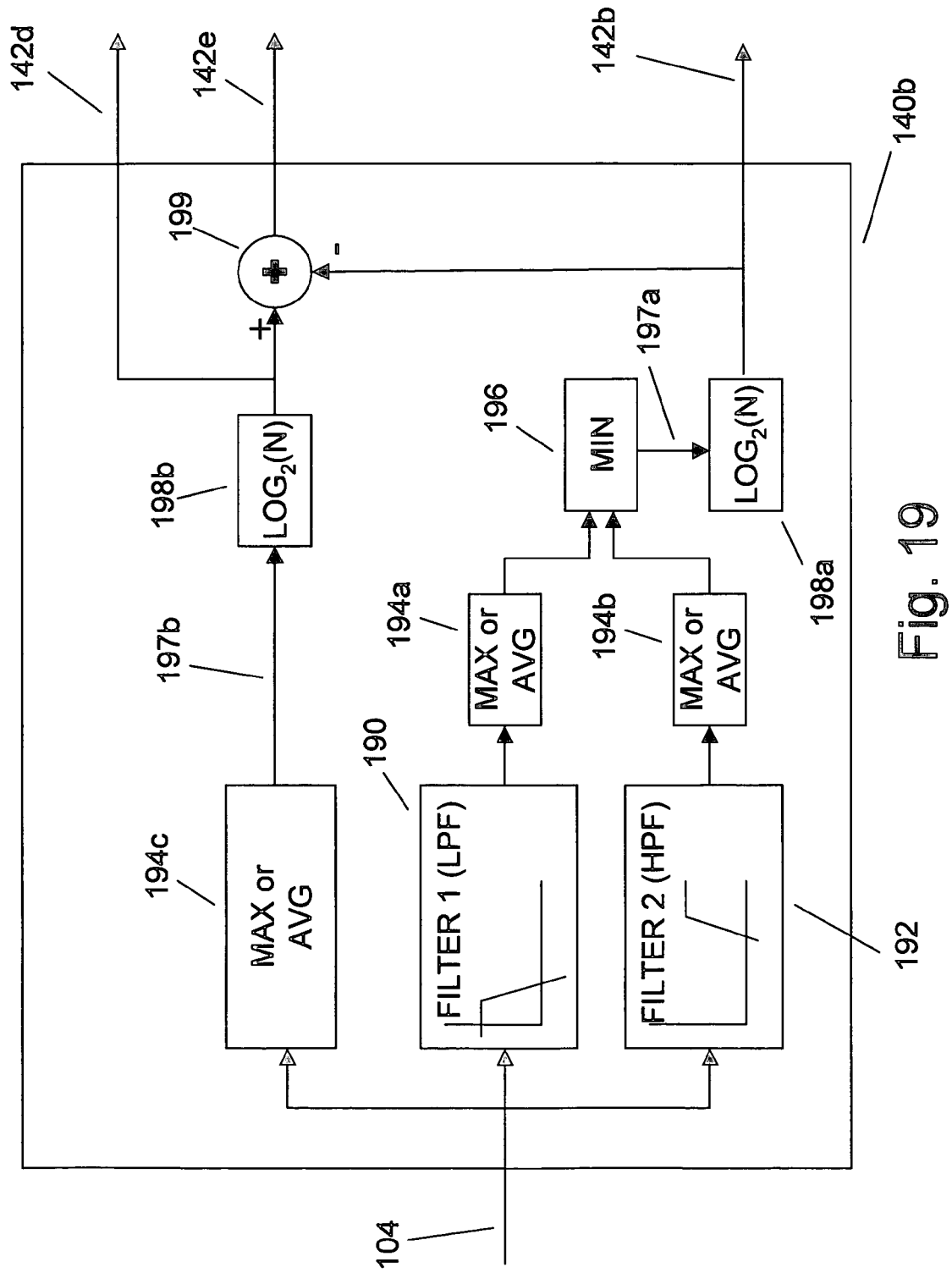
FIG. 19 shows a time domain noise floor estimation algorithm.

To continue the discussion of FIG. 6, after generating noise floor estimate 142b, a bit removal logic 144b removes the LSBs corresponding to noise floor estimate 142b prior to compression. In the preferred embodiment, bit removal logic 144b is implemented using a simple right-shift operation, or a multiplier and a right-shift operation together, where the multiplication factor and the number of bits in the right-shift operation are determined by noise floor estimate 142b. Other noise removal implementations are possible. For example, the input signal can simply be multiplied by a gain of less that 1.0, without a subsequent right-shift operation, to remove the noise floor (a gain of 0.5, for example, removes the LSB, while a gain of 0.125 removes 3 LSBs). A noise floor removal method incorporating a multiplier has the benefit of being able to remove fractions of LSBs, instead of integer numbers of LSBs. However, the fractional LSB noise floor removal technique requires a multiplier, which in hardware implementations is more complex (and thus more expensive in both silicon area and cost) than a simple right-shift operation, which is implemented in silicon as wiring between two registers. Thus while many prior art compression systems simply compress sampled input signal 104 without consideration of the signal's noise floor, the present invention improves the compression rate and reduces the distortion of follow-on compressor 110 by removing noisy LSBs of sampled input signal 104 prior to compression. FIGS. 18 and 19 provide example implementations of noise floor measurement/estimation logic 140b. FIGS. 20–24 further discuss the control and operation of bit removal logic 144b.

FIG. 7 demonstrates another method through which preprocessor 106 generates preprocessed signal 108 with lowpass characteristics, regardless of the center frequency of sampled input signal 104. Those skilled in the art of communication systems will recognize the well-known technique of heterodyning a signal, which translates the signal from one frequency to another. For example, an AM radio heterodynes an audio signal from its transmitted carrier frequency (from 530 kHz to 1.7 MHz) to baseband, centering the downconverted signal at DC (0 Hz). Heterodyning, or frequency translation, is a common operation in communication systems. The present invention utilizes heterodyning as a method for converting sampled input signal 104 with other than lowpass characteristics into a signal exhibiting lowpass characteristics. In FIG. 7, a center frequency and bandwidth measurement/estimation logic 140c generates a center frequency and bandwidth estimate 142c. Center frequency and bandwidth estimate 142c is coupled to a frequency translation logic 144c, which uses center frequency and bandwidth estimates 142c to determine how to heterodyne (frequency translate) sampled input signal 104 so that the resulting center frequency is at, or very close to, DC (0 Hz). Those skilled in the art of communication systems will recognize that frequency translation logic 144c lowers the frequency of sampled input signal 104, because the goal is that preprocessed signal 108 will have lowpass characteristics, regardless of the carrier frequency of sampled input signal 104. The operation of preprocessor 106 when configured as a downconverter is further discussed with FIGS. 27 and 28.

FIGS. 8 thru 11 describe two methods (one in the frequency domain, one in the time domain) for calculating the signal period, first discussed with FIG. 5.

Figure 8:
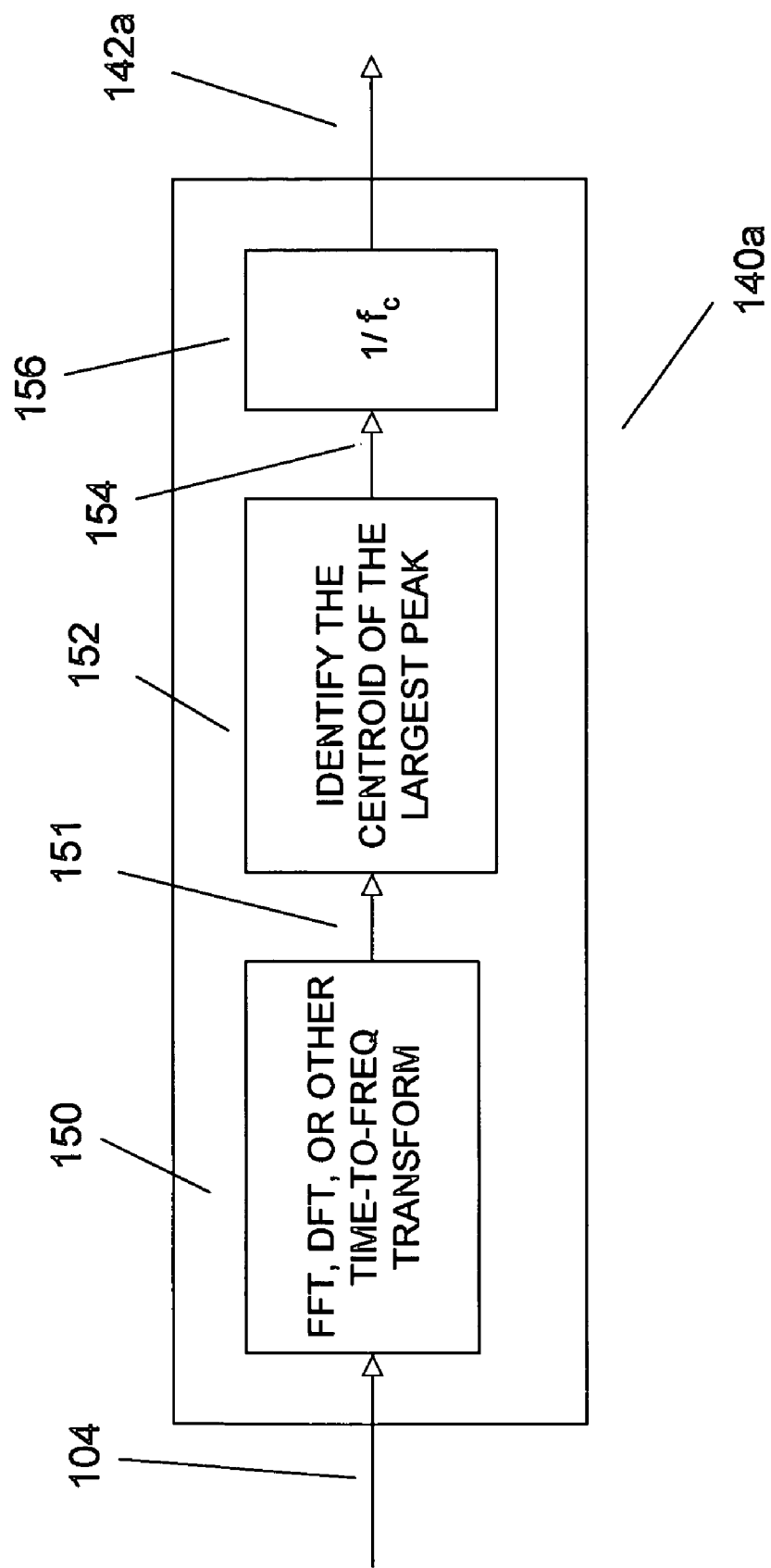
FIG. 8 shows a frequency domain signal period estimation algorithm.
Figure 9:
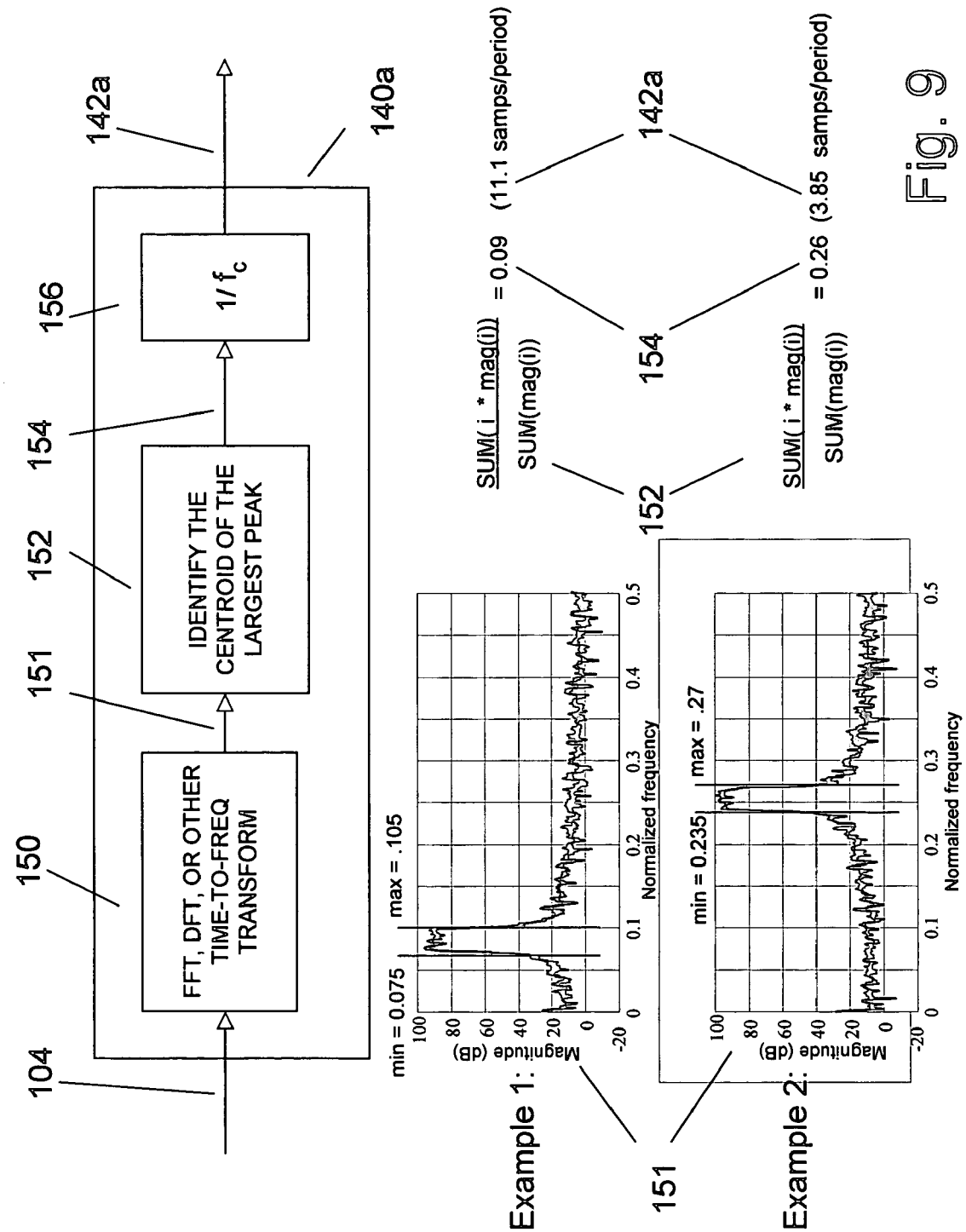
FIG. 9 shows two examples of FIG. 8's signal period estimation algorithm in operation.

FIG. 8 demonstrates a frequency-domain signal period estimation method. Sampled input signal 104 is provided to a frequency transformation logic 150, which may be implemented as a fast Fourier transform (FFT), discrete Fourier transform (DFT), or other time-domain to frequency-domain transform appropriate for sampled data. Frequency transformation logic 150 generates a signal spectrum 151 that is processed by a centroid calculation logic 152. The centroid is a mathematical function that calculates the weighted average of frequency cells above a certain threshold. FIG. 9 provides two centroid calculation examples. The centroid calculation results in a center frequency estimate. But since the goal of signal period measurement/estimation logic 140a (shown in FIG. 8) is period estimate 142a, a reciprocal function 156 converts the center frequency estimate to a signal period estimate, in units of samples per period. The signal period can be an integer or a floating-point value (with integer and fractional parts).

FIG. 9 demonstrates two example centroid calculations. In Example 1, frequency transformation logic 150 generates a signal spectrum 151 whose signal of interest lies between the normalized frequencies 0.075 to 0.105. The normalized frequency is simply the frequency of the lower or upper band-edge of the signal of interest (in Hz) divided by the sampling rate (in Hz). The centroid calculation multiplies the location of each normalized frequency bin from i=0.075 to i=0.105 by the magnitude of its corresponding frequency bin, mag(i), and then divides that weighted sum by the sum of all magnitudes in that frequency range. In Example 1, the weighted average thus calculated is 0.09. Finally, the desired signal period estimate 142a is obtained by taking the reciprocal of the normalized center frequency estimate: 1/0.09=11.1 samples per period.

In Example 2 of FIG. 9, frequency transformation logic 150 generate a signal spectrum 151 whose signal of interest lies between the normalized frequencies 0.235 to 0.27. The centroid calculation results in a value of 0.26. Finally, the desired signal period estimate 142a for Example 2, obtained by taking the reciprocal of the normalized center frequency estimate, is 1/0.26=3.85 samples per period.

Figure 10:
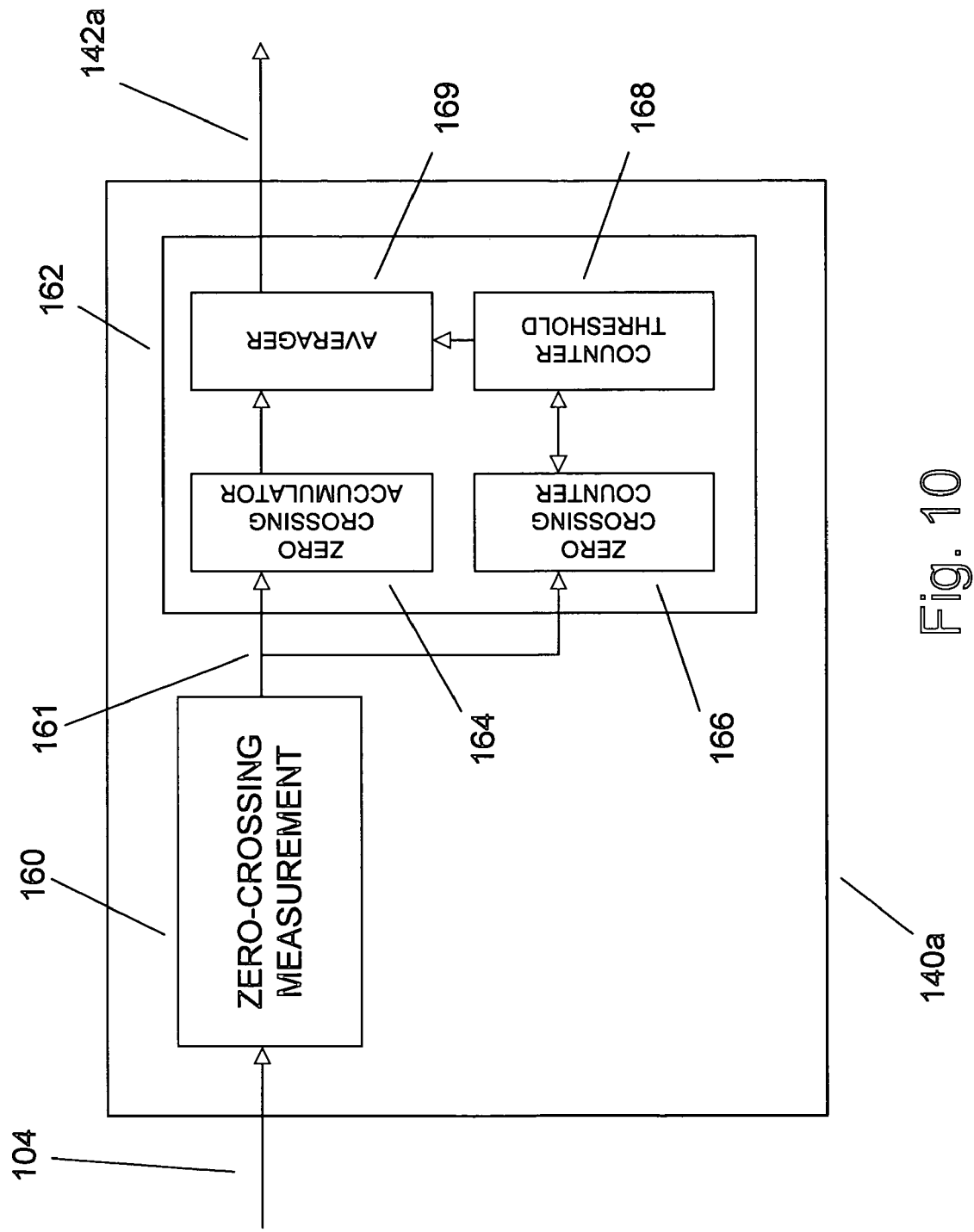
FIG. 10 shows a time domain signal period estimation algorithm.

FIG. 10 illustrates a time-domain signal period estimation algorithm, an alternative method for implementing signal period measurement/estimation logic 140a. Sampled input signal 104 is examined by a zero crossing measurement logic 160, which identifies the occurrence of positive-going zero crossings. A positive-going zero crossing is simply an occurrence of a change in sign from a negative value to a positive value of sampled input signal 104. Zero crossing measurement logic 160 generates a zero crossing duration 161 with each positive-going zero crossing and provides a sequence of zero crossing duration 161 instances to a zero crossing averaging logic 162. Zero crossing averaging logic 162 accumulates each zero crossing duration 161 in a zero crossing accumulator 164 and increments a zero-crossing event counter 166 with each new zero crossing event. When zero-crossing event counter 166 reaches an event counter threshold 168 (specified by user 112 or control block 114 as part of preprocessor control parameters 118a), averager 169 divides the contents of zero crossing accumulator 164 by the contents of the zero-crossing event counter 166, generating period estimate 142a. To simplify the implementation of averager 169 in the preferred embodiment of zero crossing averaging logic 162, event counter threshold 168 contains a power of 2, and averager 169 right-shifts the contents of zero crossing accumulator 164 by $\log_2$(event counter threshold 168) bits.

Figure 11:
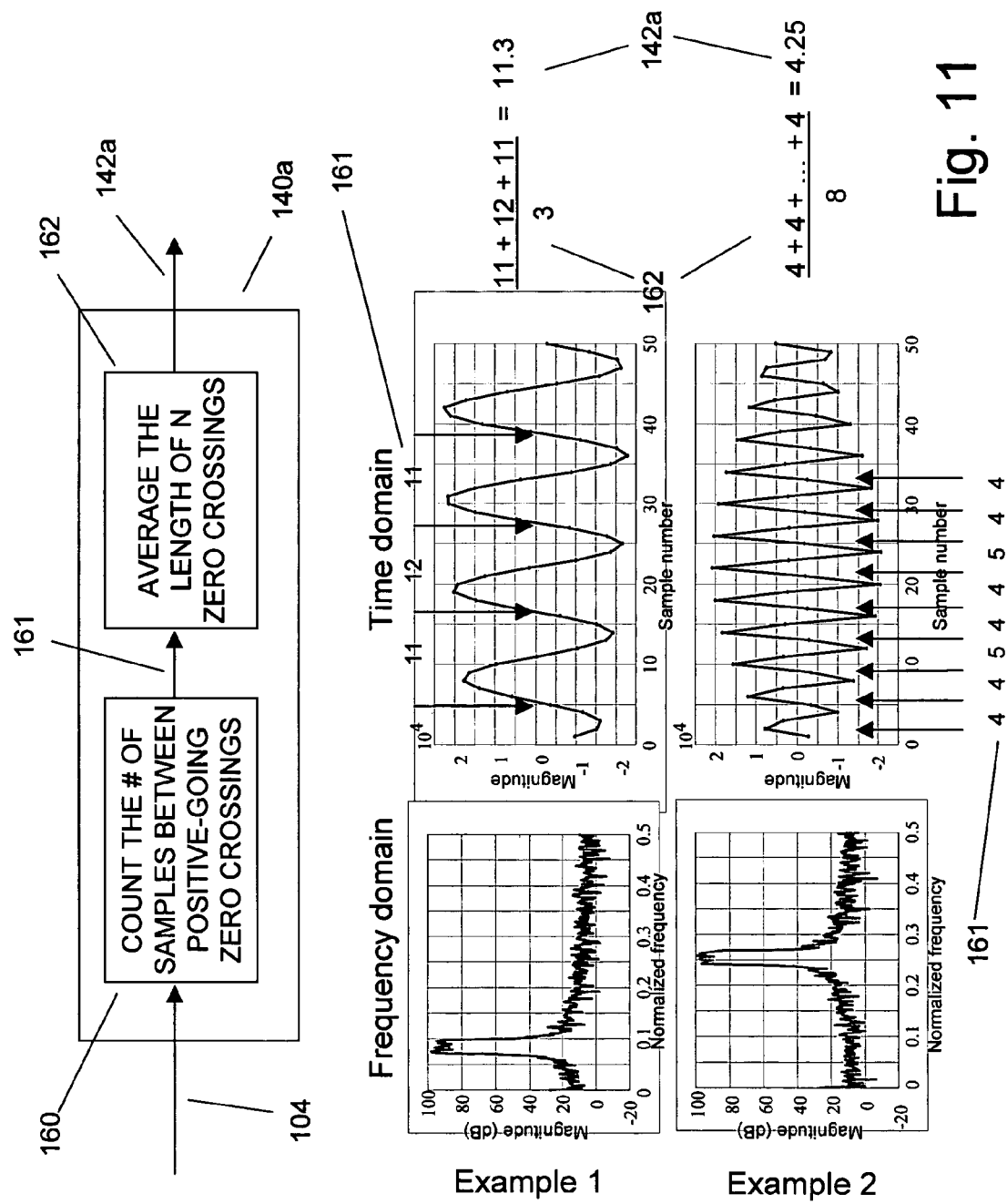
FIG. 11 shows two examples of FIG. 10's signal period estimation algorithm in operation.

FIG. 11 demonstrates two examples of the operation of FIG. 10's time-domain signal period estimator. In Example 1, three zero crossing durations 161 contain the values 11, 12, and 11. Zero crossing averaging logic 162 accumulates and averages these values and calculates a signal period estimate 142a of 11.3 samples per period. In Example 2, a stream of eight zero crossing durations 161 contain 4, 4, 5, 4, 4, 5, 4, 4. Zero crossing averaging logic 162 accumulates and averages these values and calculates a signal period estimate 142a of 4.25 samples per period.

Figure 12:
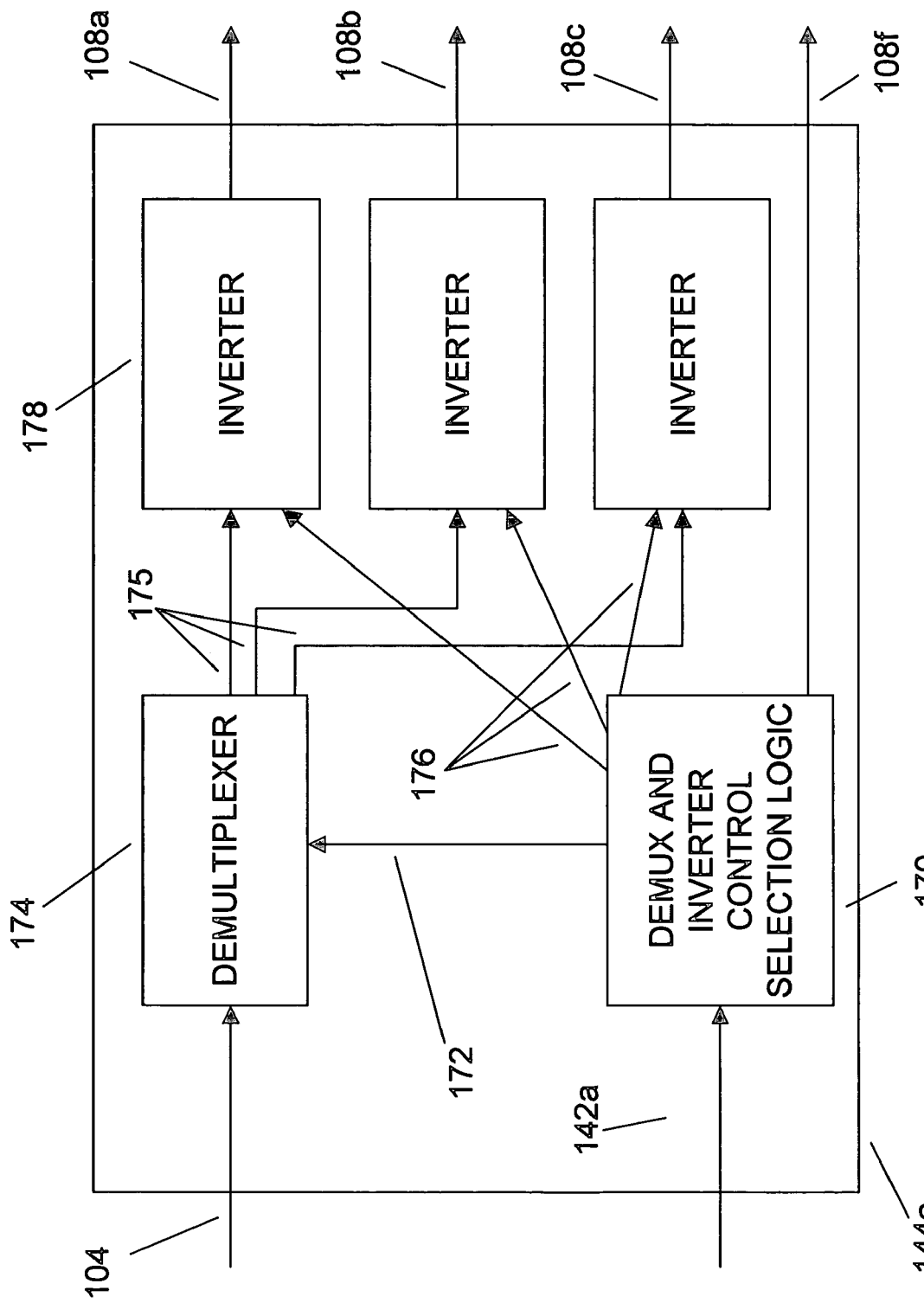
FIG. 12 shows an example of how a sample period estimate controls FIG. 5's adaptive sample reordering and inversion algorithm.

FIG. 12 illustrates the operation of reordering and inversion logic 144a. A purpose of preprocessor 106 is to create a signal with lowpass characteristics that can be effectively compressed by compressor 110, regardless of the characteristics of sampled input signal 104. Reordering and inversion logic 144a creates preprocessed signal 108 by selectively changing the order of samples, and by selectively inverting certain samples, of sampled input signal 104. The specific reordering and sample inversion operations vary, depending on period estimate 142a. In FIG. 12, a demultiplexer and inverter control selection logic 170 receives period estimate 142a and makes a decision (further described with FIG. 13) about how a demultiplexer 174 and one or more of an inverter 178 are operated. Demultiplexer and inverter control selection logic 170 is coupled to demultiplexer 174 through a demultiplexer control logic 172. Demultiplexer and inverter control selection logic 170 is coupled to inverter 178 through inverter control logic 176. Depending on the value of period estimate 142a, demultiplexer 174 generates one ore more unique signal streams from sampled input signal 104. In FIG. 12, demultiplexer 174 generates up to three demultiplexed signal streams. Reordering and inversion logic 144a contains enough instantiations of inverter 178 to process each of demultiplexer 174's demultiplexed signals. Alternately, only one inverter 178 could be used, as long as inverter 178 is controlled by demultiplexer and inverter control selection logic 170 to invert the proper samples of demultiplexed signals 175. In FIG. 12, reordering and inversion logic 144a provide one, two, or three preprocessed signals 108a, 108b, and 108c, respectively, depending on the operation of demultiplexer 174. Each of preprocessed signals 108a, 108b, and 108c exhibit lowpass characteristics, regardless of the original characteristics of sampled input signal 104. Reordering and inversion logic 144a also provides an output preprocessor control parameter 108f, to indicate the control decisions made by demultiplexer and inverter control selection logic 170.

Figure 13:
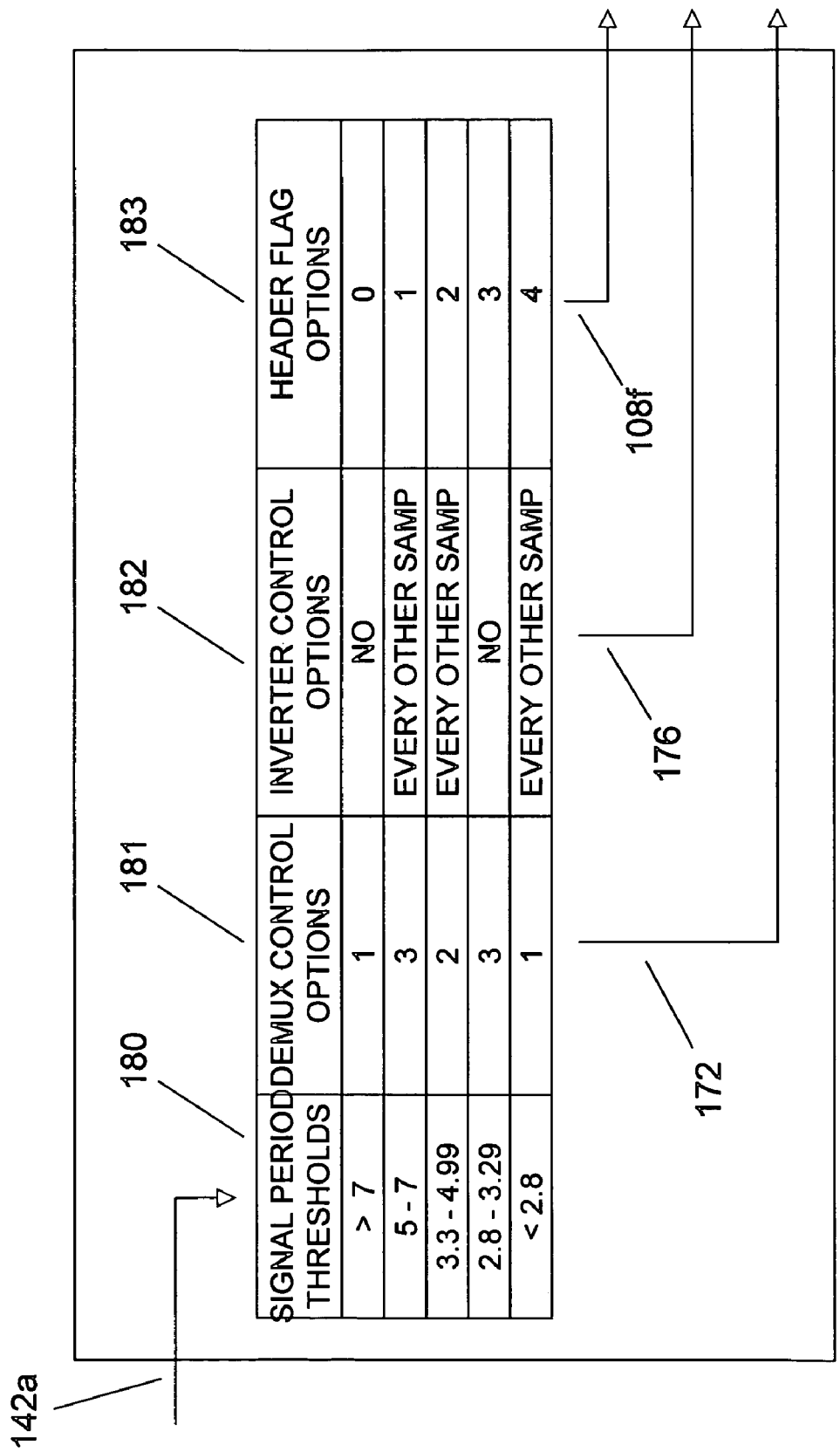
FIG. 13 shows an example of FIG. 12's demultiplexing and inversion control lookup table, whose output is based on an input estimate of signal period.

FIG. 13 provides details of the function of demultiplexer and inverter control selection logic 170. In the preferred embodiment, period estimate 142a is used as input to a lookup table with multiple columns. The table's second column contains a list of demultiplexer control options 181; its third column contains a list of inverter control options 182; and its fourth column contains a list of header flag options 183. Period estimate 142a is compared to a series of signal period thresholds 180 in the table's first column, and the particular row that corresponds to period estimate 142a is selected. Those skilled in the art will recognize that a lookup table is a structure that supports reprogramming of the operation of demultiplexer and inverter control selection logic 170. Such reprogrammability is a valuable benefit to the present invention, because it allows different demultiplexing and inversion control decision to be implemented simply by reprogramming the lookup table. The row that was chosen using signal period thresholds 180 and period estimate 142*a* is used to select a particular demultiplexer control logic 172 from demultiplexer control options 181. Similarly, the row that was chosen using signal period thresholds 180 and period estimate 142*a* is used to select a particular inverter control logic 176 from inverter control options 181. Finally, in order to embed the demultiplexer and inverter control decision into a header that can be sent with compressed/encoded signal 119, a list of header flag options 183 is provided. The row that was chosen using signal period thresholds 180 and period estimate 142*a* is used to select a particular preprocessor control parameter 108*f* from header flag options 183. Preprocessor control parameter 108*f* can optionally be included for subsequent encoding in the header(s) of compressed/encoded signal 119.

FIGS. 14 through 17 provide examples of the operation of reordering and inversion logic 144*a* during compression, and the corresponding operations in postprocessor 128 that un-do the operations of reordering and inversion logic 144*a* during decompression.

Figure 14:
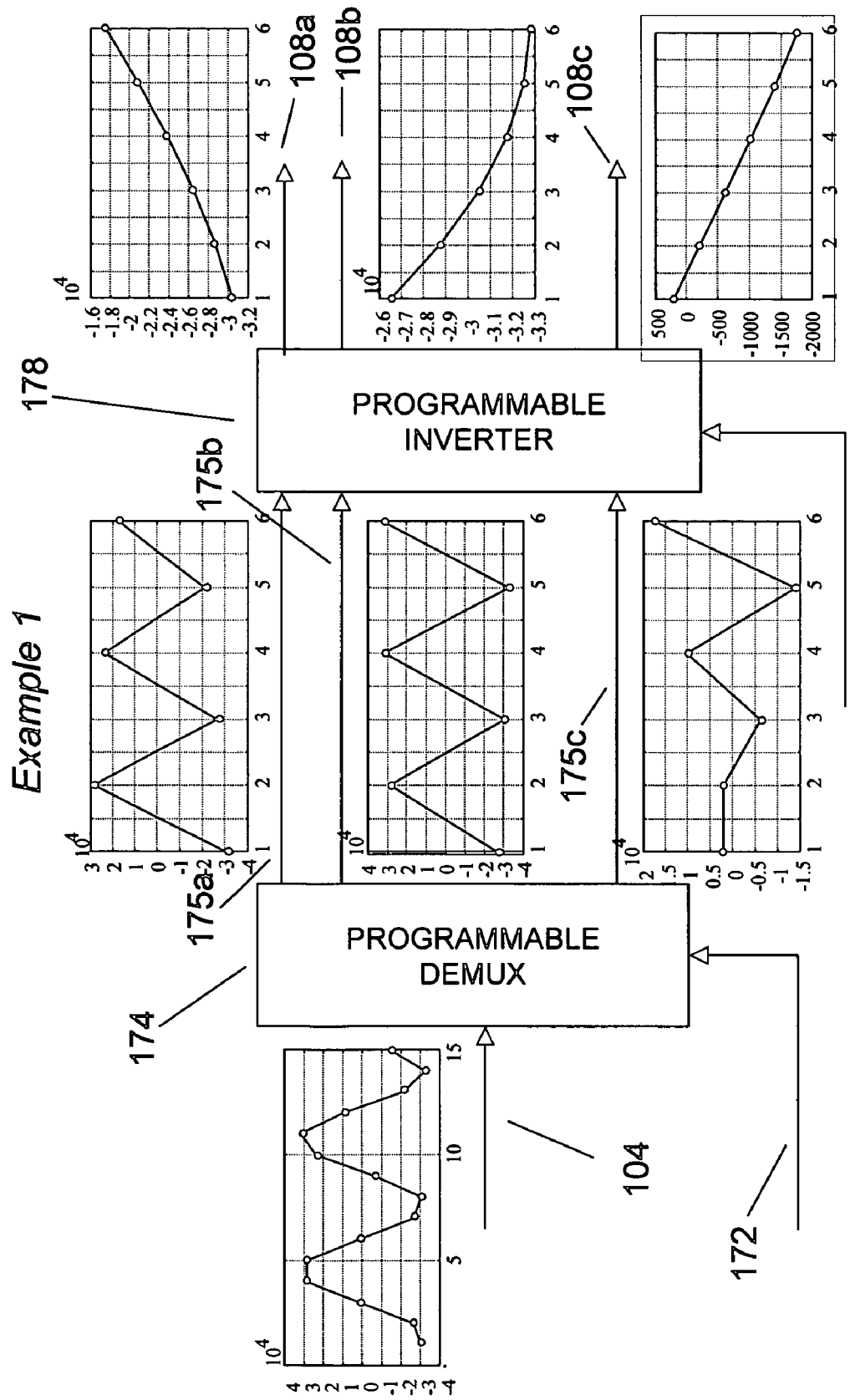
FIG. 14 shows an example of FIG. 12's operation when the signal period results in a demultiplexing by 3 and inversion of every other demultiplexed sample.

In the example in FIG. 14, demultiplexer control logic 172 is set to 3, meaning that every third sample of sampled input signal 104 is used to generate a demultiplexed signal 175. In the example in FIG. 15, three demultiplexed signals 175*a*, 175*b*, and 175*c* are created. Signal 175*a* contains samples x(1), x(4), x(7), . . . , x(3n+1), while signal 175*b* contains samples x(2), x(5), x(8), . . . , x(3n+2), and signal 175*c* contains samples x(3), x(6), x(9), . . . , x(3n+3), where n=0, 1, 2, . . . , and x(i) is sample i from sampled input signal 104. In the example in FIG. 14, demultiplexed signals 175*a*, 175*b*, and 175*c* are provided as input to inverter 178, which is controlled by inverter control logic 176. In this example, every other sample of each demultiplexed signal 175*a*, 175*b*, and 175*c* are to be inverted. Thus demultiplexed signal 175*a* is transformed into preprocessed signal 108*a* by the inversion of every other sample, generating x(1), −x(4), x(7), −x(10), etc. Similarly, demultiplexed signal 175*b* becomes preprocessed signal 108*b* by the inversion of every other sample, generating x(2), −x(5), x(8), −x(11), etc., and demultiplexed signal 175*c* becomes preprocessed signal 108*c* by the inversion of every other sample, generating x(3), −x(6), x(9), −x(12), etc. An observation of the time-domain waveform that represents the samples of sampled input signal 104 illustrates that it has a distinct carrier frequency, with period estimate 142*a* of about six samples per cycle. With such a signal period, it is distinctly not a lowpass signal. However, preprocessed signals 108*a*, 108*b*, and 108*c* are each lowpass signals, with high correlation from sample to sample. Thus while FIG. 14's example input signal 104*a* does not exhibit lowpass characteristics, the resulting preprocessed signals 108*a*, 108*b*, and 108*c* do exhibit lowpass characteristics, and are thus each better compressed by compressor 110 than could the original sampled input signal 104.

In the example in FIG. 15, demultiplexer control logic 172 is set to 1, meaning that input signal 104 is unchanged by demultiplexer 174 in generating demultiplexed signal 175. In the example in FIG. 15, demultiplexed signal 175 is provided to inverter 178, which is controlled by inverter control logic 176. In this example, every other sample of each demultiplexed signal 175 is to be inverted. Thus demultiplexed signal 175 is transformed into preprocessed signal 108 by the inversion of every other sample, generating x(1), −x(2), x(3), −x(4), etc. An observation of the time-domain waveform that represents the samples of sampled input signal 104 illustrates that it was distinctly a highpass signal, with a signal period estimate 142 of about 2 samples per period. However, preprocessed signal 108 is clearly a lowpass signal, with high correlation from sample to sample as shown by the output waveform in FIG. 15. While FIG. 15's example input signal 104 does not exhibit lowpass characteristics, the resulting preprocessed signals 108 clearly exhibits lowpass characteristics. Thus through the operation of reordering and inversion logic 144*a*, preprocessed signal 108 can be better compressed by compressor 110 than could the original sampled input signal 104.

Figure 16:
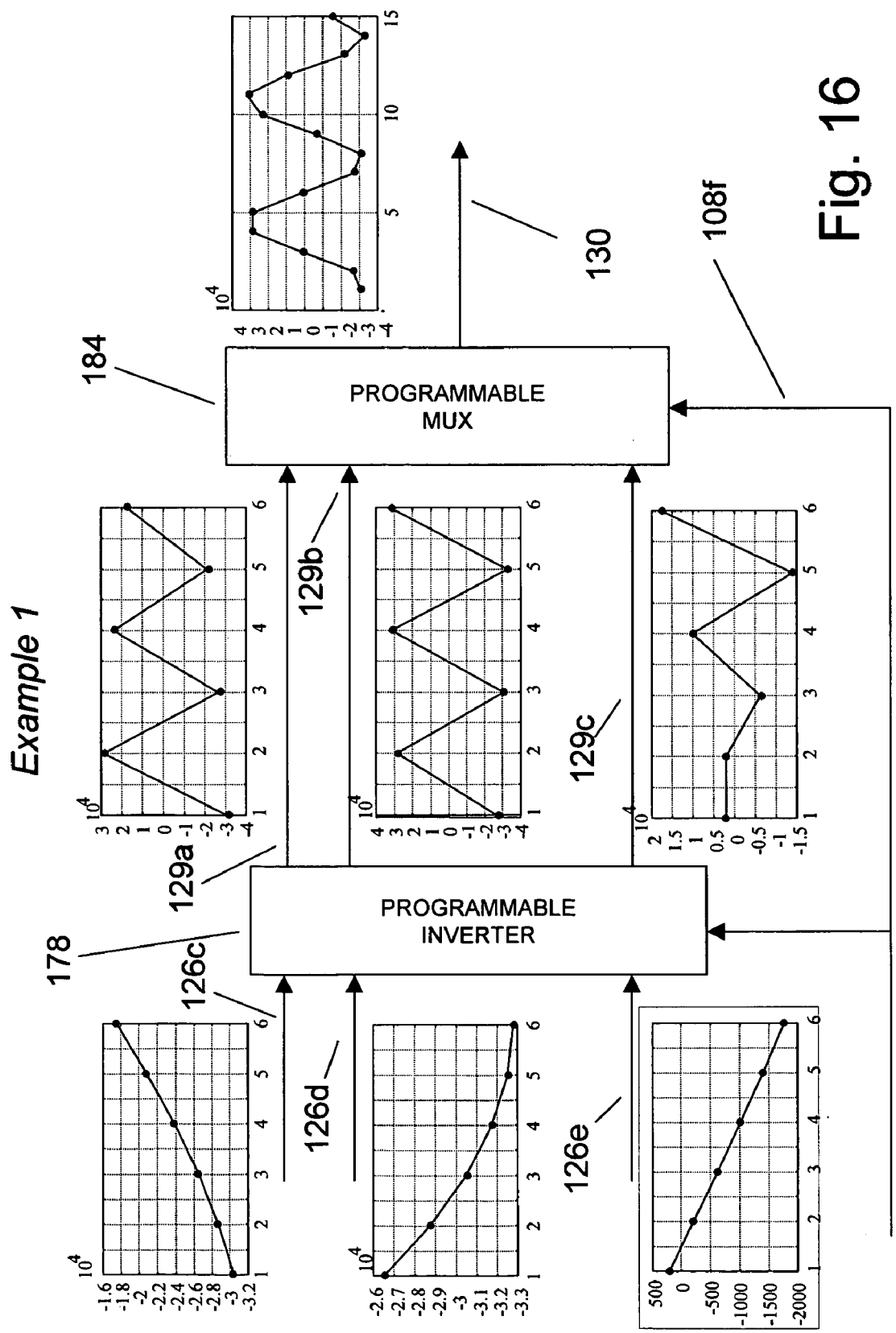
FIG. 16 shows an example of how FIG. 14's original signal is recovered through inversion followed by multiplexing.

FIG. 16 shows the operation of part of postprocessor 128 in un-doing the operations of FIG. 14's reordering and inversion logic 144*a*. Preprocessor control parameter 108*f* is used to control inverter 178. In Example 1 in FIG. 16, preprocessor control parameter 108*f* causes inverter 178 to invert every other sample of three streams of decompressed signal, labeled 126*c*, 126*d*, and 126*e*, respectively. In postprocessor 128, decompressed signals 126*c*, 126*d*, and 126*e* correspond to FIG. 14's preprocessed signals 108*a*, 108*b*, and 108*c*, respectively. Inverter 178 outputs three inverter output signals 129*a*, 129*b*, and 129*c*, respectively, which are multiplexed by a multiplexer 184 into postprocessed signal 130. For Example 1 in FIG. 16, postprocessor control parameter 108*f* causes multiplexer logic 184 to multiplex the three inverter output signals 129*a*, 129*b*, and 129*c* into postprocessed signal 130. Notice that FIG. 16's postprocessed signal 130 is identical to FIG. 14's sampled input signal 104, as is expected using the lossless compression operating mode of the present invention.

FIG. 17 shows the operation of part of postprocessor 128 in un-doing the operations of FIG. 15's reordering and inversion logic 144*a*. Preprocessor control parameter 108*f* controls inverter 178. In Example 2 in FIG. 17, preprocessor control parameter 108*f* causes inverter 178 to invert every other sample of decompressed signal 126, creating inverter output signal 129. Decompressed signal 126 corresponds to preprocessed signal 108 of FIG. 15. Multiplexer 184 receives inverter output signal 129 and, as controlled by preprocessor control parameter 108*f* in this example, simply passes the samples through to generate post-processed signal 130. Notice that FIG. 17's postprocessed signal 130 is identical to FIG. 15's sampled input signal 104, as is expected using the lossless compression operating mode of the present invention.

FIGS. 18 through 24 provide additional details about the operation of FIG. 6, in which a sampled data preprocessor is configured to adapt to the noise floor of sampled data signal 104.

FIG. 18 shows the internal operation of noise floor measurement/estimation logic 140*b*. Specifically, FIG. 18 describes a frequency-domain noise floor estimation algorithm.

Sampled input signal 104 is converted from the time domain to the frequency domain by frequency transformation logic 150. The output of frequency transformation logic 150, signal spectrum 151, is further processed by a histogramming logic 186, which places the frequency domain values in a histogram. Because bandlimited signals only occupy a percentage of the total frequency band from DC (0 Hz) to fs/2 (the Nyquist frequency), histogramming the frequency-domain values will place the most frequently-occurring frequency-domain values in the most-populated histogram bin. The most-populated histogram bin is chosen by a maximum selection logic 187, and its magnitude is determined by a magnitude calculation logic 188, which represents the level of the noise floor and thus becomes noise floor estimate 142*b*.

FIG. 19 portrays a novel time-domain noise floor estimation algorithm. Sampled input signal 104 is filtered by a lowpass filter (LPF) 190 and a highpass filter (HPF) 192. LPF 190 and HPF 192 have a bandwidth of approximately 10% of the sampling rate used to sample sampled input signal 104. For example, if the sampling rate $f_s$=100 MHz, the passbands of LPF 190 and HPF 192 would both have a 10 MHz bandwidth. With such a setting, the smaller of the two outputs of LPF 190 and HPF 192 contains a time-domain sequence of samples that represents the magnitude of the noise level present in sampled input signal 104. The reason for this result is that a bandlimited signal of interest (less than even 50% spectral occupancy) can never simultaneously reside in the passbands of both LPF 190 and HPF 192. Thus the filter with the smaller output is monitoring the noise floor. The following table provides three examples (each with a different bandlimited signal center frequency) of the operation of FIG. 19's time-domain noise floor estimation method 140*b*, assuming a bandlimited signal bandwidth of 20 MHz, a sampling rate of 100 Msamp/sec, and an SNR of 50 dB:

estimate 142*e* is obtained simply by subtracting noise floor estimate 142*b* from signal level estimate 142*d*. In FIG. 19, adder 199 performs this subtraction. To summarize, FIG. 19 portrays a novel time-domain noise floor estimation method, suitable for high-speed implementation in a field-programmable gate array (FPGA), application-specific integrated circuit (IC), or as part of an analog-to-digital converter due to its simplicity. The operations described in FIG. 19 generate three critical parameters of sampled input signal 104: signal level estimate 142*d*, signal-to-noise ratio estimate 142*e*, and noise floor estimate 142*b*.

FIG. 20 provides details of operation of preprocessor 106 when configured to reduce the noise level caused by random LSBs in sampled input signal 104. Specifically, FIG. 20 demonstrates how a noise floor estimate 142*b* controls the operation of bit removal logic 144*b*. Noise floor estimate 142*b*, obtained from a frequency-domain method such as that described in FIG. 18 or from a time-domain method such as that described in FIG. 19, or similar, is provided to noise floor to bit removal converter 200. Noise floor estimate 142*b* is usually expressed in units of dB, such as 12.7 dB. The value used to control the operation of bit removal logic 144*b* (implemented in the preferred embodiment as a multiplier and a right-shift operation) is related to noise floor estimate 142*b* in the following manner:

Bit removal control parameter 202=noise floor estimate 142*b*/6.02

| Bandlimited center freq | Minimum signal freq | Maximum Signal freq | LPF filter output level | HPF filter output level | min (LPF level, HPF level) |
|---|---|---|---|---|---|
| 10 MHz | 0 MHz | 20 MHz | 0 dB | −50 dB | −50 dB |
| 25 MHz | 15 MHz | 35 MHz | −50 dB | −50 dB | −50 dB |
| 40 MHz | 30 MHz | 50 MHz | −50 dB | 0 dB | −50 dB |

The example in the table demonstrates that, no matter what the center frequency of sampled input signal 104, the minimum of the output of LPF 190 and the output of HPF 192 represents the noise floor level. The output values of LPF 190 and HPF 192 are monitored by a LPF signal maximum selection or averaging logic 194*a* and HPF signal maximum selection or averaging logic 194*b* to determine the signal energy in the respective LPF and HPF filters. The outputs of the LPF and HPF signal maximum selection or averaging logic 194*a* and 194*b*, respectively, are passed to a minimum selection logic 196, whose output, a noise floor magnitude estimate 197*a*, represents the level of the smaller of the LPF and the HPF signal magnitudes. This minimum value represents the magnitude of the noise floor. Because noise levels and SNR levels are often calculated in dB, rather than in magnitude, a noise base 2 logarithm logic 198*a* is used to convert noise floor magnitude estimate 197*a* into the final noise floor estimate 142*b*, expressed in dB. Those skilled in the art will recognize that the magnitude noise level can be calculated from the dB noise level and that the dB noise level can be calculated from the magnitude noise level. An input signal maximum selection or averaging logic 194*c* monitors the signal level of sampled input signal 104 and generates a signal magnitude estimate 197*b*. A signal base 2 logarithm logic 198*b* converts signal magnitude estimate 197*b* into a signal level (dB) estimate 142*d*. Because noise floor estimate 142*b* and signal level estimate 142*d* are both expressed in dB, a signal-to-noise ratio Those skilled in the art will recognize the familiar and often-used relationship that relates the dynamic range of a signal (expressed in dB) and a sample width (expressed in bits): dynamic range (sample width)=dynamic range (dB)/6.02. This well-known relationship is a result of the magnitude-to-dB conversion equation:

dB=20*$\log_2$ (magnitude)

When magnitude=2.0, dB=6.02, so each bit of a sample in sampled input signal 104 represents 6.02 dB of dynamic range. Noise floor to bit removal converter 200 divides the noise floor estimate (in dB) by 6.02 to generate bit removal control parameter 202 For example, if noise floor estimate 142*b* were 14 dB, bit removal parameter 202 would be 14/6.02=2.33 bits. If sampled input signal 104 was sampled using a 16-bit A/D converter, a noise floor of 14 dB indicates that the signal only requires a dynamic range of 13.67 bits (16−2.33 bits) or 82.3 dB, rather than the available 16-bit range of 16×6.02=96.3 dB. Thus bit removal logic 144*b* can safely remove 2.33 least significant bits (if bit removal logic 144*b* supports fractional bit removal) or 2 bits (if bit removal logic 144*b* only supports integer bit removal) of each sample of sampled input signal 104, without adversely affecting the dynamic range of the signal representation.

Figure 21:
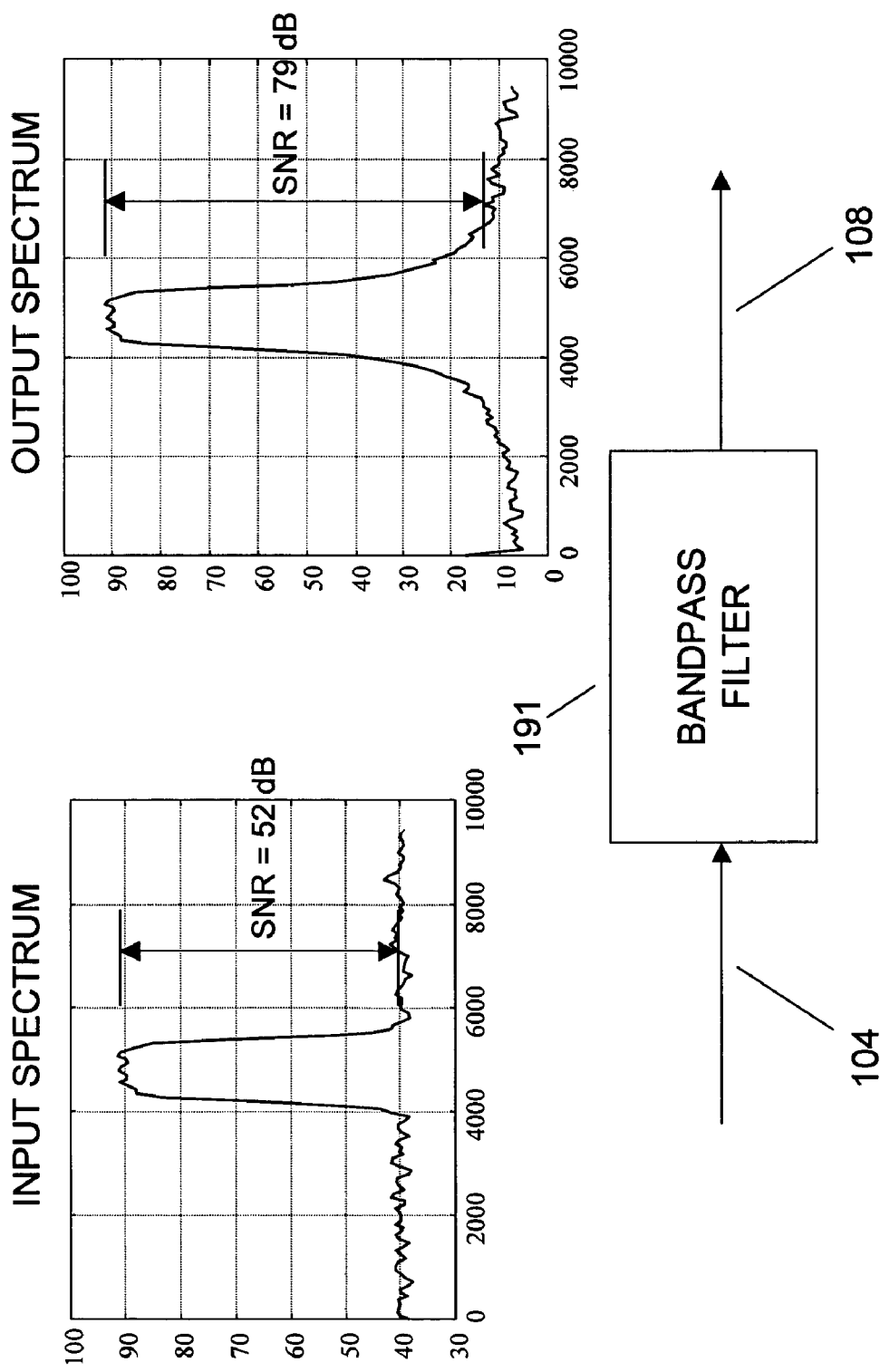
FIG. 21 illustrates how digital filtering in the preprocessor improves the SNR of a signal, thus increasing redundancy prior to compression.

FIG. 21 illustrates an example of how the SNR of a signal can be improved by filtering. The higher the SNR of the signal to be compressed, the better the compression results will be. As explained earlier, signals with low SNR have an elevated noise floor that contains random, uncorrelated values in the LSBs of each sample. Filtering the signal to remove the noise outside the band of interest decreases the noise (the random, uncompressible parts) of the signal, and thus increases the compressibility of the signal. FIG. 21 illustrates the spectrum of sampled input signal 104, with input SNR of 52 dB. A bandpass filter (BPF) 191 filters sampled input signal 104. BPF 191 can be implemented digitally as a finite impulse response (FIR) or infinite impulse response (IIR) digital filter. The parameters of BPF 191 are chosen to attenuate frequencies away from the signal of interest. In FIG. 21, the signal of interest ranges from 4 MHz to 5.5 MHz, and the stopband attenuation of the bandpass filter is 25 to 30 dB. After filtering, FIG. 21 shows the spectrum of preprocessed signal 108, demonstrating an SNR after filtering of 79 dB, an improvement of about 27 dB. Because the SNR has been improved by attenuating the out-of-band noise energy, preprocessed signal 108 will be more effectively compressed by a follow-on compressor 110 (not shown in FIG. 21), when compared to the compression of sampled input signal 104 before filtering. Filtering is one of the preprocessing methods available to the present invention to improve compression performance.

Figure 22:
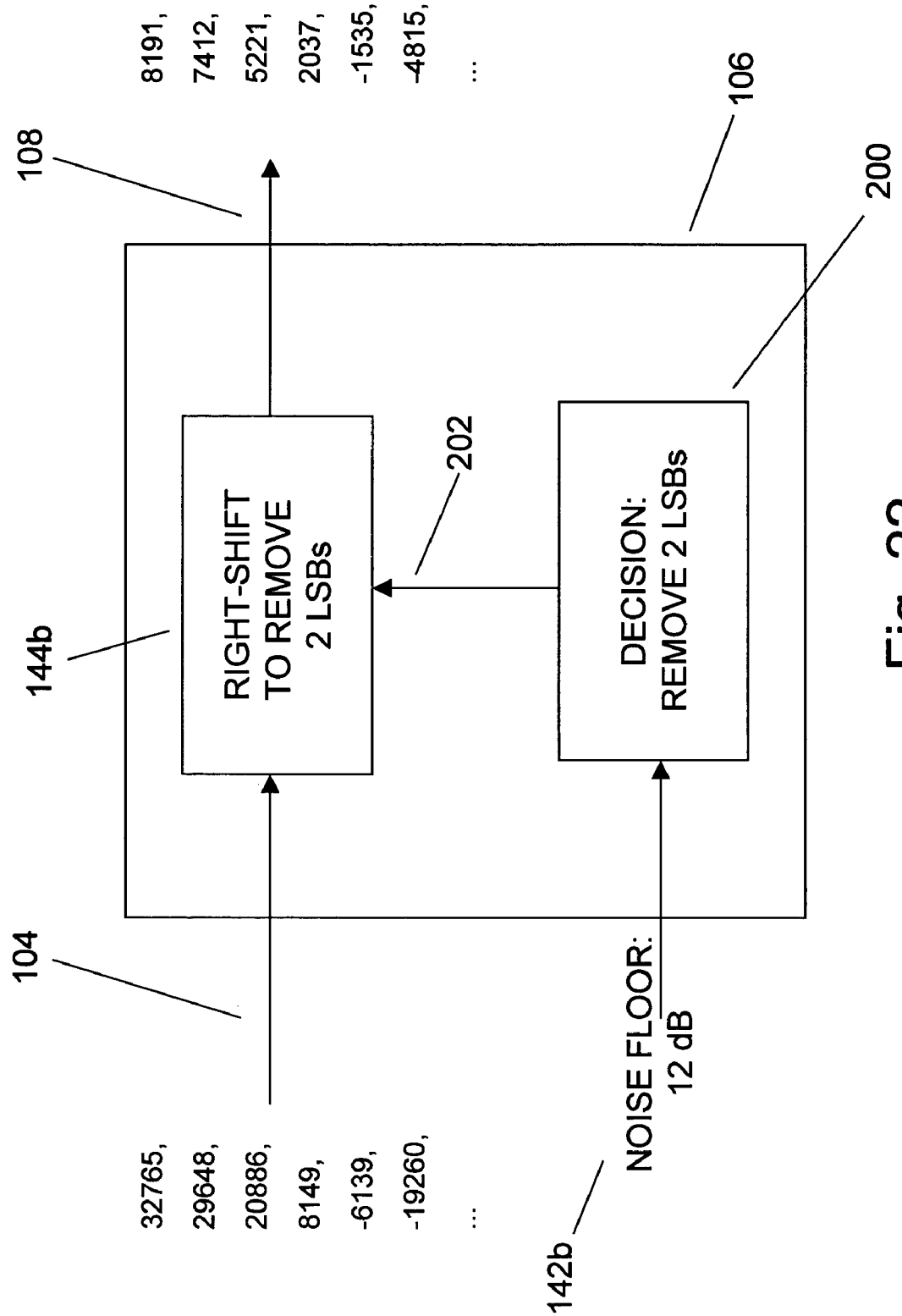
FIG. 22 shows an example of FIG. 20's LSB removal algorithm based on a noise floor estimate.

FIG. 22 demonstrates how preprocessor 106, configured to remove an integer number of LSBs, operates on an example stream of samples from sampled input signal 104. Sampled input signal 104 begins with the six samples: 32765, 29648, 20886, 8149, −6139, and −19260. With noise floor estimate 142b of 12 dB, noise floor to bit removal converter 200 determines that two LSBs are to be removed from each input sample. The removal of two LSBs from each input sample results in preprocessed signal 108, which begins with the sample sequence: 8191, 7412, 5221, 2037, −1535, and −4815.

FIG. 23 demonstrates in both the time domain and frequency domain that the LSBs of sampled input signal 104 can be removed to a degree determined by the signal's noise floor without adversely affecting the usefulness of the time-domain signal or its frequency-domain spectrum. In the example of FIG. 23, sampled input signal 104 has an input SNR of about 50 dB (peak of 80 dB, noise floor of 30 dB). Input signal 104 is processed by bit removal logic 144b. In the particular example shown in FIG. 23, bit removal logic 144b removes six LSBs from each sample of input signal 104. As described in FIG. 22, noise floor estimate 142b determines the value of bit removal control parameter 202, which is set to 6 bits in this example. To illustrate what effect the removal of these six LSBs has on the signal, preprocessed signal 108 is further processed by postprocessor 128, which is configured to restore LSBs by right-shifting the received samples of preprocessed signal 108 by 6 bits, replacing the 6 removed LSBs with zeros.

The time-domain and frequency-domain representations of postprocessed signal 130 are shown in FIG. 23. FIG. 23 shows the first 10 samples of sampled input signal 104 and the first 10 samples of postprocessed signal 130. Each sample of postprocessed signal 108 is a multiple of 64 ($2^6$), because all six LSBs of postprocessed signal 130 contain zeros. However, it should also be noted that the input and output time-domain waveforms shown in FIG. 23 are virtually indistinguishable to the naked eye, despite the missing LSBs. More importantly, comparing the input and output spectra (before and after removing 6 LSBs) demonstrates that the spectra has also not been adversely or noticeably affected by the removal of 6 LSBs. This is ONLY the case because the noise floor of the example input signal was at a level that permitted the removal of 6 LSBs. To summarize, FIG. 23 demonstrates that the removal of LSBs to a level determined by the noise floor does not adversely affect either the time-domain or the frequency-domain representation of sampled input signal 104. However, the compression ratio achieved by compressing preprocessed signal 108, rather than sampled input signal 104, is significant. In this example, while sampled input signal 104 requires 16 bits per sample, preprocessed signal 108 only has 10 bits per sample (after the 6 LSBs are removed). Thus the compression performance is significantly improved by preprocessor 106's LSB removal, while not significantly affecting either the time-domain or the frequency-domain representation of sampled input signal 104. Those skilled in the art will be aware that designers of electronic systems do not always know the noise floor of the analog signals they process. Furthermore, the noise floor of sampled input signal 104 can vary from time to time. An additional factor is that an N-bit A/D converter does not contain N equally useful bits. Those skilled in the art of A/D and D/A conversion will recognize a term called "effective number of bits", or ENOB, which describes how many bits of a data converter are meaningful. ENOB is determined through carefully instrumented A/D and D/A converter measurements that determine the SNR and the spur-free dynamic range (SFDR) of a given converter. A 12-bit converter may only have an ENOB of 11 bits; the LSB of such a converter essentially contains random ones and zeros. Converter manufacturers do their best to have the ENOB approach the number of output bits of the A/D converter (or the number of input bits of the D/A converter). But the mere fact that ENOB is measured and specified with every converter means that some converter LSBs actually contains random values, not actual signal.

Those skilled in the art will also recognize that many sources of noise can degrade the noise level of analog input signal 100 and the performance of A/D converter 102, or the noise level of D/A converter 132 and the performance of its corresponding D/A converter 132. Such noise sources include, but are not limited to:

Power supply noise

Analog front end noise

Thermal noise

Noise coupling from nearby, unwanted signals

Impedance mismatches between the analog signal and the data converter

Jitter in the A/D or D/A sampling clock source

Noise in the A/D or D/A converter voltage reference

Because data converter manufacturers cannot control the environment in which their converters are used, and because these environments often changes dynamically over time, the noise floor of systems employing data converters is also often dynamic. The present invention improves the performance of systems using A/D converters by providing a measurement of all noise sources, regardless of their origin, and by removing those LSBs or fractions thereof that correspond to the measured noise level.

In the context of compression, a varying noise floor is undesirable because compression system designers often assume that the noise floor of the signal to be compressed is stable and at a level below the LSB of the data converter that provides sampled input signal 104 to compressor 110. If the noise level is changing, the performance (compression ratio or distortion level) of the compression system will suffer. By adding both a noise-tracking element (noise floor measurement/estimation logic 140b) and an element to remove noisy LSBs (bit removal logic 144b), the present invention improves the performance of compressor 110 by removing noisy (random, and thus uncompressible) elements from sampled input signal 104 prior to compression. By providing noise floor estimate 142b to user 112, user 112 receives additional, new information about the nature of the noise floor over time. In many instances, system designers (such as those who design data acquisition systems) never know the nature of the environment in which their equipment is used, nor are users of such data acquisition electronics always aware of their (static or dynamic) noise floor levels. By measuring the noise floor level and automatically removing LSBs that fall below it, the present invention improves the knowledge of both system designers and users of data acquisition equipment about their sampled input signals, providing them with a useful metric that is not often available. And by removing randomness from sampled input signals, the present invention also improves the performance of compression systems.

While FIGS. 22 and 23 have illustrated the benefits of integer bit removal logic 144b, in many instances it may be useful to remove a fractional number of bits (such as 2.7 or 3.5 bits), rather than the simple right-shifting operation that removes only an integer number of bits. FIG. 24 demonstrates a fractional bit removal logic 144d, which uses a fractional bit removal control parameter 202, rather than the integer bit removal control parameter 202 illustrated in FIGS. 22 and 23. Those skilled in the art will recognize that every bit of an N-bit sample represents a dynamic range of 6.02 dB. Thus for each LSB removed by bit removal logic 144b, the noise floor is reduced by 6 dB. However, noise floor estimate 142b may have significantly better resolution than 6 dB. For instance, a noise floor of 9 dB above thermal noise corresponds to a level of 1.5 bits (9 dB/[6.02 dB/bit]). In order to utilize the available resolution of noise floor estimate 142b, fractional bit removal logic 144d is required.

The basic idea behind fractional bit removal is quite simple: in order to remove a fractional number of bits, sampled input signal 104 must first be amplified by a gain between 1.0 and 2.0 prior to right-shifting. The value of the gain is related to the fractional part of bit removal control parameter 202. FIG. 24 includes a fractional bit removal calculator 204 which, when provided with a fractional bit removal control parameter 202 with value i.f (where i represents the integer part, and f represents the fractional part, of the bit shift), applies a fractional gain 208 equal to $2^{1-f}$ to sampled input signal 104 via multiplier 232 prior to right-shifting by (i+1) bits. Let us consider the mathematics behind these values. Just as an N-bit right-shift implements division by $2^N$, a right-shift of i.f bits implements division by $2^{i.f}$. Therefore:

$$2^{i.f} = 2^i * 2^f = 2^{i+1} * 2^{1-f}$$

Therefore we can implement a fractional bit-shift of i.f bits by first multiplying sampled input signal 104 by $2^{1-f}$ and then right-shifting the gain-scaled signal by $2^{i+1}$. In FIG. 24, bit removal control parameter 202 contains both an integer part and a fractional part. The extra bits required for the fractional part can be included in the header of each packet of compressed/encoded signal 119, as part of preprocessor control parameters 108.

FIG. 25 demonstrates how postprocessor 128 operates on the example, LSB-removed sample stream at the output of FIG. 22. Decompressor output signal 126 begins with the samples 8191, 7412, 5221, 2037, −1535, and −4815. Bit removal control parameter 202, with value 2, is provided to a left-shifting logic 210, which left-shifts each input sample by a specified number of bits. The output sequence of postprocessor 128 begins with the samples 32764, 29648, 20884, 8148, −6140, and −19620. In FIG. 25, postprocessed signal 130 is placed next to FIG. 22's original sampled input signal 104, which began with the samples 32765, 29648, 20886, 8149, −6139, and −19260. In this example, the preprocessor and postprocessor operations have resulted in errors (as designed) that are limited to the range (−2, +1), consistent with the 2 LSBs that were removed. Sampled input sequence 104 (32765, 29648, 20886, 8149, −6139, and −19260) differs from postprocessed signal 130 (32764, 29648, 20884, 8148, −6140, and −19620) by (−1, 0, −2, −1, and 0), respectively. However, since the LSBs that were removed also correspond to values below the noise floor, the resulting samples will not be noticed, as they represented noise, not signal. The present invention can improve the performance of systems by removing these LSBs, because they do not contribute to signal power, only to noise power.

FIG. 26 demonstrates how postprocessor 128, configured as fractional bit restoration logic, reverse the fractional bit removal illustrated in FIG. 24. If FIG. 24's sampled input signal 104 was divided by $2^{i.f}$, postprocessor 128 reverses the effects of this division by multiplying decompressed signal 126 by $2^{i.f}$. A multiplication by $2^{i.f}$ can be implemented as a multiplication by $2^f$ (a value between 1.0 and 2.0, since f is between 0.0 and 1.0) and a subsequent left-shift of i bits. FIG. 26 illustrates that fractional bit removal control parameter 202 is provided to a fractional bit restoration calculator 206, which calculates the value $2^f$ as a fractional gain 208 that is provided to multiplier 232. Decompressed signal 126 is first multiplied by fractional gain 208, and the result is then left-shifted I bits by left-shifting logic 210. Thus postprocessor 128, configured as a fractional left-shifter, reverses the operation of fractional bit removal logic 144d.

The heterodyning process first described in FIG. 7 can be implemented using a real input signal or a complex (analytic) signal. The real heterodyne is shown in FIG. 27, while the complex heterodyne is shown in FIG. 28. A corresponding real or complex local oscillator (L. O.) is used to generate the cosine and sine waves for the heterodyning operation. If the heterodyning operation uses real samples, a single real L. O. generates a cosine at the desired downconversion frequency. However, the real heterodyne operation creates both a sum and a difference signal. For example, if sampled real input signal is centered at 0.3 $f_s$, a real heterodyne operation using an L. O. of 0.3 $f_s$ will generate a difference frequency (0.3 $f_s$−0.3 $f_s$=0 Hz) that is the desired lowpass output signal. But it will also generate a sum frequency (0.3 $f_s$+0.3 $f_s$=0.6 $f_s$) that must be removed by lowpass filtering.

In FIG. 27, center frequency and bandwidth measurement/estimation logic 140c obtain sampled input signal 104's center frequency and bandwidth estimates 142c. A frequency translation calculation logic 226 determines a frequency translation parameter 238. Using frequency translation with real heterodyning, frequency translation parameter 238 is set to $f_c$−b/2, where $f_c$ is the center frequency and b is the bandwidth of sampled input signal 104. A real tone generator 228b generates a frequency translation tone 230 at a frequency determined by frequency translation parameter 238. A multiplier 232 generates a sum and difference output signal 234 from the product of sampled input signal 104 and frequency translation tone 230. A programmable lowpass filter 236 removes the sum (double frequency) component from sum and difference output signal 234, creating a preprocessed real signal 108d as the output of the real heterodyning process. Frequency translation parameter 238 is also an output of preprocessor 106 that can be either embedded into compressed/encoded signal 119 as header information, or provided to control block 114 as part of preprocessor measurement/estimate 116a.

The calculation of frequency translation parameter 238 is now discussed. Real signals have symmetric spectra, so when heterodyning real input samples, we must take care not to translate the original signal's lowest frequency of interest below 0 Hz. Should we fail to observe this restriction, we will alias some of our desired signal components and thus distort our signal. For this reason, a signal with center frequency $f_c$ and bandwidth b should not be heterodyned simply by $f_c$. Instead, we calculate a frequency translation parameter 238 that translates the original signal to a new frequency centered at b/2. The real heterodyne L. O. frequency thus depends not only on $f_c$, but also on bandwidth b.

Alternately, a complex signal can be used to heterodyne the input signal. Complex heterodyning only generates the difference frequency (desired signal is centered at DC after complex heterodyning), not the sum frequency. However, complex heterodyning has the following overhead:
  a) the real input signal must be converted to a complex analytic signal (usually by a Hilbert transform FIR filter),
  b) a complex multiplier is needed to multiply the complex input signal with the complex L. O. output
  c) the resulting complex, downconverted signal now has both an in-phase (I) and a quadrature (Q) component. So while the complex signal after heterodyning is indeed centered at DC as desired, we now have twice as many as we started with.

In FIG. 28, center frequency and bandwidth measurement/estimation logic 140c obtain sampled input signal 104's center frequency and bandwidth estimates 142c, although for complex heterodyning, we can ignore the bandwidth estimate and only use a downconversion tone parameter 224. A complex tone generator 228a generates both a cosine part of downconversion tone 218a and a sine part of downconversion tone 220a, at a frequency determined by downconversion tone parameter 224. An analytic signal generation logic 212 converts the sampled input signal 104 into a real part of analytic signal 214 and an imaginary part of analytic signal 216. A complex multiplier 222 generates the complex product using the real and imaginary parts of analytic signal 214 and 216, and cosine and sine parts of downconversion tone 218a and 220a. Complex multiplier 222 generates a preprocessed real signal 108d and a preprocessed imaginary signal 108e as the output of preprocessor 106. Downconversion tone parameter 224 is included as side information within preprocessor control parameter 108 that is then either embedded into compressed/encoded signal 119 as header information, or coupled to control block 114.

FIGS. 29 and 30 demonstrate how postprocessor 128 can un-do the downconversion processes implemented by preprocessor 106, to regenerate a signal that is similar to, and in some cases identical to, original sampled input signal 104.

FIG. 29 demonstrates how postprocessor 128 reverses the operations performed by FIG. 27's downconversion process. Decompressor output signal 126 is provided to postprocessor 128, along with frequency translation parameter 238. Frequency translation parameter 238 controls the output of real tone generator 228b, frequency translation tone 230. Multiplier 232 generates the product of decompressor output signal 126 and frequency translation tone 230, sum and difference output signal 234. Because postprocessor 128 is un-doing the downconversion step performed by preprocessor 106, postprocessor 128 upconverts decompressor output signal 126. For this reason, the upconversion process only keeps the sum part of sum and difference output signal 234. The difference part of sum and difference output signal 234 is removed by a programmable highpass filter 242, whose cutoff frequency is determined by frequency translation parameter 238. The output of programmable highpass filter 242, containing only the sum term of sum and difference output signal 234, is postprocessed signal 130.

FIG. 30 demonstrates how the real heterodyning steps described in FIG. 28's downconversion process can be reversed. Preprocessed real signal 108d and preprocessed imaginary signal 108e are provided to postprocessor 128, along with downconversion tone parameter 224. Downconversion tone parameter 224 controls the output of complex upconversion tone generator 228c. Note that while complex tone generator 228a in FIG. 28 was configured to downconvert a signal, complex tone generator 228c in FIG. 30 is configured to upconvert a signal. Practically, complex tone generators can generate either an upconversion or a downconversion tone. The downconversion tone simply has a negative value for its sine term (R−jI), while the upconversion tone has a positive value for its sine term (R+jI). Complex tone generator 228c generates both cosine part of upconversion tone 218b and a sine part of upconversion tone 220b, at a frequency determined by tone parameter 224. Complex multiplier 222 generates a complex product using preprocessed real signal 108d, preprocessed imaginary signal 108e, cosine part of upconversion tone 218b and sine part of upconversion tone 220b, generating the real part of analytic signal 214 and the imaginary part of analytic signal 216. Finally, a complex-to-real transformation logic 240 transforms the complex sample stream that consists of real part of analytic signal 214 and imaginary part of analytic signal 216 into postprocessed signal 130. Complex-to-real transformation logic 240 can simply convert the real and imaginary input components to their magnitude representation.

FIG. 31 demonstrates another novel feature of the present invention: a recommendation of a sampling rate to user 112 that will improve the compression performance of compressor 110. FIG. 32 will illustrate why a change in sampling rate can improve the compression performance of the present invention. In FIG. 31, sampled input signal 104 is provided to either signal period measurement/estimation logic 140a or to center frequency and bandwidth estimation logic 140c, which provide either period estimate 142a or center frequency and bandwidth estimates 142c to a sample rate recommendation logic 244. As described in the discussion with FIG. 32 below, certain sampling rates are better suited to preprocessing by re-ordering and inversion logic 144a. Reordering and inversion logic 144a provides a signal that compresses best when the signal period estimate 142a (or alternately, the reciprocal of center frequency estimate 142c) is equal to, or very close to, a member on a short list of integers (for instance, 6, 4, or 3). When the signal period exactly equals one of these small integers, the preprocessed signal 108 created by reordering and inversion logic 144a will be at (or very close to) DC, thereby maximizing the compression ratio of compressor 110. Thus a goal of sample rate recommendation logic 244 is to recommend to user 112, through control block 114, one or more sampling rates that will improve compression performance. A suggested sampling rate 116c will be one that is near to the present sampling rate, but which results in signal period estimate 142a (or reciprocal of center frequency estimate 142c) that is equal to, or very close to, one of a small set of integers.

FIG. 32 shows three alternative signal spectra of a system that samples analog input signal 100, with center frequency 1.6 MHz, at three different sampling rates:
- 11 Msamp/sec,
- 9 Msamp/sec, and
- 8.5 Msamp/sec.

If analog input signal 100 is sampled at 11 Msamp/sec, its normalized center frequency is 1.6/11=0.15, and its signal period estimate 142a is 11/1.6=6.88 samples per period. The goal of sample rate recommendation logic is to provide a recommended sample rate 116c that is a small integer, such as 6, 4, or 3, to improve the compression performance of compressor 110, which compresses best when its input signal is centered at DC (0 Hz). Those skilled in the art will recognize that sample rate selection for an analog signal is often an arbitrary choice, as long as the selected sampling rate is above the Nyquist rate already discussed.

Assuming a signal bandwidth of 2 MHz or less for the example analog signal in FIG. 32, the Nyquist rate for this signal is 2*[1.6 MHz+(2 MHz/2)]=5.2 Msamp/sec. (We assume that half of the analog signal's energy lies below the 1.6 MHz center frequency, from 0.6 to 1.6 MHz, and that half lies above the center frequency, from 1.6 to 2.6 MHz). The three example sample rates in FIG. 32 (11, 9, and 8.5 Msamp/sec) all meet the Nyquist criterion. But the present invention's sample rate recommendation logic 244 recommend one or more sampling rates that will maximize the compression ratio of compressor 110, from among the set of possible sampling rates, and as an improvement over the initial sampling rate chosen for A/D converter 102. Given the three signal period estimates 142a (6.88, 5.94, and 5.00 samples per period) and the signal periods that are preferred by reordering and inversion logic 144a, namely 6, 4, and 3 samples per period, sample rate recommendation logic 244 will select that "winner" sample rate whose period estimate 142a is closest to 6, 4, and 3. In the example of FIG. 32, the "winner" is signal period estimate 5.94 at a sample rate of 9.5 Msamp/sec. At this sampling rate, the signal period is very close to the desired sample period 6.

FIGS. 33 and 34 demonstrate how sample rate recommendation logic 244 can be used to automatically modify the sampling rate of sampled input signal 104. In FIG. 33, the sample rate adjustment is automatically performed by digitally resampling sampled input signal 104 by using a sample rate conversion logic 248. In FIG. 34, sample rate adjustment is automatically performed by directly modifying the rate of an A/D sampling clock 254 that is coupled to A/D converter 102.

Many of the components in FIG. 33's automatic sample rate conversion system are identical to those found in FIG. 31:
- sampled input signal 104
- center frequency and bandwidth measurement/estimation logic 140c
- center frequency and bandwidth estimates 142c
- sample rate recommendation logic 244
- re-ordering and inversion logic 144a
- preprocessed signal 108

The function of these components is identical to their function in FIG. 31. However, instead of receiving sampled input signal 104 as its input, re-ordering and inversion logic 144a is coupled to sample rate conversion logic 248, which converts sampled input signal 104 sampled at an original sampling rate of $f_s\_in$ samples per second to another sampling rate $f_s\_out$. Those skilled in the art of multi-rate signal processing will recognize that digital sample rate conversion can be performed with several alternative implementations. Any method which converts sampled input signal 104 (sampled at $f_s\_in$ samples per second) to resampled input signal 104b (sampled at $f_s\_out$ samples per second) can be used to implement sample rate conversion logic 248. In FIG. 33, sample rate recommendation logic 244 further includes a sample rate adjustment mechanism that adjusts the sample rate in steps so that the period estimate 142a incrementally approaches period values of 6, 3, or 2. The recommended sample rate 116c that corresponds to the preferred sample rate is provided to sample rate conversion logic, specifying the degree to which sampled input signal 104's sample rate is to be adjusted. Those skilled in the art of digital sample rate conversion will recognize that the aforementioned sample rate adjustment step size is a design parameter of the system. This parameter can be optimized to adjust more quickly using a larger step size, or more slowly using a smaller step size, depending on the desired responsiveness of preprocessor 106 to changes in sampled input signal 104's center frequency.

FIG. 34 demonstrates the operation of an automatic sample rate adjustment method, one in which the recommended sample rate 116c is couple to an A/D clock control logic 252 that generates an A/D sampling clock 254. Again, many of the components in FIG. 34 (those earlier identified in the discussion with FIG. 33) are identical to those in FIG. 31. In FIG. 34, the sampling rate of A/D converter 102 is controlled by A/D sampling clock 254.

In FIG. 34, recommended sample rate 116c is used to directly adjust the rate at which sampled input signal 104 is sampled. As in the automatic, digital sample rate adjustment method described in FIG. 33, the method portrayed in FIG. 34 operates automatically. Given recommended sampling rate 116c, A/D clock control logic 252 includes control mechanisms in the preferred embodiment that are aware of the preferred sample periods 6, 4, 3, and 2. A/D clock control logic 252 adjusts the frequency of A/D sampling clock 254 in steps until the period estimate 142a approaches the preferred signal periods of 6, 4, or 3. Those skilled in the art of digital sample rate conversion will recognize that the aforementioned sample rate adjustment step size is a design parameter of the system. This parameter can be optimized to adjust more quickly using a larger step size, or more slowly using a smaller step size, depending on the desired responsiveness of preprocessor 106 to changes in sampled input signal 104's center frequency.

FIG. 35 demonstrates how preprocessor 106 and compressor 110 can operate cooperatively using feedback via a compressor-to-preprocessor coupling signal 109, to achieve a user-specified compression ratio. While preprocessor 106 is the first processing element of compression subsystem 400, its purpose is only to process sampled input signal 104 so that follow-on compressor 110's performance is improved. Compressor 110 may want to modify one or more of the operating parameters of preprocessor 106 to achieve a given compression ratio specified by user 112. Because compressor 110 is aware of the final size of compressed/encoded signal 119, and since preprocessor 109 is not, compressor 110 may adjust one or more of preprocessor 106's parameters in order to increase or to decrease the size of each packet of compressed/encoded signal 119. For example, if compressed/encoded signal 119 is not meeting a user-specified compression ratio after preprocessing by preprocessor 106, compressor 110 may send preprocessor 106 a command that increases the number of LSBs removed, as discussed in FIG. 20. In another example, compressor 110 may send preprocessor 106 a command that decreases the bandwidth of a bandpass filter within preprocessor 106 that filters sampled input signal 104. In this manner, preprocessor 106 processes sampled input signal 104 in a manner that allows compressor 110 to achieve a user-specified compression ratio. This compression ratio (among other parameters) is sent to compressor 110 from control block 114 via compressor control parameter 118b. Finally, also note in FIG. 35 that preprocessor 106 sends preprocessor control parameters 108f to compressor 110. Compressor 110 may include one or more of preprocessor control parameters 108f in one or more headers of compressed blocks in compressed/encoded signal 119.

FIG. 36 elaborates on the compressor-to-preprocessor feedback mechanism generally described in FIG. 35. FIG. 36 describes the elements of compressor 110 and demonstrates in more detail how compressor 110 can achieve a given compression ratio or a desired bit rate that is specified as part of compressor control parameters 118b. In FIG. 36, a compression control logic 300 receives two external inputs: control parameter to compressor 118b and preprocessor control parameters 108f. Compressor control parameters 118b may include a desired compression ratio, such as 2:1 (an integer compression ratio) or 3.3:1 (a fractional compression ratio). Another element of compressor 110, a multi-stream director 304, receives preprocessed signal 108 from preprocessor 106. Multi-stream director 104 also receives one or more multi-stream control parameters 302 that control its operation. As illustrated in FIG. 12, when preprocessor 106 is configured to include reordering and inversion logic 144a, it may generate multiple output streams 108 from sampled input signal 104. Multi-stream director 304 directs these multiple streams to follow-on compression processing within compressor 110. For example, if reordering and inversion logic 144a generated three preprocessed signals 108a, 108b, and 108c, multi-stream director may first send all samples of preprocessed signal 108a to follow-on serial compression processing, followed by all samples of preprocessed signal 108b, and then finally all samples of preprocessed signal 108c. Alternately, if multiple compression processors are available, multi-stream director may send preprocessed signal 108a to a first compression processor, while also sending preprocessed signal 108b to a second compression processor and preprocessed signal 108c to a third compression processor. Under the control of multi-stream control parameters 302, multi-stream director 304 controls the flow of samples from preprocessed signal 108 to one or more follow-on compression processors, as one or more multi-stream director outputs 308.

In FIG. 36, multi-stream director output 308 is further processed by two elements of compressor 110 that operate sequentially: a bit reduction logic 310 and a bit packing logic 316. Bit reduction logic 310 reduces the number of bits required to represent multi-stream director output 308 samples, while bit packing logic 316 packs the bit-reduced samples of a bit reduction output 314 through lossless encoding logic. Those skilled in the art will recognize that many alternative implementations are possible for bit reduction logic 310:
    first derivative encoder
    second derivative encoder
    the bit reduction logic described in U.S. Pat. No. 5,839, 100
    other bit reduction logic Those skilled in the art will also recognize that many alternative implementations are possible for bit packing logic 316:
    Huffman encoding
    Arithmetic encoding
    Block exponent encoding
    Rice encoding
    Other lossless encoding or bit-packing methods Depending on the desired implementation complexity, any available method of bit reduction logic 310 can be coupled to any available method of bit packing logic 316.

In FIG. 36, a bit packing output 318 from bit packing logic 316 is coupled to a packet creation logic 326. Those skilled in the art will recognize that sampled data signals are often processed in groups of N samples, where N is a user-specified or design-specified integer. N is also often called the block size. Dividing a continuous sampled data stream into consecutive groups of N samples allows software or hardware implementations to re-use memory and processing elements for successive blocks, and thus simplifies the implementation complexity. In the preferred embodiment, both preprocessor 106 and compressor 110 operate on successive groups of N samples of sampled input signal 104, outputting compressed/encoded signal 119 one compressed packet at a time. The purpose of packet creation logic 326 is to combine a header creation output 324 with bit packing output 318 into a sequence of packets of compressed/encoded signal 119. For simplicity, there is often a one-to-one mapping between input blocks (containing N samples) and packets of compressed/encoded signal 119. In this manner, individual packets of compressed/encoded signal 119 can be decompressed by decompression subsystem 410 to recreate decompressor output signal 126, which exactly equals (in lossless mode) or resembles (in lossy mode) sampled input signal 104. Compression control 300 controls the operation of the following elements as follows:
    multi-stream director 304 is controlled by multi-stream control parameters 302
    bit reduction logic 310 is controlled by bit reduction control parameters 306 bit packing logic 316 is controlled by bit packing control parameters 312
    a header creation logic 322 is controlled by one or more compression control header parameters 320

Header creation logic 322 combines one or more compression control header parameters 320 into a representation for each packet. The header of each packet of compressed/encoded signal 119 contains control parameters that are relevant to all samples of the compressed packet. For example, the parameters measured or estimated by preprocessor 106 for an input block of N consecutive, uncompressed samples may be fixed for that block. It is well known to those skilled in the art that many analog signals are so-called cyclostationary, i.e. their parameters do not vary when examined over small enough time periods. Thus while preprocessor 106 may frequently measure or estimate various parameters of sampled input signal (such as its center frequency, bandwidth, noise floor, or SNR as already discussed), these parameters may not change between consecutive blocks of N samples of sampled input signal 104. For this reason, the parameter estimates and related preprocessing of preprocessor 106 may apply to all samples in a packet of compressed/encoded signal 119. Header creation logic 322 may even send such parameters once every P packets, thereby reducing the bandwidth required to represent this side (or control) information. While the side (or control) information is needed by decompression subsystem 410 to properly decompress compressed/encoded signal 119, such side (or control) information may not change from packet to packet, and thus need not be sent with every packet. In the preferred embodiment of the present invention, header creation logic 322 inserts one or more "change" flags into header creation output 324. These "change" flags are small (usually one-bit) indicators, where a 1 represents a change from the previous value for that parameter, and a 0 represents no change from the previous value. By using such "change" flags in header creation output 324, compressor 110 can indicate which control parameters have changed to decompression subsystem 410, thus further reducing the bandwidth of compressed/encoded signal 119 and consequently improving the compression performance of compression subsystem 400.

In FIG. 36, a packet size measurement logic 328 measures how many bits are required for each output packet of compressed/encoded signal 119. Packet size measurement logic 328 sends a packet size measurement 330 to compression control logic 300. In the preferred embodiment, packet size measurement logic 328 simply monitors the write pointer that packet creation logic 326 uses to write compressed packets to a memory or a network or bus interface. In such an implementation, the packet size can be calculated simply by subtracting the final compressed packet pointer location from the initial compressed packet pointer location, modulo the memory or storage interface buffer size. By way of example, let us consider the following compression parameters:

- sample width of 16 bits
- input block size N=192 samples
- goal compression ratio of 2:1
- goal compressed packet size of 96 samples (192/2)
- output buffer size of 256×16 bits (256 16-bit words)
- initial compressed packet pointer points to address 215 in the compressed packet buffer (using zero-based addressing, addresses 0 to 255 are valid)

In this example, packet creation logic 326 writes packets of compressed/encoded signal 119 into a buffer of size 256. Assuming that the compression feedback has converged, i.e. that compressor 110 has already successfully achieved 2:1 compression, the compressed packets will contain about 96 samples or 96 words, where a word is 16 bits wide. Those skilled in the art will recognize that the width of the compressed packet buffer is usually selected to be a power of 2, and that 8, 16, or 32 bits are the most common widths for memory or storage interfaces. In this example, after writing the 96-sample compressed packet to the compressed packet buffer, the final compressed packet buffer address will be mod(215+96, 256)=55. Packet size measurement logic monitors these initial and final addresses, and calculates the packet size as mod(55−215, 256)=96.

FIG. 36 illustrates a variety of preprocessing alternatives available to compression control logic 300. Because it receives packet size measurement 330 from packet size measurement logic 328 for each compressed packet, compression control logic 300 will always be aware of the actual compression ratio being achieved by compressor 110, as well as the desired compression ratio specified by user 112 via control compressor control parameters 118b. If packet size measurement 330 is larger [or smaller] than is needed (i.e. the actual compression ratio is below [above] the user-specified compression ratio), compression control logic 300 can combine one or more of the following preprocessor actions, or others not listed here, to increase [decrease] the compression ratio:

a) command preprocessor 106 to remove [include] additional LSBs from each sample of sampled input signal 104, via compressor to preprocessor coupling signal 109, b) command preprocessor 106 to reduce [increase] the bandwidth of sampled input signal 104 through filtering, via compressor to preprocessor coupling signal 109, c) command bit reduction logic 310 to remove [include] additional LSBs from each sample of multi-stream director output 308, via bit reduction control parameters 306, d) command bit reduction logic 310 to increase [decrease] the quantization of bit reduction output 314, via bit reduction control parameters 306, e) command header creation logic 322 via compression control header parameters 320 to send certain header parameters less [more] frequently, f) command multi-stream director 304 via multi-stream control parameters 302 to provide fewer [more] of the streams in preprocessed signal 108 to bit reduction logic 310.

Depending on the specific implementations of bit reduction logic 310 and bit packing logic 316, compression control logic 300 may be able to vary additional parameters (not listed above) that affect packet size measurement 330. Each of the available bit rate modification options available to compression control logic 300 will have some change in quality associated with it, depending on the magnitude of the parameter that controls the option. For instance, in a qualitative sense, it may be preferable to decrease the bandwidth of sampled input signal 104 (option b above) of the input signal by 10% before removing an additional LSB (option a above). Or it may be preferable to send the noise floor estimate less often (option e above) before adjusting the quantization of bit reduction output 314.

In the preferred embodiment, compression control logic 300 is programmable, i.e. the operation of compression control logic 300 can be modified. If compression control logic is implemented in software on a microprocessor, digital signal processor (DSP), or other programmable processor, software compression control logic 300 can be programmed by loading a different control program into the processor's program memory. If compression control logic is implemented in hardware on an FPGA, CPLD, or ASIC, hardware compression control logic 300 can be programmed by loading a different state machine, lookup table, or control program into the specific hardware memory used for that purpose. In this way, compression control logic 300 can select from a number of alternative methods and combinations of methods to increase [decrease] the actual packet sizes of compressed/encoded signal 119. The examples provided above of such parameter adjustments are meant to be illustrative and are not meant to limit the scope of bit rate adjustment methods in compression control logic 300.

FIG. 37 illustrates how a preprocessor with compressor feedback 106a reacts to compressor-to-preprocessor coupling signal 109, sent by compression control logic 300 in compressor 110. As mentioned in the discussion of FIG. 36, preprocessor 106a may contain multiple, alternative bit rate reduction options 290, whose alternative outputs may be more or less compressible by compressor 110. Compression control logic 300 may from time to time (via compressor-to-preprocessor coupling signal 109) specify how these various preprocessor options in preprocessor 106 are to be controlled, depending on how the actual packet size measurement 330 compares with the user-specified compression ratio to be achieved by compression subsystem 400. By way of example in FIG. 37, compressor-to-preprocessor coupling signal 109 selects bit rate reduction options 290 (via a bit rate reduction control logic 294) in a manner that determines:

the setting of a selection logic 298, which in this example selects between three alternative bit rate reduction options (LSB removal only; resampling followed by LSB removal; or filtering, downconversion, and decimation followed by LSB removal)

the setting of resampler 248, the setting of a filtering, downconversion, and decimation logic 296, the setting of bit removal logic 144b The alternative bit rate reduction options 290 are illustrative and are not meant to limit the scope of the present invention. The flexibility of using the general-purpose feedback mechanism enabled by compressor-to-preprocessor coupling signal 109 is determined by the alternative bit rate reduction options 290 and the way in which compression control logic 300 is programmed.

FIG. 38 and those figures that follow it describe specific applications that benefit from the efficient compression and decompression techniques of present invention. FIGS. 38 and 39 discuss how the operation of digital storage oscilloscopes is improved by the present invention. FIG. 40 describes how the operation of signal generators, especially arbitrary waveform generators, is improved by the present invention. FIG. 41 describes how the operation of A/D converters is improved by the present invention. FIG. 42 describes how the operation of D/A converters is improved by the present invention. FIGS. 43 and 44 describe how the operation of busses or networks that carry sampled data is improved by the present invention. FIGS. 45, 46, and 47 describe a particular implementation of the present invention that couples the size of compressed packets to a variable clock. These implementations of the present invention allow memories, storage elements, busses, and networks to be used in sampled data applications where the sampling rates are faster than the access times of the data storage logic or the transfer bandwidth of the data transfer logic. FIG. 48 describes how the throughput of compression subsystem 400 is increased through parallel processing. FIG. 49 describes how the throughput of decompression subsystem 410 is increased through parallel processing.

Those skilled in the art of electronics will recognize that certain electronic instruments are used to make measurements of, and to stimulate, electronic circuitry called a "device under test" (DUT), in an effort to verify the proper operation of the DUT. A DUT could be:

a printed circuit board containing electronic components, an individual integrated circuit (ASIC) or FPGA, a motor controller, a transducer, any device whose electrical properties can be measured, any device whose non-electrical properties can be measured by transducers that convert certain device properties (such as temperature, pressure, or vibration) to electrical signals, such as voltage or current.

An oscilloscope is a signal measurement device that visually represents the value of a signal parameter (usually voltage) over time on a display device. Oscilloscopes are used to verify the proper operation, and to determine the causes of improper operation, of nearly all electronic circuits. Similarly, a signal generator is an electronic signal source that varies a signal parameter (usually voltage) over time to stimulate an electrical circuit or device with a user-prescribed waveform.

While oscilloscopes are available in both analog and digital forms, the present invention improves the performance of digital oscilloscopes. Such digital oscilloscopes are also called digital storage scopes or digital sampling scopes because they store waveforms obtained from the DUT in a digital memory after A/D conversion. Digital storage scopes are characterized primarily by two properties: the bandwidth of the scope (which through the Nyquist criterion is related to the sampling rate of the digital storage scope's A/D converter) and the amount of capture memory. Prior to the present invention, the capture depth of digital storage scopes was determined by the amount of physical capture memory present in the scope. The present invention changes this paradigm by introducing the concept of virtual memory to digital storage scopes. Rather than limiting the oscilloscope capture time by the number of samples that can be stored in the physical capture memory, the present invention allows users to trade off signal quality for signal capture time. Using the present invention's lossless compression operating mode, a digital storage scope's capture memory can store 2× or 3× more samples, with no loss in quality, depending on the redundancy present in the captured DUT signal. As mentioned earlier, oscilloscope manufacturers already recommend that a DUT's signal be oversampled by at least 5×. This amount of oversampling introduces a significant level of correlation from sample to sample, correlation which the present invention compression subsystem 400 can remove.

Prior to the present invention, oscilloscope manufacturers have not had any reason to consider compression for their applications, primarily because an effective compression solution at the high sampling rates (typically 1 Gsamp/second for a 200 MHz digital storage scope) did not exist. For all of the reasons reviewed in Section 2 (Prior Art Discussion), the widely known compression algorithms developed for speech, audio, image, and video compression are inappropriate for oscilloscope applications, and indeed could not be performed in real time at oscilloscope digitization rates. By providing an effective compression solution for digital storage scopes, the present invention for the first time allows oscilloscope users to trade off capture depth and signal quality, capturing longer waveform durations in exchange for a slight degradation (during lossy compression) in signal quality. This new capability is hereafter called "virtual memory," because it provides additional (virtual) storage beyond the uncompressed storage of the digital storage scope's physical capture memory.

Signal generators are often divided into two sub-categories: function generators and arbitrary waveform generators (AWGs). Function generators generate simple, repetitive voltage waveforms, such as DC levels, square waves, sine waves, triangular waves, and noise. Function generator users can often change a few parameters of these simple, common waveforms, such as amplitude (voltage value on the y axis) or period (frequency of zero crossings on the x axis).

AWGs contain waveform storage memory that is loaded with a user-specified stream of samples. The samples in the waveform storage memory of a conventional AWG are fetched sequentially from memory and are used to drive a D/A converter at a known, usually user-specified, sampling rate. Arbitrary waveform generators are also available with a secondary pattern generator memory, in which many pairs of start and end addresses and repetition counts refer to sub-segments of the waveform storage memory. For instance, if the waveform storage memory can hold 64,000 samples, a 4-entry pattern generator memory might contain the following values:

| Segment | Start address | End address | Samples in the segment | Repetition count | Next segment |
| --- | --- | --- | --- | --- | --- |
| 1 | 30000 | 35123 | 5124 | 15 | 3 |
| 2 | 100 | 6000 | 5901 | 335 | 4 |
| 3 | 123 | 5000 | 4878 | 12 | 2 |
| 4 | 62000 | 64000 | 2001 | 3 | 1 |

Using this table as an example, the arbitrary waveform generator begins by generating Segment 1, which contains 15 repetitions of the 5124 samples from waveform storage address 30000 to address 35123, followed by Segment 3, which contains 12 repetitions of the 4878 samples from waveform storage address 123 to address 5000. Next, Segment 2 is generated, which contains 335 repetitions of the 5901 samples from address 100 to address 6000, followed by Segment 4, which contains 2001 samples (from address 62000 to 64000) that are repeated three times. Then the entire waveform generation sequence repeats, starting with Segment 1. The total number of samples in the waveform thus generated is:

$$15*5124+12*4878+335*5901+3*2001=2,118,234$$

Using this pattern generator memory, the AWG's 2,118,234-sample waveform is significantly longer than the waveform storage memory's 64000-entry limit.

AWGs are often coupled to personal computers (PCs) that are used to create the signal waveform that is loaded into the AWG's waveform storage memory. AWG users use a PC application called a waveform editor to create their desired waveform and to then load their waveform into the AWG. Although pattern generator memory can greatly increase the effective length of periodic waveforms generated by the AWG, such an AWG still cannot generate unique waveforms longer than the waveform storage memory (64000, in the previous example). Given the choice of a larger waveform storage memory or an additional pattern generator memory with smaller waveform storage memory, users would generally select the larger waveform storage memory because of its greater flexibility.

The present invention allows AWG users to transform physical AWG waveform storage memory into a virtual memory that can store a virtual number of samples larger than the AWG's physical memory. The coupling of compression subsystem 400 with the waveform editor, and the coupling of decompression subsystem 410 with the AWG's waveform storage memory, allows significantly longer arbitrary waveforms to be stored in the same physical memory of an enhanced AWG.

For example, let us consider an example user waveform containing 150,000 samples that can be compressed 2.5:1 by the present invention. Because the desired waveform contains more samples (150000) than can be stored in the AWG memory (64000), it would appear that the user cannot load the waveform into the AWG waveform memory. However, by compressing the 150000-sample waveform by 2.5:1 using the present invention's compression subsystem 400 on a PC, the compressed waveform can then be stored in just 60,000 samples (150000/2.5). These 60,000 samples can then be transferred from the PC and stored in the AWG's 64000-sample waveform storage memory. During waveform generation in the AWG, the compressed waveform is read from AWG waveform storage memory and is then decompressed by decompression subsystem 410, whose output drives the AWG's D/A converter. Thus the present invention improves the effective waveform storage memory of signal generators while using the same physical waveform storage memory, thus saving cost and providing a novel feature for AWGs.

In the following discussion of both oscilloscopes and signal generators that incorporate the present invention, we refer to the increase in effective memory length of capture memory (in oscilloscopes) or waveform storage length (in signal generators) as "virtual memory."

FIG. 38 provides a block diagram of a digital storage scope 256. A/D converter 102 digitizes analog input signal 100. While a typical digital storage scope immediately saves the sampled input signal 104 in data storage logic 122, the present invention inserts preprocessor 106 and compressor 110 between sampled input signal 104 and data storage logic 122. User 112 controls the operation of preprocessor 106 and compressor 110 through a user-selected compression control 113, which is coupled to control block 114. In the present invention, user 112 typically selects one of two compression control parameters:

1. a desired compression ratio, such as 2:1 or 2.5:1, or
2. an allowable amount of distortion, such as 3 dB or 7.5 dB It must be emphasized that such a choice is not available on today's digital storage scopes. Before the present invention, the maximum capture length of digital storage scopes was strictly limited by the size of the capture memory. However, using the present invention, users can control the effective number of samples that can be stored in the waveform capture memory, data storage logic 122. Through the combined actions of preprocessor 106 and compressor 110, compressed/encoded signal 119, which represents sampled input signal 104 with fewer bits, is stored in data storage logic 122.

Once a waveform has been captured in data storage logic 122, the digital storage scope usually performs post-processing operations on the captured waveform prior to waveform display. For example, a display subsystem 250 might contain processing logic that averages successive waveform captures together or might display two successive waveforms simultaneously to user 112 for comparison. Before such display processing occurs, the compressed waveform captured in data storage logic 122 must be decompressed. In FIG. 38, decompression is performed either in real-time or non-realtime by decompressor 124 and postprocessor 128. Postprocessor 128 receives decompressor output signal 126 from decompressor 124. Display subsystem 250 receives one or more postprocessed signals 130 from postprocessor 128 for processing and display to user 112.

With the relatively simple addition of five elements of the present invention (preprocessor 106, compressor 110, decompressor 124, postprocessor 128, and compression control block 114), digital storage scopes are significantly improved by offering user 112 a virtual capture memory to replace the previous physical capture memory. It should be noted that both preprocessor 106 and postprocessor 128 could be omitted in some digital storage scope applications, because sampled input signal 104 is often already oversampled, given the oscilloscope manufacturers' recommendation of the "5 times rule." Such oversampling assures significant compression (often at least 2:1) after compressor 110, even without preprocessor 106. However, preprocessor 106 includes bit removal logic 144b, which enables lossy compression under the control of compressor to preprocessor coupling signal 109. Lossy compression may be required to achieve a user-specified compression ratio above that which lossless compression alone can achieve. For this reason, preprocessor 106 is included with compressor 110 in the preferred embodiment to provide both lossless and lossy compression capabilities to digital storage scopes.

FIG. 39 provides an example of how the present invention's user-selected compression control 113 might be implemented through a user-controlled knob on the front panel of a digital storage scope. An enhanced digital storage scope 256 contains user-selected compression control 113 as a control knob on the front panel, similar to other oscilloscope control knobs, such as those that control the horizontal resolution (sampling rate) and vertical resolution (voltage range). User 112 selects a particular compression setting, such as 2:1 or 2.5:1, which is coupled to compression subsystem 400 through control parameter 118. Control parameter 118 and sampled input signal 104 are provided to compression subsystem 400, which generates compressed/encoded signal 119 for storage in data storage logic 122. However, as explained with FIG. 38, digital storage scope 256 as improved by the present invention converts data storage logic 122 into virtual memory alternatives:

122a (at compression setting 1.5:1),
122b (at compression setting 2:1), or
122c (at compression setting 2.5:1).

In the example of FIG. 39, we assume that the sampling rate of digital storage scope 256's A/D converter 104 is 16 Gsamp/sec, with 8 bits per sample, and that data storage logic 122 can hold 64 MB. Given these parameters, data storage logic 122 could capture 64 MB/(16 Gsamp/sec)=4 msec of analog input signal 100 in one waveform capture without using the virtual memory invention. With the addition of the present invention, virtual memory 122a can store 6 msec of analog input signal 100 in one waveform capture. Similarly, virtual memory 122b can store 8 msec, and virtual memory 122c can store 10 msec of analog input signal 100. Thus the present invention provides digital storage scope 256's user 112 with the ability to capture a significantly longer duration of analog input signal 100, depending on the setting of user-selected compression control 113.

FIG. 40 shows how a digital signal generator 258, whose data storage logic 122, enabled with virtual memory, is improved by the present invention. User 112 interacts with a signal creation logic 262 via a signal generator control logic 260. Example signal creation logic 262 could include (but is not limited to):

the earlier capture of an analog signal by an A/D converter,
the expression of a signal in mathematical form as one or more equations,
the expression of a signal as time-domain values or as an array of samples,
the creation of a signal through a drawing program,
the editing of an existing waveform through a signal editor.

After user 112 has used signal creation logic 262 to create an uncompressed signal generator signal 263, this signal is processed by preprocessor 106 and compressor 110 to decrease the size of uncompressed signal generator signal 263. Through control block 114, user 112 specifies parameters (such as the desired compression ratio or the allowable distortion level) that control preprocessor 106 and compressor 110 via control parameters 118a and 118b, respectively, during the compression process. In the preferred embodiment of the present invention, all signal creation and signal compression processes are performed off-line (for example, on a PC), because for a signal generator application, compression does not have to operate in real time. Once compressed/encoded signal 119 has been created to user 112's satisfaction (i.e. it contains the desired signal and its compressed version fits into signal generator data storage logic 122), compressed/encoded signal 119 is transferred to signal generator 258 and is stored in data storage logic 122.

Once signal generator 258 has been loaded with compressed/encoded signal 119, signal generation can begin, ultimately creating analog output signal 134, which is the desired output of the entire signal creation and generation process. Compressed/encoded signal 119 is fetched from data storage logic 122 by decompressor 124, whose output is coupled to postprocessor 128 via decompressor output signal 126. Postprocessor 128 processes decompressor output signal 126 and sends postprocessed signal 130 to D/A converter 132, which generates analog output signal 134.

With the relatively simple addition of five elements of the present invention (preprocessor 106, compressor 110, decompressor 124, postprocessor 128, and compression control block 114), arbitrary waveform generators are significantly improved by offering user 112 a virtual capture memory to expand the previous physical capture memory. It should be noted that both preprocessor 106 and postprocessor 128 could be omitted in some digital signal generator applications, because an uncompressed signal generator signal 263 is often oversampled. Such oversampling assures significant compression (often at least 2:1) after compressor 110 without preprocessor 106. However, preprocessor 106 includes bit removal logic 144b, which enable lossy compression under the control of compressor to preprocessor coupling signal 109. Lossy compression may be required to achieve a user-specified compression ratio above that which lossless compression alone can achieve. For this reason, preprocessor 106 is included with compressor 110 to provide both lossless and lossy compression capabilities to digital signal generators.

FIG. 41 demonstrates how an A/D converter can be improved by the present invention. By enhancing an A/D converter with the present invention, the following improvements can be achieved:

the number of connections (pins or balls on the A/D converter package) can be reduced,
the data rate of the A/D digital interface can be reduced,
the amount of power consumed by the A/D digital interface can be reduced,
in multi-channel A/D converters, additional sampled output channels can be sent over the same number of connections (pins or balls) on the A/D converter package.

Those skilled in the art will recognize that A/D converter sampling rates are continually increasing. At the present date (2003), A/D converters with sampling rates up to 1.5 Gsamp/sec (8 bits per sample) are already commercially available, and A/D converters with 12 bits per sample operate at 400 Msamp/sec. Such high sampling rates are causing design difficulties to users of such A/D converters, who must expend ever-increasing design time to ensure that the A/D converter output signals can be processed by other integrated circuits. Because most printed circuit boards are manufactured with a limited number of interconnect layers, and because the materials used to connect integrated circuits on printed circuit boards introduce increasing signal impairments with increasing switching rates, those skilled in the art will recognize the utility of an invention that decreases the switching rates of digital signals from A/D converters.

Because it reduces the data rate at the output of A/D converters, the present invention offers such benefits.

FIG. 41 demonstrates the operation of an enhanced A/D converter 270 that includes compression subsystem 400 between a standard A/D converter 102 and a standard A/D converter interface 272, which provides an A/D converter output 274. On standard A/D converters 102, sampled input signal 104 is coupled directly via A/D converter interface 272 to A/D converter output 274. However, by processing sampled input signal 104 with compression subsystem 400, the number of bits required to represent sampled input signal 104 is decreased. Furthermore, the decrease in the bit rate of sampled input signal 104 can be controlled by an A/D converter control logic 276, which allows users of enhanced A/D converter 270 to select either the desired bit rate or the amount of allowable distortion of A/D converter output 274. Compressed/encoded signal 119 (the output of compression subsystem 400) is coupled to A/D converter interface 272, whose output is A/D converter output 274.

Those skilled in the art will recognize that the decreased bit rate of compressed/encoded signal 119 can be coupled to A/D converter output 274 in several ways to realize one or more of the improvements outlined in the previous paragraph. These improvements are repeated here to emphasize the benefits of enhanced A/D converter 270:

- the number of connections (pins or balls on the A/D converter package) can be reduced, because fewer bits are needed to represent sampled input signal 104,
- the data rate over the A/D digital interface can be reduced, because fewer bits are needed to represent sampled input signal 104,
- the amount of power consumed by A/D converter output 274 can be reduced, because the pin-toggling rate is reduced (since power is proportional to pin-toggling frequency),
- in multi-channel A/D converters, multiple channels can be sent over the same connections (pins or balls) formerly used to carry just one channel. At compression settings of 2:1 or 3:1, A/D converter output 274 of enhanced A/D converter 270 can carry two or three compressed/encoded signals 119 in the same bandwidth that sampled input signal 104 occupies in a standard A/D converter 102.

FIG. 42 demonstrates an enhanced D/A converter 280, which couples the output of the present invention's decompression subsystem 410 to an existing D/A converter 132. Those skilled in the art will recognize that it is desirable to decrease the digital input interface rate of D/A converters by minimizing the number, or the toggling rate, of those pins that comprise the D/A converter digital interface. The present invention combines the prior compression of signals to be converted by D/A converters (not shown in FIG. 42) with a real-time decompression subsystem 410 that is integrated into enhanced D/A converter 280. Because the compressed signal requires fewer bits than its uncompressed version, the operating frequency of a D/A converter input 282 is improved:

- by reducing the number of pins on the interface and keeping the pin-toggling rate the same, or
- by reducing the pin-toggling rate of the interface and keeping the number of pins on the interface the same.

Similarly, a multi-channel D/A converter's interface can be improved by the present invention, because the D/A converter interface that carries one uncompressed signal can now carry multiple compressed signals.

In FIG. 42, D/A converter input 282 is coupled to a D/A converter interface 284, which provides compressed/encoded signal 119 to decompression subsystem 410. Decompression subsystem 410 includes decompressor 124 and postprocessor 128, which are coupled by decompressor output signal 126. Postprocessed signal 130 is then used to drive a standard D/A converter 132, which generates analog output signal 134.

In the preferred embodiment of enhanced A/D converter 270 and enhanced D/A converter 280, the enhancements provided by the present invention (compression that enhances A/D converters, and decompression that enhances D/A converters) are implemented in hardware. Because the number of gates required to implement the present invention in hardware is small, the complexity of existing A/D and D/A converters is only slightly increased by the addition of the present invention. Based on estimates from an FPGA implementation of compression subsystem 400 and decompression subsystem 410, these subsystems can be implemented in 25,000 gates or less. Since many high-speed A/D and D/A converters already contain over 250,000 gates, the addition of compression subsystem 400 to A/D converters, or the addition of decompression subsystem 410 to D/A converters, adds minimally to the overall gate count (complexity). However, the benefits provided by the present invention to data converters (outlined in the preceding paragraphs) are great and become more valuable as sampling rates continue to increase, since they decrease data converter bit rates and interface complexity.

FIG. 43 demonstrates how a sampled data transfer application benefits from the addition of compression subsystem 400 to a sampled data transmitter, and the addition of decompression subsystem 410 to a sampled data receiver. Those skilled in the art will recognize that several industry standards (examples listed below) have been developed to specify how sampled data can be transferred across a bus or a network between two or more communicating devices. Busses are groups of electrical connections whose signal behavior is often defined by formal or industry standards. Busses are usually used in chassis containing two or more removable cards that receive both electrical power and signals from a common backplane that includes a shared set of pins called a bus. Networks are used to provide communication channels between devices that are separated by physical distances (usually more than a few meters) that preclude the use of busses. Alternately, networks can also be used to connect signals between two or more electrical devices that do not require the full bandwidth of a bus for the effective exchange of information. Networks are usually implemented as groups of metal wires, fiber-optic cables, or wireless signals.

Examples of busses that are used for sampled data exchange include (but are not limited to):

PCI (used to connect plug-in cards in PCs)
FDDI (used to connect high-speed data cards)
VME (used in aerospace, scientific, and medical applications)
VXI (used in instrumentation and test and measurement applications)
PCI Express (used in instrumentation and test and measurement applications)
FPDP (used in aerospace, scientific, and medical applications)
RaceWay (used in aerospace, scientific, and medical applications)
RaceWay++ (used in aerospace, scientific, and medical applications)

PMC (used to connect small form factor peripheral daughtercards to motherboards)

Examples of networks that are used for sampled data exchange include (but are not limited to):

Ethernet (10baseT, 100baseT, Gbps)
ATM
FibreChannel
HyperTransport
SCSI

FIG. 43 shows a compressing transmitter 264 that is connected via data transfer logic 120 to a decompressing receiver 266. Data transfer logic 120 is a generalization of either busses or networks, examples of which were listed in the previous paragraphs. The goal of the combination of compressing transmitter 264 and decompressing receiver 266 is to decrease the required communications bandwidth across data transfer logic 120. This decrease in communications bandwidth is achieved by compressing sampled input signal 104 prior to transmission, and then by decompressing compressed/encoded signal 119 recovering postprocessed signal 130, resulting in a signal that is identical or similar to original sampled input signal 104.

Compressing transmitter 264 includes preprocessor 106 and compressor 110. Preprocessor 106 transforms sampled input signal 104 to preprocessed signal 108 in a manner suitable for improving the compression performance of compressor 110. Compressor 110 removes redundancies in preprocessed signal 108 to create compressed/encoded signal 119, which is sent across data transfer logic 120 to decompressing receiver 266. User 112 specifies either the desired compression ratio or the desired distortion level of compressed/encoded signal 119 as it transits data transfer logic 120, through preprocessor control parameters 118a and compressor control parameters 118b, which are sent by control block 114. Decompressing receiver 266 also receives these control parameters, either directly from control block 114 (via decompressor control parameters 118c and postprocessor control parameters 118d) or indirectly via parameters encoded within the headers of compressed/encoded signal 119.

Decompressing receiver 266 receives compressed/encoded signal 119 from data transfer logic 120. Decompressing receiver 266 first decompresses compressed/encoded signal 119 using decompressor 124, generating decompressor output signal 126. Postprocessor 128 then transforms decompressor output signal 126 into postprocessed signal 130, which is identical (lossless compression) or comparable (lossy compression) to the original sampled input signal 104. Thus compressing transmitter 264 and decompressing receiver 266 together reduce the bandwidth needed to transfer sampled input signal 104 across data transfer logic 120, under user 112's control.

Just as the concept of virtual memory described user 112's ability to expand the effective storage capacity of data storage logic 122, the concept of virtual bandwidth is now introduced to describe how user 112 can use the present invention to increase the effective bandwidth of data transfer logic 120. Those skilled in the art will recognize the many benefits of virtual bandwidth in sampled data applications (those applications which process the output of A/D converters or the input of D/A converters). The present invention enables the following benefits to busses and networks carrying sampled data:

the number of connectors required to transfer sampled data signals is decreased, the transfer time to send sampled data signals across a bus or network is reduced, two or more sampled data streams can be sent simultaneously as compressed/encoded streams, over the same data transfer logic 120 that formerly carried just one sampled data stream, the clock rate of data transfer connections is reduced, allowing slower, less expensive electronic components to implement the bus or network.

Those skilled in the art will recognize that the present invention provides benefits to both wired and wireless networks.

In wireless electronic data-gathering applications, it is often desirable to minimize communications between a remote, wireless-enabled data collection device and a centralized data processing system that processes the signals received from many remote devices after collection. By minimizing the duration of communications between a remote device and the centralized data processing system, the probability that unintended recipients will detect wireless transmissions from the remote data-gathering device is reduced, since the amount of data to be transferred is reduced.

FIG. 44 expands the one-way communications described in FIG. 43, further demonstrating how pairs of compressing transmitters 264 and decompressing receivers 266 enable effective, bi-directional, virtual bandwidth sampled data transfer using data transfer logic 120. In FIG. 44, user 112 uses control block 114 to select parameters that control the virtual bandwidth of data transfer logic 120. Control block 114 converts user 112's selections into control parameter 118a (for preprocessor 106), control parameter 118b (for compressor 110), control parameter 118c (for decompressor 118c), and control parameter 118d (for postprocessor 128). As described earlier, control parameters 118c and 118d can alternately be included as header parameters included within compressed/encoded signal 119.

In FIG. 44, Device 1 and Device 2 communicate via data transfer logic 120 that is enhanced with virtual bandwidth. For notational convenience, Device 1's components and those signals generated by Device 1 include the suffix "a". Device 2's components and those signals generated by Device 2 include the suffix "b". Device 1 transfers sampled input signal 104a in its compressed form as compressed/encoded signal 119a across data transfer logic 120, where the compression is performed by compressing transmitter 264a. Device 2's decompressing receiver 266b receives Device 1's compressed/encoded signal 119a and decompresses it, generating postprocessed signal 130a that is identical to (lossless compression) or similar to (lossy compression) the original sampled input signal 104a. In a similar manner, Device 2 transfers sampled input signal 104b in its compressed form as compressed/encoded signal 119b across data transfer logic 120, where compression is performed in Device 2 by compressing transmitter 264b. Device 1's decompressing receiver 266a receives Device 1's compressed/encoded signal 119b and decompresses it, generating postprocessed signal 130b that is identical to (lossless compression) or similar to (lossy compression) the original sampled input signal 104b. It should be emphasized that both compressed/encoded signals 119a and 119b are smaller (by an amount determined by user 112) than the original sampled input signals 104a and 104b, respectively, that they represent. Thus the present invention allows user 112 to selectively increase the effective, unidirectional or bi-directional bandwidth of data storage logic 120, enabling the benefits described earlier with the introduction of the term "virtual bandwidth."

FIGS. 45, 46, and 47 demonstrate how the present invention can be coupled to a clock rate converter to reduce the clock rate of data storage logic 122 or data transfer logic 120. By reducing the clock rate, the present invention reduces the cost of sampled data systems by allowing components with slower clock rates and also with lower capacity to be used in place of higher clock rate components that are more expensive. It is not immediately obvious that compression can simultaneously reduce the requirements for two storage parameters: access time and capacity. One would think that only one parameter at a time would benefit from compressing a sampled data signal, but FIG. 45 demonstrates how both access time and capacity of sampled data storage is improved with the present invention's user-selectable compression.

FIG. 45 demonstrates how access time and capacity of sampled data systems are simultaneously reduced, using three examples at compression ratios of 1.5:1, 2:1, and 2.7:1. These example compression ratios were chosen to demonstrate that the achievable compression ratios of the present invention are relatively continuous and are not limited to integer ratios such as 2:1 or 3:1. Since user 112 of the preferred embodiment of the present invention specifies a compression ratio as an integer number of samples in a compressed block, which is less than the integer number of samples in an uncompressed input block of sampled input signal 104, any integer value less than the input block size can be used. For example, if the input block size (selected by the compression system designer, or by user 112) were 270 Bytes (8-bit storage elements), user 112 can use any integer from 1 to 269 to specify the desired compression ratio. For instance, compression ratios of 1.5:1, 2:1, and 2.7:1 correspond to block sizes of 180, 135, and 100 Bytes, respectively (1.5=270/180; 2.0=270/135; and 2.7=270/100). The three examples in FIG. 45 demonstrate that blocks of sampled input signal 104 (each containing 270 samples) are compressed to 180, 135, and 100 samples, respectively, in compressed/encoded signal 119. Since each input block in FIG. 45 contains 270 samples, and since the example input clock provides a new sample every 10 nsec, 2700 nsec (270×10 nsec) are needed to receive each uncompressed input block. However, because packets of compressed/encoded signal 119 are smaller than the 270-sample input blocks, the clock rate needed to provide compressed/encoded signal 119 to data storage logic 122 or to data transfer logic 120 can be reduced. Furthermore, the output clock period of compressed/encoded signal 119 equals the time needed to receive each uncompressed block of sampled input signal 104 (in this example, 2700 nsec) divided by the compressed packet size (180, 135, and 100 samples, respectively, in the three examples in FIG. 45). Thus the output clock periods required for the three examples are 15 nsec, 20 nsec, and 27 nsec, respectively.

In summary, FIG. 45 demonstrates that both the access time and the capacity of data storage logic 122 can simultaneously be reduced by the present invention. Those skilled in the art will recognize that all storage media (including solid-state media such as SRAM, DRAM, SDRAM, flash, EEPROM, ROM, etc., as well as rotating media such as hard disk drives, floppy disks, USB flash drives, CDs, DVDs, etc.) are characterized—and priced—by access time and capacity. For example, if a 1 MB DRAM costs $1.00, a 2 MB DRAM costs a little less than $2.00. The price for storage is proportional to its capacity. Similarly, an SRAM with 8 nsec access time is more expensive than an SRAM with 15 nsec access time. The relationship between price and access time is not always linear, but it is almost always monotonic: faster storage is more expensive than slower storage. The present invention reduces the two defining storage parameters (access time and capacity) simultaneously.

An analogous savings in both capacity and access times can be harnessed by decompression subsystem 410 coupled to data storage logic 122. Compressed/encoded signal 119 that is decompressed by decompression subsystem 410 can be stored in a smaller, slower storage logic than would be required of the memory that stores and provides uncompressed, postprocessed signal 130, which is provided to D/A converter 132.

If compression subsystem 400 of the present invention uses a wider interface to data storage logic 122 or to data transfer logic 120 than it uses to receive sampled input signal 104, additional decreases in clock rate can be achieved. Those skilled in the art will recognize that A/D converter widths in sampled data systems (typically even integers between 8 bits and 24 bits) are unrelated to memory widths (typically 8, 16, or 32 bits). It is common for sampled data systems to combine two or more A/D converter samples to better match a memory width. For example, a data acquisition system that uses a 10-bit A/D converter and a memory with a 16-bit interface width might use an electronic component that converts eight 10-bit input samples (80 bits) into five 16-bit storage elements (80 bits). Such an interface converter is easily implemented in an FPGA, CPLD, or added to an existing ASIC design. Adding such an interface converter allows both A/D converter 102 and data storage logic 122 to operate using their "natural" bit widths. The use of such an interface converter by the present invention is beneficial because it further decreases the output clock rate of compression subsystem 400, or the input clock rate of decompression subsystem 410. For example, if compression subsystem 400 uses an interface converter that doubles the interface width to data storage logic 122, the clock rate of the interface is halved. Thus an interface converter can further reduce the clock rate needed between compression subsystem 400 and data storage logic 122, in addition to the clock rate reduction achieved simply by using compression subsystem 400 without an interface converter. An analogous benefit (decreased clock rate from a wider storage interface) applies when an interface converter is added to a decompression system between data storage logic 122 and decompression subsystem 410.

Those skilled in the art will recognize that variable clock rates in electronic systems are undesirable. Nearly all electronic components operate at a fixed, continuous clock rate that is determined by a clock IC, clock synthesizer, crystal, or other fixed-rate clock source. Because compression systems reduce the amount of data, this reduction also affects the clock rate. Because the amount of redundancy in sampled data signals varies over time, the output rate of a lossless compression system also varies over time. So the most straightforward implementation of lossless compression in sampled data systems results in a varying clock that simply reflects the required data rate of compressed/encoded signal 119.

Alternately, the clock provided with sampled input signal 104 to send compressed/encoded signal 119 to data storage logic 122 or to data transfer logic 120 could also be augmented with an additional "enable" or "valid" signal (synchronous with each 8-bit Byte or 16-bit word) of compressed/encoded signal 119. The "enable" or "valid" signal contains a 1 when the corresponding Byte or word of compressed/encoded signal 119 is valid, and a 0 when the Byte or word is invalid or idle. However, it would be preferable if the clock rate provided with compressed/encoded signal 119 were continuous (with equal-length clock periods) and that an "enable" or "valid" signal was not required, to make the interface between compression subsystem 400 and data storage logic 122 as simple as possible. An analogous argument applies to the interface between data storage logic 122 and decompression subsystem 410 in a sampled data decompression system.

FIG. 46 demonstrates a memory interface 344 that uses a reduced clock rate converter output signal 342 to transfer compressed/encoded signal 119 to data storage logic 122. A/D clock generator 252 provides A/D sampling clock 254 to A/D converter 102 as well as to a clock rate converter 340. A/D converter 102 digitizes analog input signal 100, creating sampled input signal 104 as the input to compression subsystem 400. Control block 114 provides preprocessor control parameters 118a and compressor control parameters 118b to compression subsystem 400. In the preferred embodiment, these control parameters determine the data rate or the level of distortion of compressed/encoded signal 119, the output of compression subsystem 400. Clock rate converter 340 also receives clock rate converter control parameters 118e from control block 114, which determine the frequency of clock rate converter output signal 342. Since control block 114 provides all control parameters 118 to both compression subsystem 400 and to clock rate converter 340, it can set these control parameters so that the frequency of clock rate converter output signal 342 corresponds to the required data rate of compression subsystem 400. FIG. 45 demonstrated three examples, at user-selected compression ratios of 1.5:1, 2:1, and 2.7:1, of how the size of packets of compressed/encoded signal 119 correspond to the frequency of clock rate converter output signal 342. Using memory interface 344, successive words of packets of compressed/encoded signal 119 are written to data storage logic 122 at the fixed, reduced rate of clock converter output signal 342. To summarize, FIG. 46 illustrates how memory interface 344 simultaneously reduces both the sampling rate and the amount of storage required for uncompressed sampled input signal 104.

FIG. 47 is analogous to FIG. 46, but replaces data storage logic 122 with data transfer logic 120, and replaces memory interface 344 with a network or bus interface 346. In order to reduce both the clock rate and the total, aggregate bandwidth required to transmit sampled input signal 104 across a network or bus, network or bus interface 346 receives clock converter output signal 342 (from clock rate converter 340) and packets of compressed/encoded signal 119 (from compression subsystem 400). Network or bus interface 344 then arbitrates access to data transfer logic 120, providing data elements (usually 8-bit Bytes, 16-bit words, or 32-bit words) from packets of compressed/encoded signal 119 at a rate determined by clock rate converter output signal 342. Thus FIG. 47 demonstrates how network or bus interface 346 simultaneously reduces both the required data rate and the packet size of sampled input signal 104 when transferred across a bus or network at a lower, fixed rate.

Those skilled in the art will recognize that the compression operations illustrated in FIG. 47's network or bus transfer application are accompanied by corresponding decompression operations in the device or devices at the receiving end of data transfer logic 120. FIG. 43 has already illustrated how unidirectional transfers of compressed/encoded signal 119 are implemented using a compressing transmitter 264 (incorporating compression subsystem 400) and a decompressing receiver 266 (incorporating decompression subsystem 410). However, FIGS. 43 and 44 can operate using either a fixed or a variable clock rate. The benefits of the present invention are applicable both to fixed-rate and variable-rate data storage applications and data transfer applications. The system designer determines whether a fixed or a variable clock is appropriate. For brevity, subsequent decompression operations that correspond to the compression operations described in FIG. 46's data storage application and FIG. 47's data transfer application have been omitted. Such corresponding decompression operations will be obvious to those skilled in the art and are analogous to those illustrated in FIG. 43, where a subsequent decompressing receiver 266 accompanies a compressing transmitter 264.

In order to increase the overall compression and decompression rate, it may be desirable to employ two or more copies of compression subsystem 400 and decompression subsystem 410 of the present invention in a parallel implementation. A parallel implementation of compression subsystem 400 is illustrated in FIG. 48, while FIG. 49 illustrates a parallel implementation of decompression subsystem 410.

FIG. 48 introduces new components that enable multiple compression subsystems 400 to operate together to compress sampled input signal 104 at a higher rate than a single compression subsystem 400 could provide. FIG. 48's four new components are:

- A distributor 350 that distributes blocks of uncompressed samples to multiple compression subsystems,
- A gatherer 352 that gathers, arranges, and transfers multiple compressed packets,
- Multiple copies of an input buffer 354, which precede each compression subsystem 400,
- Multiple copies of an output buffer 356, which follow each compression subsystem 400.

Those skilled in the art will recognize that not all algorithms are effectively implemented using parallel processing. The simplicity and efficiency of the present invention allows straightforward implementation of parallel processing to achieve higher compression and decompression rates by systems that employ multiple compression and decompression elements, respectively. Furthermore, the speedup achieved by the present invention's use of N processing elements is exactly or nearly N. In other words, the present invention achieves a linear improvement in compression or decompression throughput by coupling N compression subsystems 400 or decompression subsystems 410 together.

In FIG. 48, it is assumed that a single compression subsystem 400 is unable to compress sampled input signal 104 at its specified sampling rate. For example, a particular hardware implementation (in an FPGA or an ASIC) of compression subsystem 400 that can compress signals at a rate of up to 100 Msamp/sec will not be able to compress sampled input signal 104 at a sampling rate of 450 Msamp/sec. However, five copies of compression subsystem 400, each compressing at 100 Msamp/sec, would be able to compress sampled input signal 104 with sampling rate of 450 Msamp/sec. FIG. 48 illustrates how such parallel compression can be implemented using multiple copies of an enhanced compression subsystem 358, combined with distributor 350 and gatherer 352.

Enhanced compression subsystem 358 consists of input buffer 354, compression subsystem 400, and output buffer 356. Distributor 350 receives every sample of sampled input signal 104 from A/D converter 102. Distributor 350 is designed so that its input rates and output rates are identical, but its output is provided to multiple copies of enhanced compression subsystem 358, rather than to a single instance of compression subsystem 400. For example, if distributor 350 is designed to distribute blocks of 400 samples of sampled input signal 104, a 5× speedup of compression subsystem 400 is achieved by the following distributor 350 transactions with five instances of enhanced compression subsystem 358:

- Instance 1 of enhanced compression subsystem 358 processes samples 1 to 400, 2001 to 2400, 4001 to 4400, etc.
- Instance 2 of enhanced compression subsystem 358 processes samples 401 to 800, 2401 to 2800, 4401 to 4800, etc.
- Instance 3 of enhanced compression subsystem 358 processes samples 801 to 1200, 2801 to 3200, 4801 to 5200, etc.
- Instance 4 of enhanced compression subsystem 358 processes samples 1201 to 1600, 3201 to 3600, 5201 to 5600, etc.
- Instance 5 of enhanced compression subsystem 358 processes samples 1601 to 2000, 3601 to 4000, 5601 to 6000, etc.

Each instance of enhanced compression subsystem 358 begins with input buffer 354, which receives consecutive samples of sampled input signal 104 from distributor 350 at the full sampling rate. Compression subsystem 400 compresses these consecutive samples of sampled input signal 104 (read from input buffer 354) at a slower rate than at which input buffer 354 was filled. Compression subsystem 400 generates packets of compressed/encoded signal 119 and transfers them into output buffer 356. All instances of enhanced compression subsystem 358 operate simultaneously, at a reduced rate when compared with the sampling rate of A/D converter 102. However, the combined operation of multiple, enhanced compression subsystems 358 provides an effective throughput that is at least as fast as the sampling rate of A/D converter 102. Gatherer 352 gathers packets of compressed/encoded signal 119 from each enhanced compression subsystem 358 in order. For example, gatherer 352 reads the following sequence of output buffers 356:

- From instance 1 of enhanced compression subsystem 358, receive compressed packet 1, 6, 11, etc., representing uncompressed samples 1–400, 2001–2400, 4001–4400, etc.
- From instance 2 of enhanced compression subsystem 358, receive compressed packet 2, 7, 12, etc., representing uncompressed samples 401–800, 2401–2800, 4401–4800, etc.
- From instance 3 of enhanced compression subsystem 358, receive compressed packet 3, 8, 13, etc., representing uncompressed samples 801–1200, 2801–3200, 4801–5200, etc.
- From instance 4 of enhanced compression subsystem 358, receive compressed packet 4, 9, 14, etc., representing uncompressed samples 1201–1600, 3201–3600, 5201–5600, etc.
- From instance 5 of enhanced compression subsystem 358, receive compressed packet 5, 10, 15, etc., representing uncompressed samples 1601–2000, 3601–4000, 5601–6000, etc.

Gatherer 352's output contains the interleaved packets of compressed/encoded signal 119 that were generated by the multiple instantiations of enhanced compression subsystem 358.

Note that gatherer 352 may be gathering either variable-length packets (for example, if control block 114 has configured enhanced compression subsystem 358 for lossless compression) or fixed-length packets (for example, if control block 114 has configured enhanced compression subsystem 358 for lossy, fixed-rate compression). Gather 352's stream of compressed packets can subsequently be stored in data storage logic 122 or transferred to data transfer logic 120, both of which are omitted in FIG. 48.

In an analogous manner to the parallel compression subsystem illustrated in FIG. 48, FIG. 49 illustrates a parallel decompression subsystem. In FIG. 49, it is assumed that a single decompression subsystem 410 is unable to decompress packets of compressed/encoded signal 119 fast enough to feed D/A converter 132 at its desired sampling rate. For example, a particular hardware implementation (in an FPGA or ASIC) of decompression subsystem 410 that decompresses at a rate of 100 Msamp/sec will not be able to provide samples of postprocessed signal 130 at a sampling rate of 450 Msamp/sec. However, five copies of decompression subsystem 410, each providing decompressed samples at 100 Msamp/sec, would be able to provide postprocessed signal 130 at a sampling rate of 450 Msamp/sec. FIG. 49 illustrates how such parallel decompression can be implemented using multiple copies of an enhanced decompression subsystem 359, combined with distributor 350 and gatherer 352.

Enhanced decompression subsystem 359 consists of input buffer 354, decompression subsystem 410, and output buffer 356. Distributor 350 receives all packets of compressed/encoded signal 119 from data storage logic 122 or data transfer logic 120 (not shown in FIG. 49). Distributor 350 is designed so that its input rates and output rates are identical, but its output (packets of compressed/encoded signal 119) is provided to multiple copies of enhanced decompression subsystem 359, rather than to a single instance of decompression subsystem 410. Note that distributor 350 in FIG. 49 may be distributing either variable-length packets (if packets of compressed/encoded signal 119 were generated by lossless compression) or fixed-length packets (if packets of compressed/encoded signal 119 were generated by fixed-rate, lossy compression). For example, if distributor 350 is designed to distribute one packet of compressed/encoded signal 119 per enhanced decompression subsystem 359, and if each compressed packet represents 400 uncompressed samples, a 5× speedup of decompression subsystem 410 is achieved by the following distributor 350 operations to five instances of enhanced decompression subsystem 359:

- Instance 1 of enhanced decompression subsystem 359 decompresses compressed packet 1, 6, 11, etc., generating uncompressed samples 1–400, 2001–2400, 4001–4400, etc.
- Instance 2 of enhanced decompression subsystem 359 decompresses compressed packet 2, 7, 12, etc., generating uncompressed samples 401–800, 2401–2800, 4401–4800, etc.
- Instance 3 of enhanced decompression subsystem 359 decompresses compressed packet 3, 8, 13, etc., generating uncompressed samples 801–1200, 2801–3200, 4801–5200, etc.
- Instance 4 of enhanced decompression subsystem 359 decompresses compressed packet 4, 9, 14, etc., generating uncompressed samples 1201–1600, 3201–3600, 5201–5600, etc.
- Instance 5 of enhanced decompression subsystem 359 decompresses compressed packet 5, 10, 15, etc., generating uncompressed samples 1601–2000, 3601–4000, 5601–6000, etc.

Each instance of enhanced decompression subsystem 359 begins with input buffer 354, which receives compressed packets from distributor 350. Decompression subsystem 410 decompresses packets of compressed/encoded signal 119 (read from input buffer 354) at a slower rate than the clock rate of D/A converter 132. Decompression subsystem 410 generates a block of postprocessed signal 130 and transfers the block into output buffer 356. All instances of enhanced decompression subsystem 359 operate simultaneously, at a reduced output rate when compared with the sampling rate of D/A converter 132. However, the combined operation of multiple, enhanced decompression subsystems 359 provides an effective output rate that is at least as fast as the sampling rate of D/A converter 132. Gatherer 352 gathers blocks of postprocessed signals 130 from each enhanced decompression subsystem 359. For example, in FIG. 49, gatherer 352 reads the following sequence of decompressed output buffers 356 from five enhanced decompression subsystems 359:

Instance 1 of enhanced decompression subsystem 359 provides uncompressed samples 1 to 400, 2001 to 2400, 4001 to 4400, etc.

Instance 2 of enhanced decompression subsystem 359 provides uncompressed samples 401 to 800, 2401 to 2800, 4401 to 4800, etc.

Instance 3 of enhanced decompression subsystem 359 provides uncompressed samples 801 to 1200, 2801 to 3200, 4801 to 5200, etc.

Instance 4 of enhanced decompression subsystem 359 provides uncompressed samples 1201 to 1600, 3201 to 3600, 5201 to 5600, etc.

Instance 5 of enhanced decompression subsystem 359 provides uncompressed samples 1601 to 2000, 3601 to 4000, 5601 to 6000, etc.

Gatherer 352's output contains interleaved blocks of decompressed samples of postprocessed signal 130 that were decompressed by the multiple instantiations of enhanced decompression subsystem 359. Gather 352's output stream of decompressed samples is subsequently provided to D/A converter 132, which generates analog output signal 134.

9.0 CONCLUSION RAMIFICATIONS AND SCOPE OF INVENTION

Accordingly, the reader can conclude that the sampled data compression method of the present invention can be used to effectively compress and decompress sampled analog signals, providing either lossless or lossy compression of the original sampled analog signal. In addition, the present invention can be implemented in real time using an FPGA, ASIC, or programmable processor, because only a small number of simple mathematical operations are required for its implementation, consisting primarily of additions, subtractions, multiplexing and demultiplexing, and comparisons. During lossy compression, users of the present invention may select either a fixed compression ratio or a maximum distortion level. Applications of the present invention to test and measurement devices, data storage devices, data transfer systems, and data converters were described. Users of the present invention can apply the benefits of compression (fewer bits needed to represent a sampled analog signal) in several ways, including (but not limited to) the following:

a) to simultaneously reduce storage space and storage cost, b) to simultaneously reduce storage interface speed and storage space, c) to simultaneously reduce storage interface speed and storage cost, d) to simultaneously store multiple compressed sampled analog signals in the same storage space needed for one uncompressed sampled analog signal, e) to simultaneously reduce bus or network bandwidth and bus or network cost, f) to simultaneously reduce bus or network interface speed and bus or network bandwidth, g) to simultaneously reduce bus or network interface speed and bus or network cost, h) to simultaneously transfer multiple compressed sampled analog signals across a bus or network, in the same bandwidth needed for one uncompressed sampled analog signal.

While my above description contains many specificities, these should not be construed as limitations on the scope of the invention, but rather as exemplifications of one or more alternative or preferred embodiments thereof. Many other variations are possible. For example, a) downconversion tone parameter 224 or frequency translation parameter 238 can also include a phase parameter that specifies the starting phase of the real or complex sine wave generator, b) for applications where the signal is always at baseband, the preprocessor and postprocessor can be omitted, since no frequency translation of sampled input signal 104 is required, c) postprocessor 126 only modifies decompressed output signal 126 when commanded to do so by a control parameter that is embedded (or can optionally be embedded) in compressed/encoded signal 119, d) the time-domain signal period estimation algorithm of FIG. 11 can be preceded by a highpass filter that removes any DC component from the signal prior to estimating the signal period, e) for input signals whose characteristics (center frequency, bandwidth, noise floor, etc.) do not vary over time, decisions from controller 114 can be performed once or just a few times when encoding begins. For input signals whose characteristics (center frequency, bandwidth, noise floor, etc.) change over time, decisions from control block 114 can be performed repeatedly. In this manner, controller 114 adapts to the input signal based on the rate at which the signal's characteristics vary over time, f) two or more preprocessors can be coupled to operate simultaneously, thus adapting to two or more signal parameters at the same time, g) recommended sample rate 116c can be related to a signal parameter other than center frequency, such as the bandwidth or the data rate of a communications signal, h) during lossy compression, compressed packets can be stuffed with zeros or other known value until each compressed packet reaches the desired (fixed) size. Alternately, each compressed packet can be sent without such stuff values, where the compressed packet obeys a "not to exceed" size, i) sample rate conversion can also be implemented by D/A conversion of sampled input signal 104 at the original sampling rate, followed by an A/D conversion at the new, recommended sampling rate.

j) if a sampled analog signal contains two or more signals of interest, they can be filtered individually prior to applying the preprocessor and compressor techniques of the present invention. In this manner, N input signals that together occupy a wide bandwidth (which would normally not be compressed effectively by the present invention) can be processed as N separate, bandlimited signals, each of which can be compressed effectively by the present invention.

k) compression ratio can be expressed as a size unit per measurement unit, where size units can be (but are not limited to) bits, Bytes, words, and longwords, and measurement units can be (but are not limited to) samples, uncompressed blocks, and compressed packets.

Accordingly, the scope of the invention should be determined not by the embodiments illustrated, but by the appended claims and their legal equivalents.

The invention claimed is:

1. A method of acquiring, compressing, and decompressing signals, comprising:

receiving an analog input signal at a digital storage oscilloscope including an analog to digital converter, data compression resources, data decompression resources, storage and a display device;

converting, using said analog to digital converter, said analog input signal to a sampled input signal at a sample rate, compressing, using said data compression resources, said sampled input signal into a compressed input signal at a compression rate that is at least as fast as said sample rate, and which represents said sampled input signal with fewer bits, storing said compressed input signal in said storage, retrieving said compressed input signal from said storage and decompressing, using said data decompression resources, said compressed input signal into a decompressed signal, displaying, using said display device, an image based on said decompressed signal.

2. The method of claim 1, in which said sample rate is at least 1 megasample per second.

3. The method of claim 1, in which compressing is performed by at least one of the following:

generating first, second, or higher derivatives of said sampled input signal, losslessly encoding said sampled input signal.

4. The method of claim 1, further including parallel processing, comprising:

distributing said sampled input signal to the inputs of a multiplicity of compressors, compressing said distributed sampled input signal using said multiplicity of compressors, combining the outputs of said multiplicity of compressors to create said compressed signal.

5. The method of claim 1, further including:

measuring a noise floor of said sampled input signal to form a noise floor estimate, attenuating samples of said sampled input signal according to a fractional attenuation control parameter to form a preprocessed signal;

compressing said preprocessed signal, instead of said sampled input signal, in said compressing step;

adjusting said fractional attenuation control parameter by an amount determined by said noise floor estimate.

6. The method of claim 5, wherein said measuring includes:

calculating a frequency domain spectrum of said sampled input signal, wherein said frequency domain spectrum comprises frequency domain values;

calculating a histogram of numbers of occurrences of said frequency domain values;

selecting a histogram index having a maximum count, or an average of histogram indexes near said histogram index having said maximum count, to form a selected value; and calculating said noise floor estimate in accordance with said selected value.

7. The method of claim 5, wherein said measuring includes:

lowpass filtering said sampled input signal to form a lowpass output;

highpass filtering said sampled input signal to form a highpass output;

selecting one of said lowpass output or said highpass output with a lower magnitude to form a selected output; and calculating said noise floor estimate in accordance with said selected output.

8. The method of claim 1, including providing a parameter indicating a desired compression ratio, and including:

attenuating samples of said sampled input signal according to a fractional attenuation control parameter to form a preprocessed signal;

compressing said preprocessed signal in said compressing step, to form said compressed input signal;

measuring a bit rate of said compressed input signal to generate a measured compressed bit rate;

comparing said measured compressed bit rate with a bit rate of said sampled input signal to form a measured compression ratio; and adjusting said fractional attenuation control parameter by an amount determined by comparing said desired compression ratio and said measured compression ratio.

9. The method of claim 8, in which said preprocessing includes at least one of filtering said sampled input signal prior to said attenuating step, and filtering said preprocessed signal after said attenuating step and before said compressing step.

10. A method of acquiring, compressing, and decompressing signals, comprising:

receiving an analog input signal at a digital storage oscilloscope including storage;

converting said analog input signal to a sampled input signal at a sample rate, compressing said sampled input signal into a compressed input signal at a compression rate that is at least as fast as said sample rate, and which represents said sampled input signal with fewer bits, storing said compressed input signal in said storage, retrieving said compressed input signal from said storage and decompressing said compressed input signal into a decompressed signal, displaying an image based on said decompressed signal further including, selecting one of lossless and lossy compression modes, and for the lossy compression mode applying at least one of a desired compression ratio, a desired maximum distortion level.

11. The method of claim 1, further including measuring parameters of said decompressed signal by parameter measurement logic that measures at least one of time domain and frequency domain parameters of said decompressed signal.

12. The method of claim 11, including processing of said decompressed signal according to one or more calculations including:

averaging two or more subsets of said decompressed signals, histogramming two or more subsets of said decompressed signals, generating a frequency domain spectrum of said decompressed signal, generating an averaged spectrum from two or more frequency domain spectra of said decompressed signal, generating statistics from samples of said decompressed signal.

13. The method of claim 10, further including controlling an interface rate to said storage so that said interface rate is substantially proportional to said sample rate divided by said desired compression ratio.

14. An apparatus, comprising:

an oscilloscope having an input and a display;

an analog-to-digital conversion system in the oscilloscope, which converts an analog input signal at the input of the oscilloscope to a sampled input signal at a sample rate at its output, data compressor logic in the oscilloscope and coupled to the output of said analog-to-digital conversion system, that compresses said sampled input signal at a compression rate that is at least as fast as said sample rate, to create a compressed signal, storage, in the oscilloscope and coupled to the output of said data compressor logic, that stores said compressed signal, decompression logic, in the oscilloscope and coupled to the output of said storage, that decompresses said compressed signal into a decompressed signal, a display, in the oscilloscope and coupled to the output of said decompression logic, that displays an image based on said decompressed signal.

15. The apparatus of claim 14, in which said sample rate is at least 1 megasample per second.

16. The apparatus of claim 14, in which said data compressor logic generates at least one of the following:

first, second, or higher derivatives of said sampled input signal, a lossless encoding of said sampled input signal.

17. The apparatus of claim 14, in which said data compressor logic is implemented using a multiplicity of data compressor logic elements, comprising:

a signal distributor coupling the output of the analog-to-digital conversion system to the inputs of said multiplicity of data compressor logic elements, a signal gatherer coupling the outputs of said multiplicity of data compressor logic elements to said storage, said multiplicity of data compressor logic elements, whose inputs are coupled to said signal distributor, and whose outputs are coupled to said signal gatherer control means coupled to said multiplicity of data compressor logic elements.

18. The apparatus of claim 14, further including:

noise floor measurement logic, which measures a noise floor of said sampled input signal to form a noise floor estimate, an attenuator that attenuates samples of said sampled input signal according to a fractional attenuation control parameter to form a preprocessed signal;

data compressor logic that compresses said preprocessed signal at a compression rate that is at least as fast as a sample rate of said preprocessed signal, which creates a compressed preprocessed signal that represents said preprocessed signal with fewer bits, wherein the output of said data compressor logic is coupled to said storage;

attenuation adjustment logic that adjusts said fractional attenuation control parameter by an amount determined by said noise floor estimate.

19. The apparatus of claim 18, in which the noise floor measurement logic includes:

frequency domain spectrum generation logic that generates frequency domain values of said sampled input signal;

histogram logic that generates a histogram of numbers of occurrences of said frequency domain values;

histogram index selection logic that selects a histogram index having a maximum count, or an average of histogram indexes near said histogram index having said maximum count, to form a selected value; and noise floor estimation logic that calculates said noise floor estimate using said selected value.

20. The apparatus of claim 18, in which the noise floor measurement logic includes:

a lowpass filter that filters said sampled input signal to form a lowpass output;

a highpass filter that filters said sampled input signal to form a highpass output;

selection means that selects one of said lowpass output or said highpass output with a lower magnitude to form a selected output; and noise floor estimation logic that calculates said noise floor estimate using said selected output.

21. The apparatus of claim 14, further including parameter measurement logic, coupled to the output of said decompression logic, that measures time domain or frequency domain characteristics of said decompressed signal.

22. The apparatus of claim 21, in which said parameter measurement logic includes at least one of the following elements:

signal averaging logic that averages two or more subsets of said decompressed signals, histogramming logic that produces a histogram of two or more subsets of said decompressed signals, spectrum generation logic that generates a spectrum of said decompressed signal, spectrum averaging logic that generates an averaged spectrum from two or more frequency domain spectra of said decompressed signals, statistics generation logic that generates statistics from samples of said decompressed signal.

23. The apparatus of claim 14, further including:

attenuation logic, controlled by a fractional attenuation control parameter, whose input is coupled to said analog-to-digital conversion system and which generates a preprocessed signal, compression logic that compresses said preprocessed signal to form said compressed input signal;

bit rate measurement logic, coupled to the output of said compression logic, that measures a bit rate of said compressed input signal to form a measured compression ratio, a comparator that compares said measured compression ratio with a desired compression ratio, attenuation control logic, coupled to the output of said comparator, that adjusts said fractional attenuation control parameter using a result provided by said comparator.

24. The apparatus of claim 23, including one or more of:

a sampled input signal filter that filters said sampled input signal prior to said attenuation logic, an attenuated signal filter that filters said preprocessed signal prior to said compression logic.

25. An enhanced digital storage oscilloscope, comprising:
an analog-to-digital conversion system, which converts an analog input signal at an input of an oscilloscope to a sampled input signal at a sample rate at its output,
data compressor logic, coupled to the output of said analog-to-digital conversion system, that compresses said sampled input signal at a compression rate that is at least as fast as said sample rate, to create a compressed signal,
storage, coupled to the output of said data compressor logic, that stores said compressed signal,
decompression logic, coupled to the output of said storage, that decompresses said compressed signal into a decompressed signal,
a display, coupled to the output of said decompression logic, that displays an image based on said decompressed signal,
further including compression control logic for selecting one of a lossless and a lossy compression modes, for the lossy compression mode, applying at least one of a desired compression ratio,
a desired maximum distortion level.

26. The apparatus of claim 25, further including rate control logic that controls an interface rate to said storage, and wherein said interface rate is controlled to be inversely proportional to said desired compression ratio.

27. In an enhanced arbitrary waveform signal generator including storage, decompression resources and a digital to analog converter operating at a sample rate, a method for generating an analog output signal from a compressed signal, comprising:
storing a compressed signal representing a digitized arbitrary waveform signal in the storage,
retrieving said compressed signal from said signal generator storage and decompressing, using the decompression resources, said compressed signal at a decompression rate that is at least as fast as the sample rate to generate an uncompressed sampled signal,
converting, using the digital to analog converter, said uncompressed sampled signal into an analog output signal at a said sample rate, the analog output signal representing said arbitrary waveform signal.

28. The method of claim 27, in which said sample rate is at least 1 megasample per second.

29. The method of claim 27, in which said decompressing step generates first, second, or higher integrals of said compressed signal.

30. The method of claim 27, in which said compressed signal includes compressed data tokens and decompression control parameters.

31. The method of claim 30, further including a parallel processing decompressor, comprising:
distributing a subset of said compressed data tokens to each decompressor in a multiplicity of decompressors,
decompressing said subset of said compressed data tokens in each of said multiplicity of decompressors, to create a multiplicity of decompressed signals,
providing said decompressor control parameters, or a subset thereof, to each of said multiplicity of decompressors,
combining said multiplicity of decompressed signals into said uncompressed sampled signal.

32. The method of claim 30, further including postprocessing following said decompressing, and under the control of postprocessor control parameters, in which said postprocessing includes at least one of the following:
restoring one or more least significant bits of said decompressed signal,
increasing a magnitude of samples of said decompressed signal,
reordering and inverting certain samples of said decompressed signal,
translating said decompressed signal to another frequency,
converting said decompressed signal to an alternate sample rate.

33. The method of claim 32, in which said postprocessor control parameters include at least one of the following:
least significant bit restoration control parameters,
magnitude increase control parameters,
reordering and inversion control parameters,
frequency translation control parameters,
sampling rate conversion control parameters.

34. In an enhanced arbitrary waveform signal generator including storage, decompression resources and a digital to analog converter, a method for generating an analog output signal from a compressed signal, comprising:
storing a compressed signal representing a digitized arbitrary waveform signal in the storage, the digitized arbitrary waveform being digitized at a sample rate,
retrieving said compressed signal from said signal generator storage and decompressing, using the decompression resources, said compressed signal at a decompression rate that is at least as fast as the sample rate to generate an uncompressed sampled signal,
converting, using the digital to analog converter an said uncompressed sampled signal into an analog output signal at a said sample rate, the analog output signal representing said arbitrary waveform signal in which said decompressing step includes lossless decoding that converts said compressed signal into said uncompressed sampled signal.

35. An apparatus, comprising:
a waveform generator including a digital-to-analog converter operating at a sample rate;
a signal generator interface on the waveform generator that receives a compressed signal representing a digitized arbitrary waveform,
signal generator storage in the waveform generator that receives and stores said compressed signal,
decompression logic in the waveform generator, coupled to the output of said signal generator storage, which decompresses said compressed signal at a decompression rate that is at least as fast as the sample rate to create an uncompressed sampled signal,
the digital-to-analog converter, in the waveform generator and coupled to the output of said decompression logic and operating at the sample rate that converts said uncompressed sampled signal to an analog output signal representing the arbitrary waveform signal.

36. The apparatus of claim 35, in which said sample rate is at least 1-megasample per second.

37. The apparatus of claim 35, in which said decompression logic generates first, second, or higher integrals of said compressed signal.

38. The apparatus of claim 35, in which said compressed signal includes compressed data tokens and decompression control parameters.

39. The apparatus of claim 38, further including a parallel processing decompressor, comprising:

a multiplicity of decompressors, a signal distributor that provides a subset of said compressed data tokens to each decompressor in the said multiplicity of decompressors, parallel processing control means that provide said decompression control parameters, or a subset thereof, to each decompressor in said multiplicity of decompressors, a signal gatherer receiving the outputs of said multiplicity of decompressors and combining said decompressor outputs into said uncompressed sampled signal.

40. The apparatus of claim 38, further including a postprocessor whose input is coupled to the output of said decompression logic, and whose output is coupled to the input of said digital-to-analog converter, where the postprocessor is under the control of postprocessor control parameters, in which said postprocessor includes logic for at least one of:

least significant bit restoration, sample magnitude adjustment, reordering and inversion, frequency translation, sample rate conversion.

41. The apparatus of claim 40, in which said postprocessor control parameters include at least one of:

least significant bit restoration control parameters, sample magnitude control parameters, reordering and inversion control parameters, frequency translation control parameters, sample rate conversion control parameters.

42. An enhanced arbitrary waveform signal generator, comprising:

a signal generator interface that receives a compressed signal representing a digitized arbitrary waveform, the digitized arbitrary waveform being digitized at a sample rate, signal generator storage that receives and stores said compressed signal, decompression logic, coupled to the output of said signal generator storage, which decompresses said compressed signal at a decompression rate that is at least as fast as the sample rate to create an uncompressed sampled signal, a digital-to-analog converter, coupled to the output of said decompression logic and operating at said sample rate that converts said uncompressed sampled signal to an analog output signal representing the arbitrary waveform signal in which said decompression logic includes a lossless decoder that converts said compressed signal into said uncompressed sampled signal.

* * * * *